(12) United States Patent
Masuoka et al.

(10) Patent No.: US 11,862,464 B2
(45) Date of Patent: Jan. 2, 2024

(54) METHOD FOR MANUFACTURING THREE-DIMENSIONAL SEMICONDUCTOR DEVICE

(71) Applicant: Unisantis Electronics Singapore Pte. Ltd., Singapore (SG)

(72) Inventors: Fujio Masuoka, Tokyo (JP); Nozomu Harada, Tokyo (JP); Yisuo Li, Singapore (SG)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 270 days.

(21) Appl. No.: 17/345,543

(22) Filed: Jun. 11, 2021

(65) Prior Publication Data

US 2021/0358754 A1    Nov. 18, 2021

Related U.S. Application Data

(63) Continuation of application No. PCT/JP2018/047245, filed on Dec. 21, 2018.

(51) Int. Cl.
*H01L 21/033* (2006.01)
*H01L 29/66* (2006.01)
(Continued)

(52) U.S. Cl.
CPC ...... *H01L 21/0338* (2013.01); *H01L 21/0335* (2013.01); *H01L 21/0337* (2013.01);
(Continued)

(58) Field of Classification Search
CPC ............. H01L 21/0338; H01L 21/0335; H01L 21/0337; H01L 29/66666; H01L 29/7827;
(Continued)

(56) References Cited

U.S. PATENT DOCUMENTS 10,840,155 B2   11/2020  Masuoka et al.
2005/0272195 A1* 12/2005 Bryant ............ H01L 21/823821
                                                    257/E21.235
(Continued)

FOREIGN PATENT DOCUMENTS

JP    02-188966 A    7/1990
JP    2015-138908 A  7/2015
(Continued)

OTHER PUBLICATIONS

English translation of International Preliminary Report on Patentability, including Written Opinion, in Application No. PCT/JP2018/047245, dated Jul. 21, 2021, 7 pages.
(Continued)

*Primary Examiner* — Mohammad M Hoque
(74) *Attorney, Agent, or Firm* — Crowell & Moring LLP

(57) ABSTRACT

A second band-like mask material layer having a first band-like mask material layer of a same planar shape on its top is formed on a mask material layer on a semiconductor layer. Then, fourth band-like mask material layers having third band-like mask material layers of same planar shape on their top are formed on both side surfaces of the first and second band-like mask material layers. Sixth band-like mask material layers having fifth band-like mask material layers of same planar shape on their top are formed on the outside thereof. Then, an orthogonal band-like mask material layer is formed on the first band-like mask material layer, in a direction orthogonal to a direction in which the first band-like mask material layer extends. Semiconductor pillars are formed on overlapping areas of this orthogonal band-like mask material layer and the second and sixth band-like mask material layers by etching the semiconductor layer. Then, a pillar-shaped semiconductor device is formed with these semiconductor pillars being channels.

14 Claims, 57 Drawing Sheets

(51) Int. Cl.
*H01L 29/78* (2006.01)
*H10B 10/00* (2023.01)

(52) U.S. Cl.
CPC .... *H01L 29/66666* (2013.01); *H01L 29/7827* (2013.01); *H10B 10/12* (2023.02)

(58) Field of Classification Search
CPC ..... H01L 21/823807; H01L 21/823885; H01L 29/0673; H01L 29/0676; H01L 29/66439; H01L 29/775; H01L 29/42392; H01L 29/785; H01L 29/78642; H01L 29/78696; H01L 27/092; H10B 10/12; B82Y 10/00
USPC ....................................................... 438/268
See application file for complete search history.

(56) References Cited

U.S. PATENT DOCUMENTS

| | | |
|---|---|---|
| 2015/0129825 A1 | 5/2015 | Masuoka et al. |
| 2015/0144866 A1 | 5/2015 | Masuoka et al. |
| 2015/0206923 A1 | 7/2015 | Masuoka et al. |
| 2015/0221750 A1 | 8/2015 | Masuoka et al. |
| 2015/0303238 A1 | 10/2015 | Masuoka et al. |
| 2015/0357378 A1 | 12/2015 | Masuoka et al. |
| 2016/0240586 A1 | 8/2016 | Masuoka et al. |
| 2016/0240774 A1 | 8/2016 | Masuoka et al. |
| 2017/0030173 A1 | 2/2017 | MacPhail et al. |
| 2017/0309814 A1 | 10/2017 | Masuoka et al. |

FOREIGN PATENT DOCUMENTS

| | | |
|---|---|---|
| WO | WO 2015/022744 A1 | 2/2015 |
| WO | WO 2015/071983 A1 | 5/2015 |
| WO | WO 2015/075819 A1 | 5/2015 |
| WO | WO 2015/125291 A1 | 8/2015 |
| WO | WO 2015/129021 A1 | 9/2015 |
| WO | WO 2018/070034 A1 | 4/2018 |

OTHER PUBLICATIONS

International Search Report and Written Opinion in Application No. PCT/JP2018/047245, dated Mar. 12, 2019, 6 pages.
Takato et al., "Impact of Surrounding Gate Transistor (SGT) for Ultra-High-Density LSI's", IEEE Transaction on Electron Devices, vol. 38, No. 3, pp. 573-578 (Mar. 3, 1991), 6 pages.
Loubet et al., "Stacked Nanosheet Gate-All-Around Transistor to Enable Scaling Beyond FinFET" T17-5 (Late News), 2017 Symposium on VLSI Technology of Technical Papers, pp. T230, 231 (2017), 2 pages.

* cited by examiner

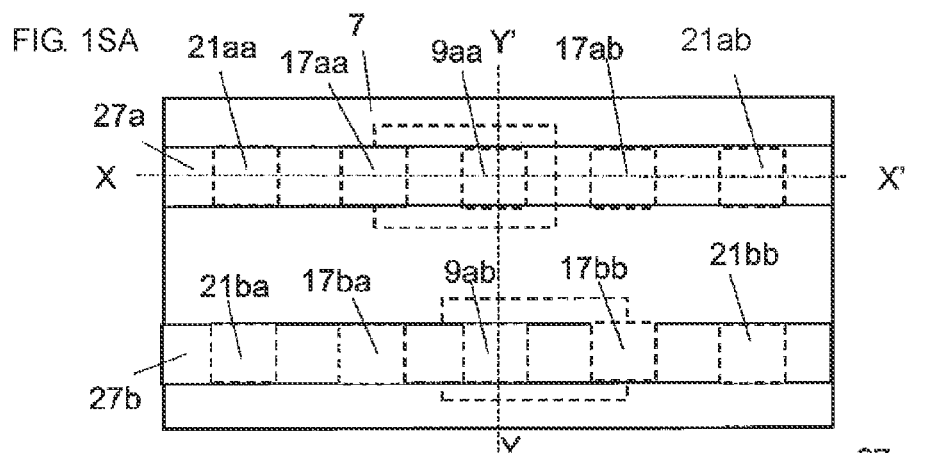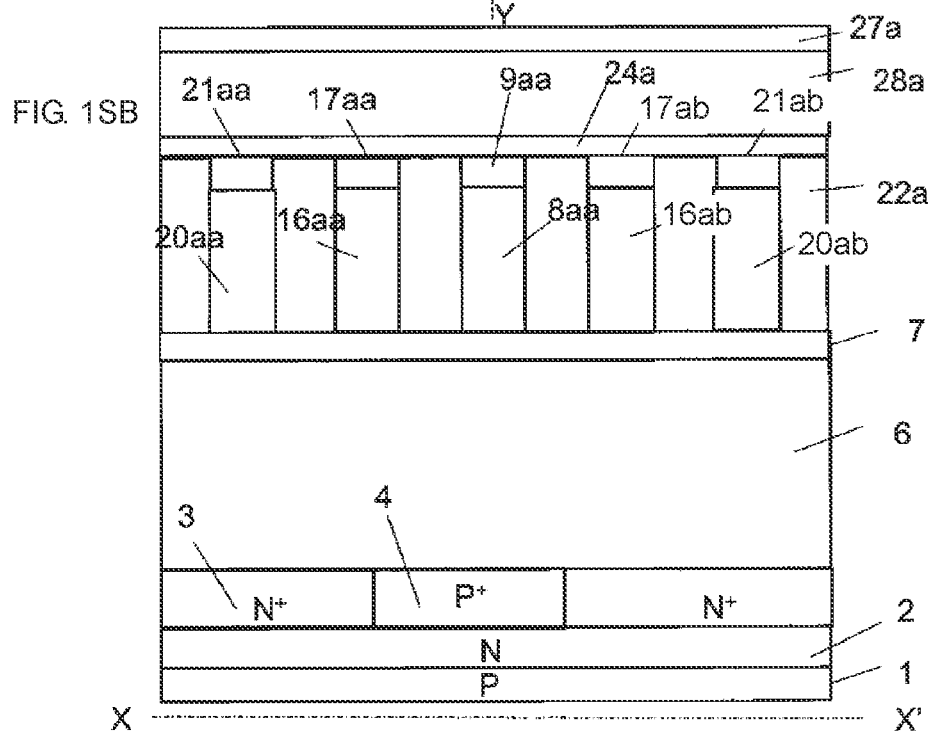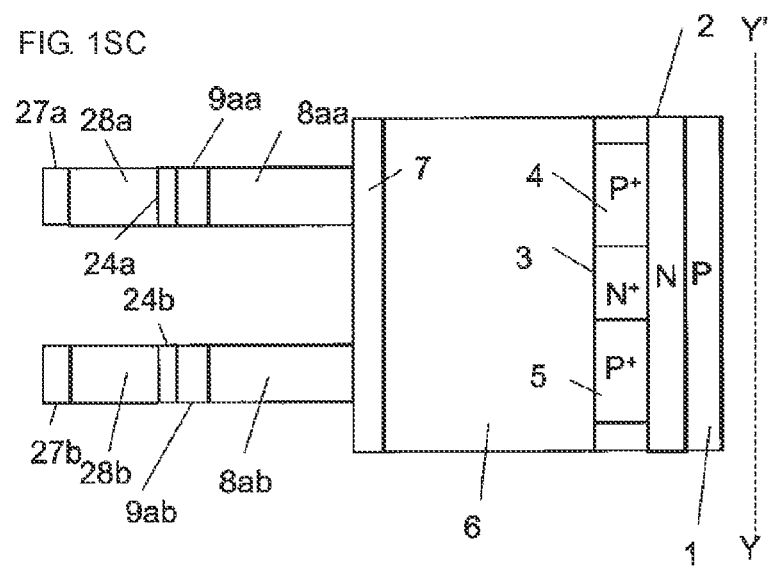

FIG. 1ZA
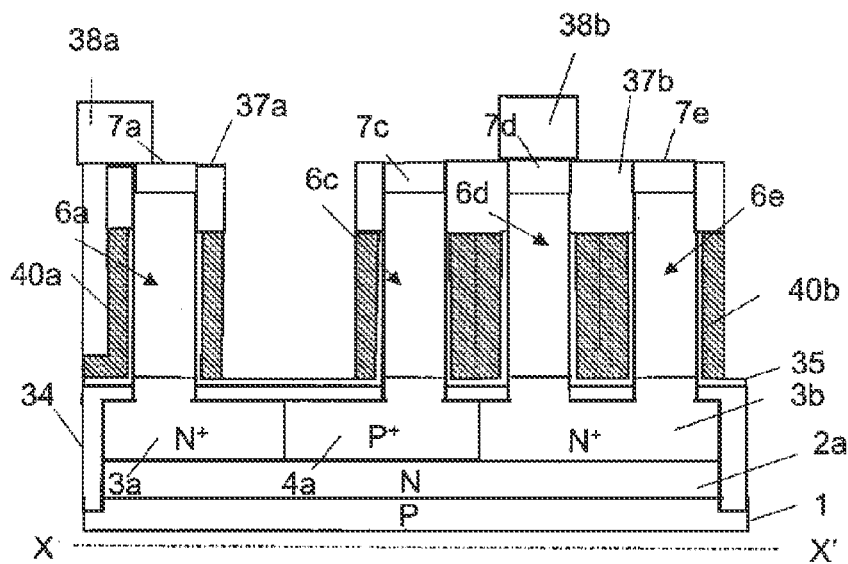
FIG. 1ZB
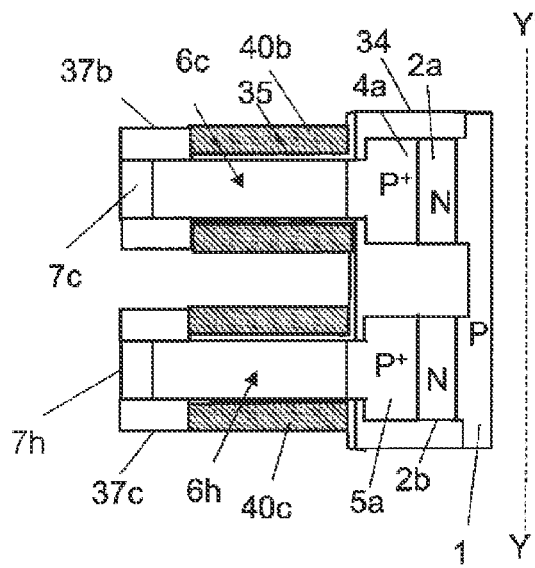
FIG. 1ZC

FIG. 1XXA
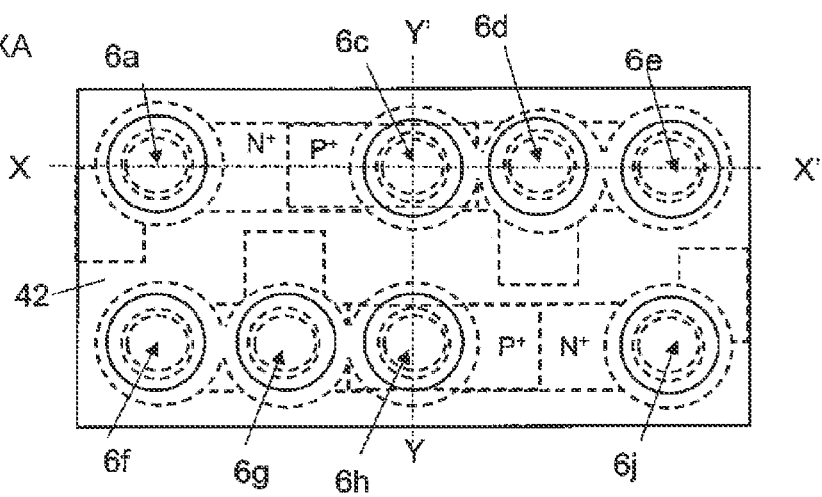
FIG. 1XXB
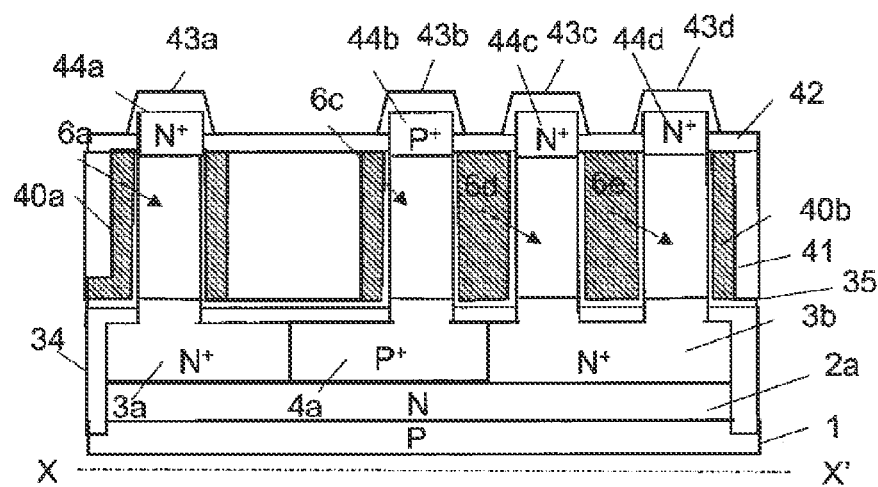
FIG. 1XXC
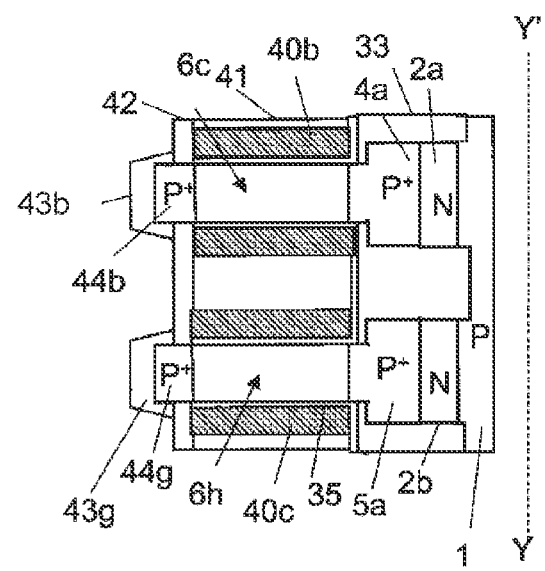

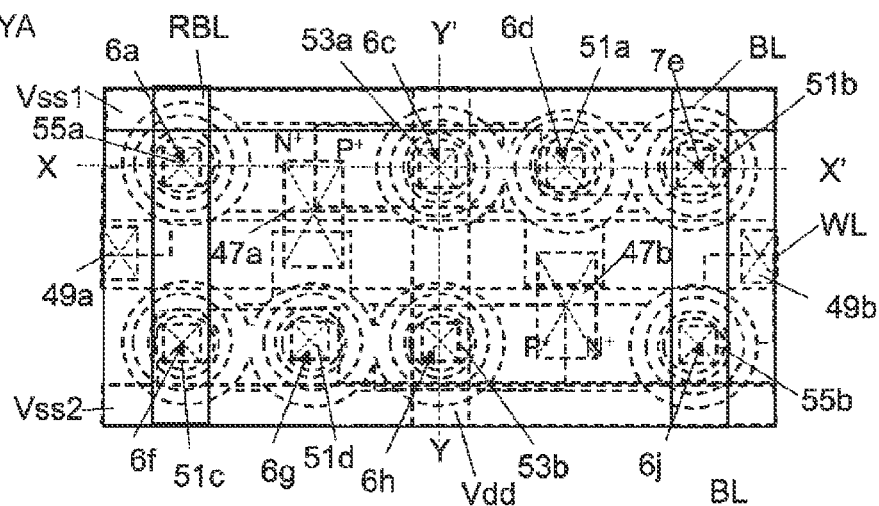
FIG. 1YYA
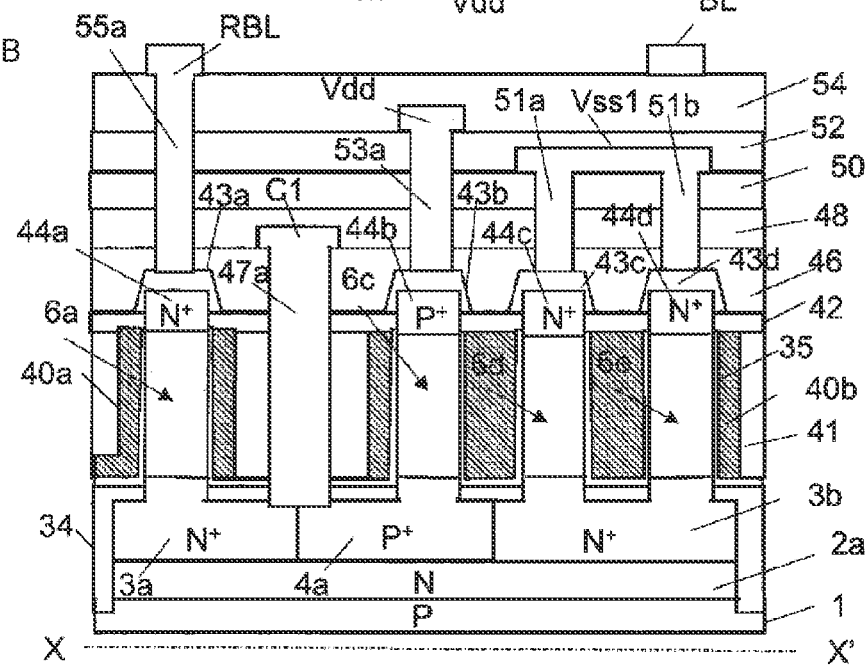
FIG. 1YYB
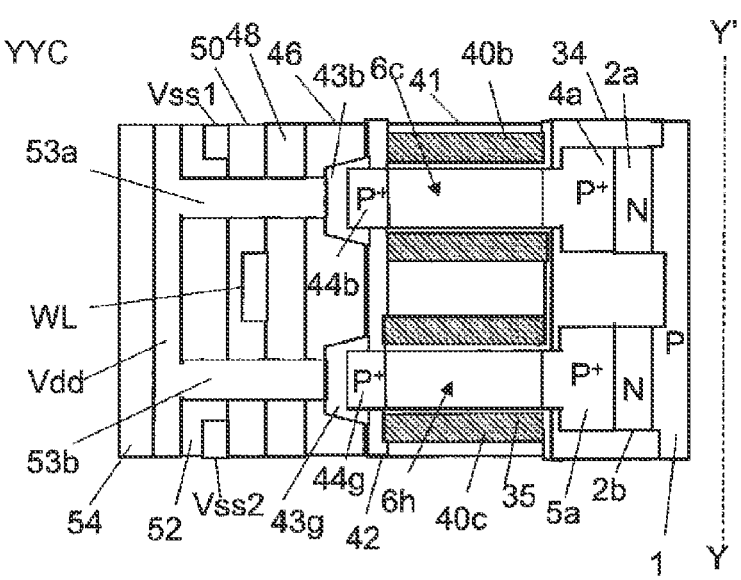
FIG. 1YYC

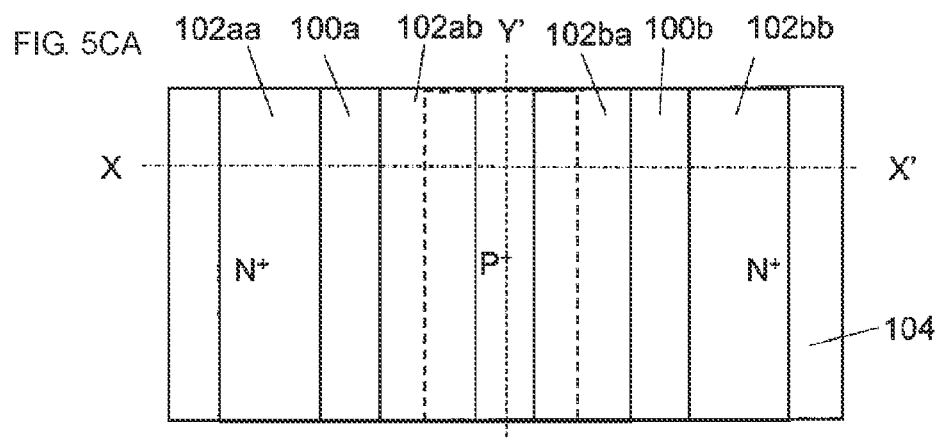
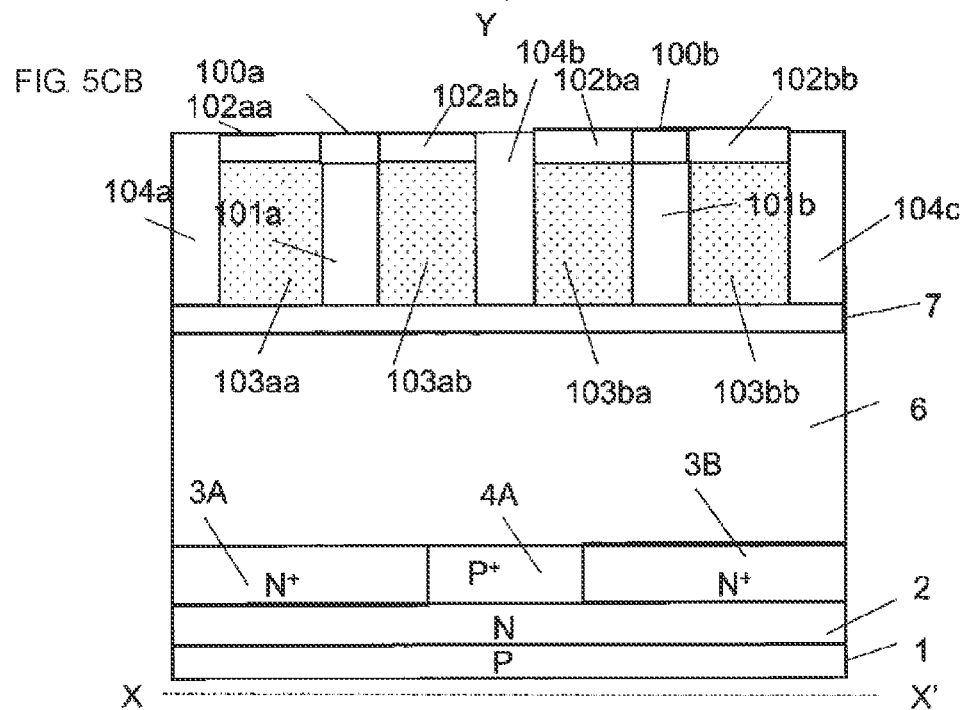
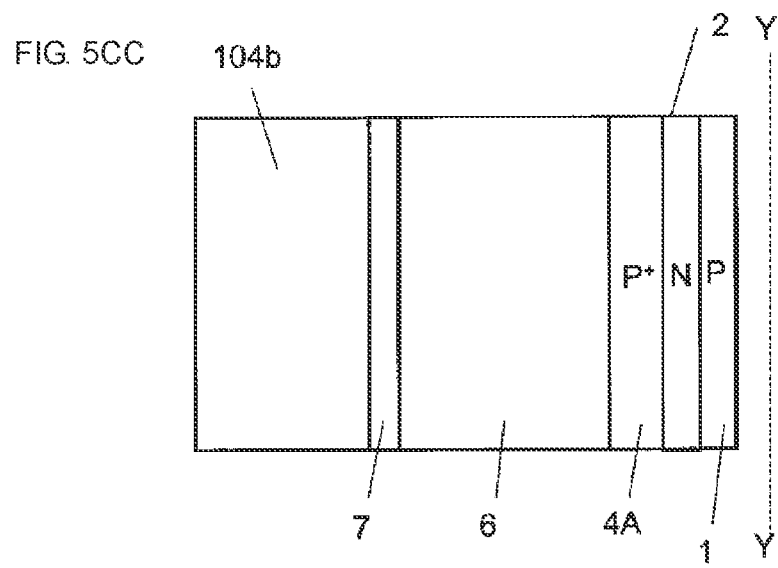

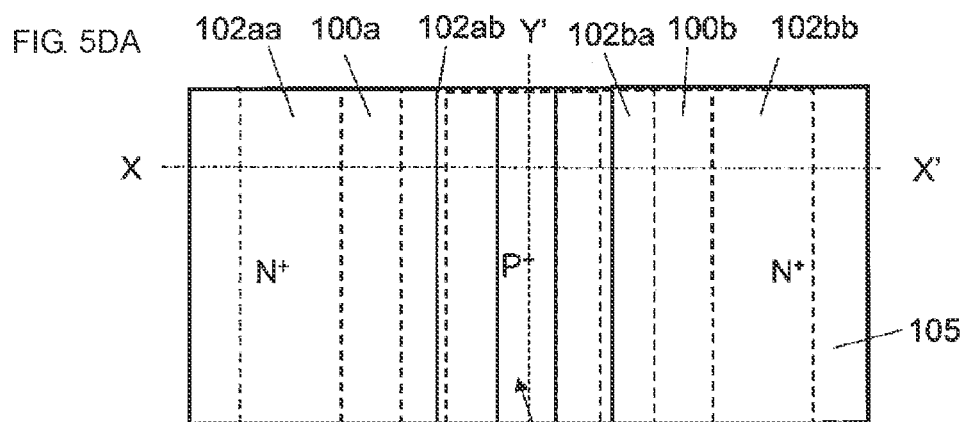
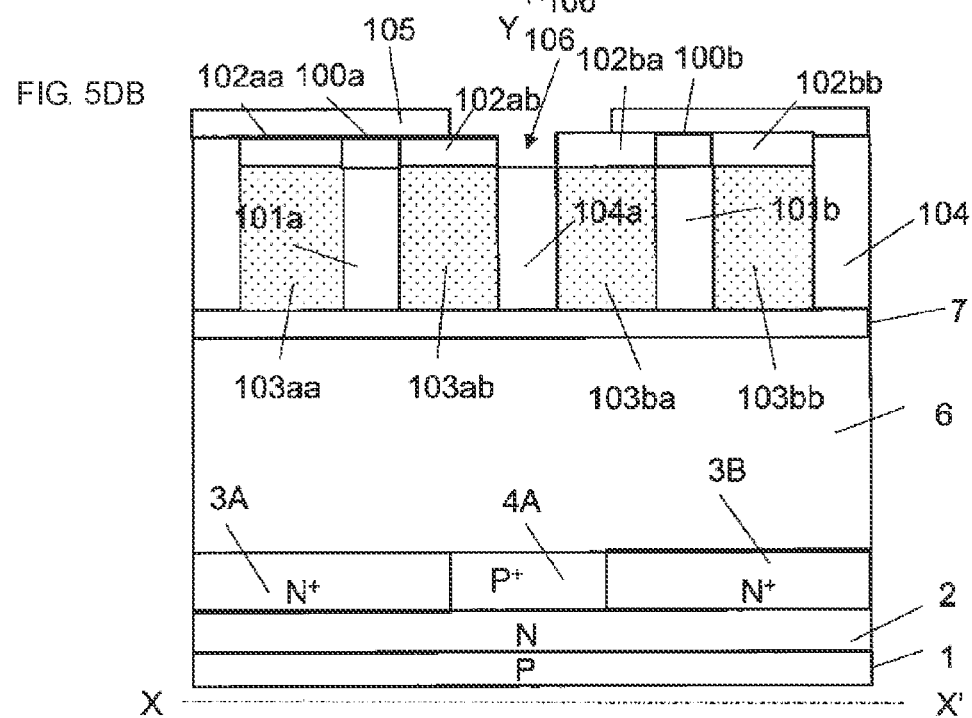
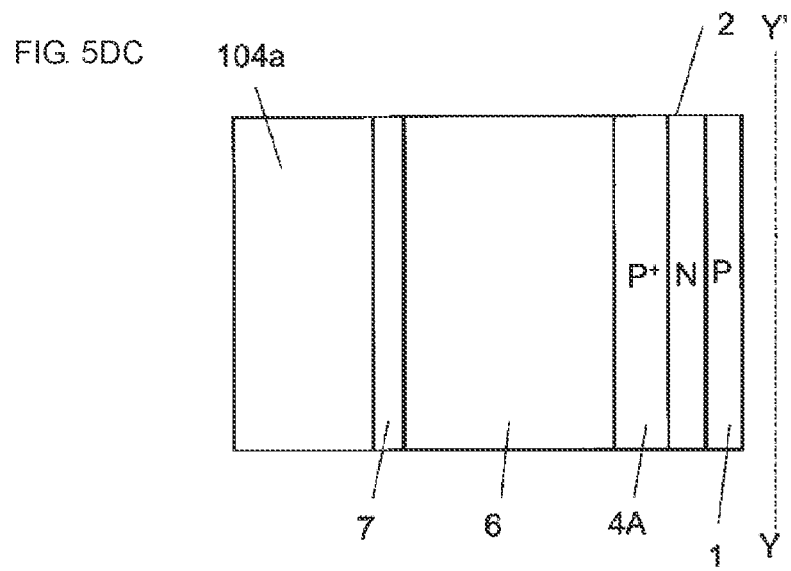

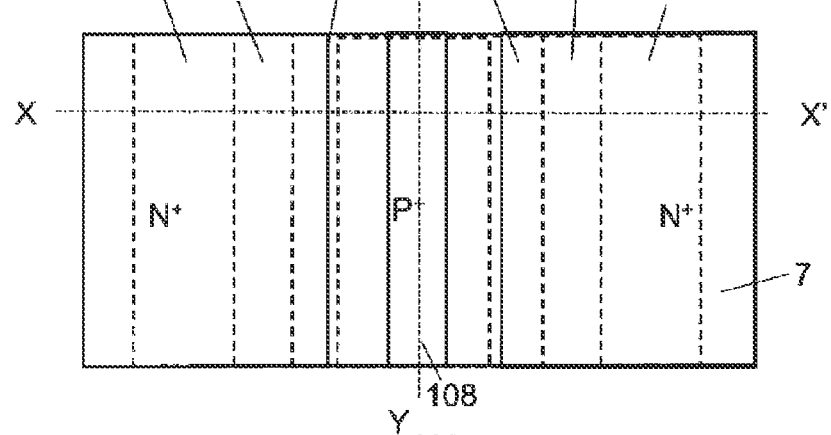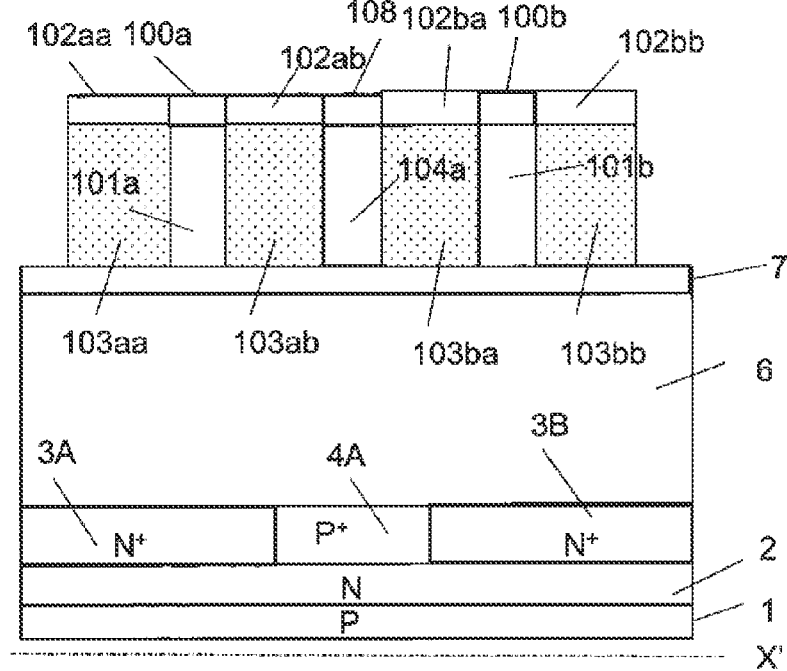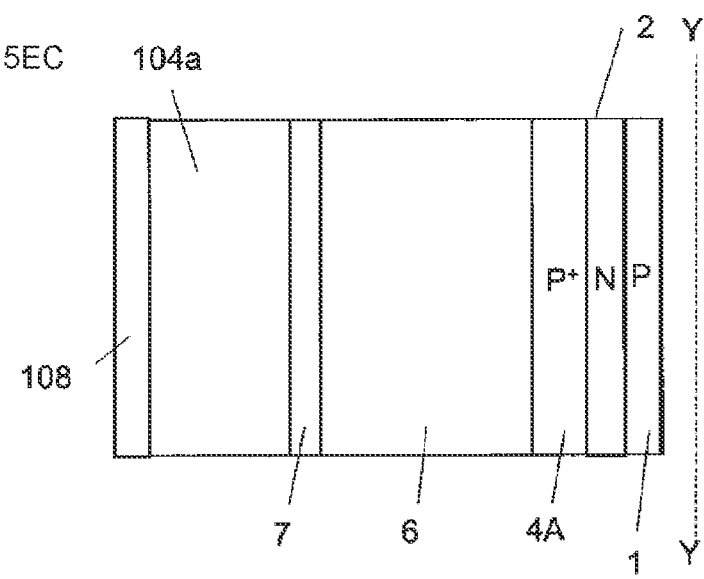

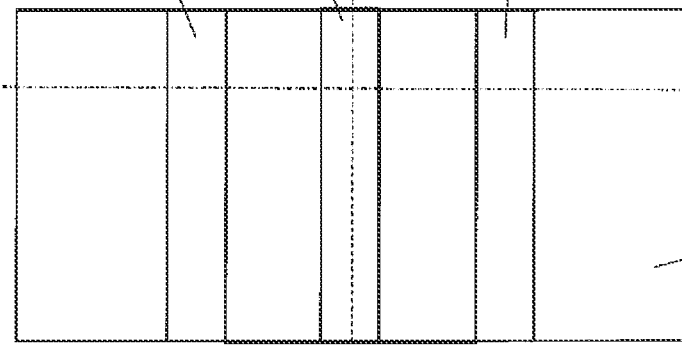
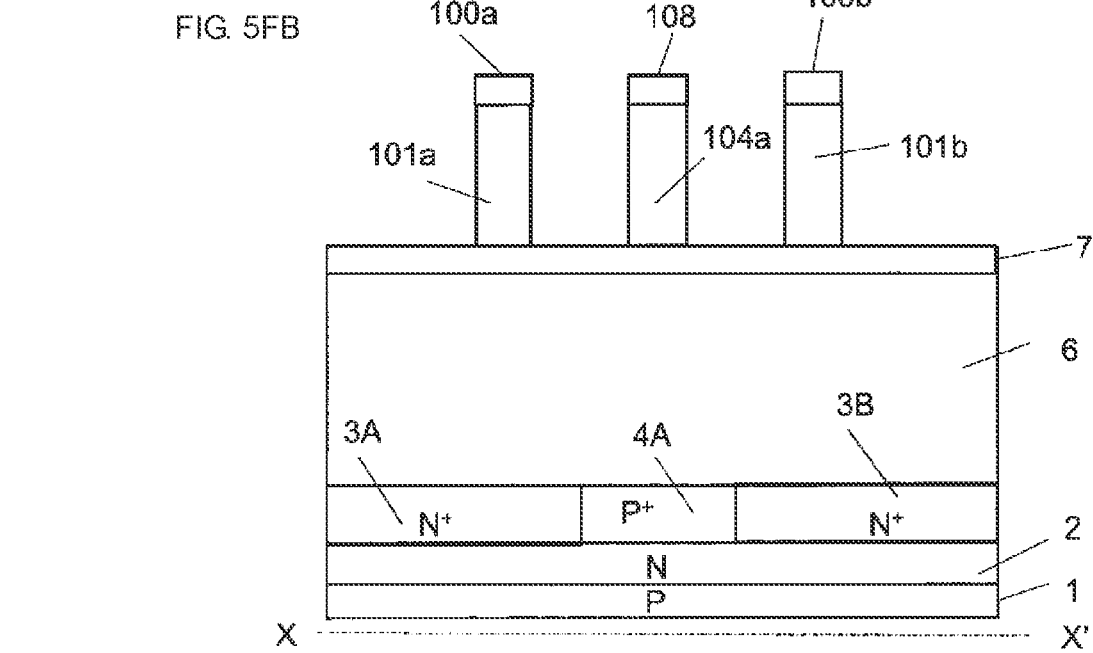
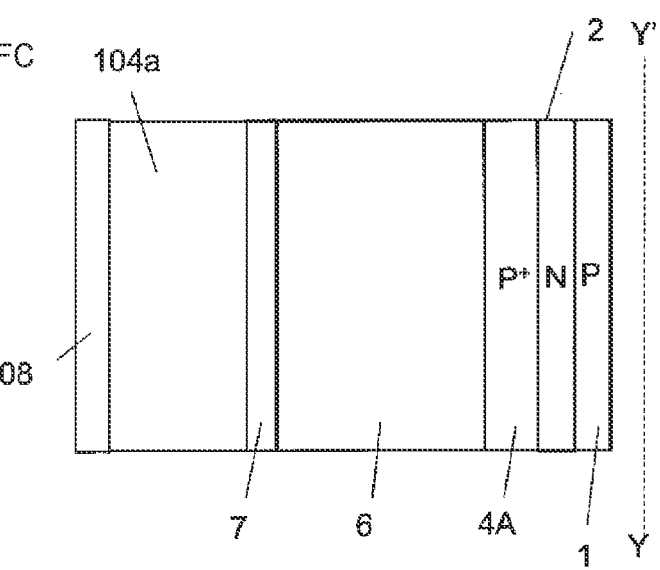

METHOD FOR MANUFACTURING THREE-DIMENSIONAL SEMICONDUCTOR DEVICE

CROSS REFERENCES TO RELATED APPLICATIONS

The present application is a continuation application of PCT/JP2018/047245, filed Dec. 21, 2018, the entire contents of which are incorporated herein by reference.

BACKGROUND OF THE INVENTION

1. Field of the Invention

The present invention relates to a method for manufacturing a three-dimensional semiconductor device.

2. Description of the Related Art

Recently, three-dimensional structure transistors are used for LSI (Large Scale Integration). Among them, SGT (Surrounding Gate Transistor), which is a pillar-shaped semiconductor device, has been attracting attention as a semiconductor element providing a highly integrated semiconductor device. In addition, higher integration and higher performance of semiconductor devices having SGTs are in need.

A conventional planar MOS transistor has channels extending in a horizontal direction along an upper surface of a semiconductor substrate. On the contrary, channels of the SGT extend in a direction vertical to an upper surface of a semiconductor substrate (refer for example to Laid-Open Japanese Patent Application Publication: JP H02-188966A and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Thus, density of the semiconductor device in the SGT can be increased more than that of the planar MOS transistor.

FIG. 10 shows a schematic structural view of an N channel SGT. $N^+$ layers 221$a$, 221$b$ (hereinafter, a semiconductor region containing donor impurity at high concentration is referred as "$N^+$ layer") in which when one is source, the other is drain, are each formed upper and lower parts in a Si pillar 220 (hereinafter, a silicon semiconductor pillar is referred as "Si pillar") having a conductivity type of P-type or i-type (intrinsic type). A part of the Si pillar 220 between the $N^+$ layers 221$a$, 221$b$, which are the source and the drain, becomes a channel region 222. A gate insulating layer 223 is formed surrounding the channel region 222. A gate conductor layer 224 is formed surrounding the gate insulating layer 223. In the SGT, the $N^+$ layers 221$a$, 221$b$, which are the source and the drain, the channel region 222, the gate insulating layer 223, and the gate conductor layer 224 are together formed into a pillar. Thus, in planar view, a footprint of the SGT corresponds to a footprint of a single source or drain $N^+$ layer of the planar MOS transistor. Therefore, a circuit chip having the SGT allows for achieving further reduction in chip size compared to a circuit chip having the planar MOS transistor.

High integration of a circuit using SGTs shown in FIG. 10 is in need.

SUMMARY OF THE INVENTION

Achievement of a high-density pillar-shaped semiconductor device is in need.

A method for manufacturing a three-dimensional semiconductor device according to a first aspect of the present invention includes steps of:

forming a first material layer on a second substrate consisting at least a part or entirely of a semiconductor layer on a first substrate;

forming a second band-like material layer having a first band-like material layer of a same planar view shape on its top, extended in one direction, in planar view, on the first material layer;

forming a second material layer and a third material layer from below, covering entire area;

smoothing the second material layer and the third material layer such that their upper surface positions come to an upper surface position of the first band-like material layer;

forming a third band-like material layer between side surfaces of the smoothed third material layer and the first band-like material layer on top of the smoothed second material layer;

removing the smoothed third material layer;

etching the second material layer with the first band-like material layer and the third band-like material layer as a mask to form a fourth band-like material layer in contact with each side surface of the second band-like material layer;

forming a fourth material layer and a fifth material layer from below, covering entire area;

smoothing the fourth material layer and the fifth material layer such that their upper surface positions come to the upper surface position of the first band-like material layer;

forming a fifth band-like material layer between side surfaces of the smoothed fifth material layer and the third band-like material layer on top of the smoothed fourth material layer;

removing the fifth material layer;

etching the fourth material layer with the first band-like material layer, the third band-like material layer, and the fifth band-like material layer as a mask to form a sixth band-like material layer in contact with side surface of the fourth band-like material layer;

removing the third band-like material layer and the fourth band-like material layer;

with a seventh band-like material layer consisting of a single layer or multiple layers orthogonal to the first band-like material layer in planar view being formed above or below the first band-like material layer, forming a rectangular or circular first mask material layer in planar view based at least on the first material layer, or the second band-like material layer, or the sixth band-like material layer in a first overlapping area of the seventh band-like material layer, the second band-like material layer, and the sixth band-like material layer in planar view; and etching the second substrate with the first mask material layer as a mask to form a three-dimensionally-shaped semiconductor layer consisting of the semiconductor layer on the first substrate, wherein the three-dimensionally-shaped semiconductor layer is a channel.

It is desirable in the manufacturing method that the step of forming the third band-like material layer includes steps of:
  etching a top of the second material layer with the first band-like material layer and the smoothed third material layer as a mask to form a first recess; and
  forming the third band-like material layer filling the first recess and its upper surface position being the same as the upper surface position of the first band-like material layer.

It is desirable in the manufacturing method that the step of forming the fifth band-like material layer includes steps of:
  etching a top of the fourth material layer with the first band-like material layer, the third band-like material layer, and the fifth material layer as a mask to form a second recess; and
  forming the fifth band-like material layer filling the second recess and its upper surface position being the same as the upper surface position of the first band-like material layer.

It is desirable in the manufacturing method that a ninth band-like material layer is formed above or below the first band-like material layer in a vertical direction, the ninth band-like material layer having an eighth band-like material layer on its top extending in one direction in planar view and having a shape the same as the seventh band-like material layer in planar view,
  wherein the seventh band-like material layer is formed by steps of:
  forming a sixth material layer and a seventh material layer from below, covering entire area;
  smoothing the sixth material layer and the seventh material layer such that their upper surface positions come to the upper surface position of the eighth band-like material layer;
  etching a top of the smoothed sixth material layer with the eighth band-like material layer and the smoothed seventh material layer as a mask to form a third recess;
  forming a tenth band-like material layer filling the third recess and its upper surface position being the same as the upper surface position of the eighth band-like material layer;
  removing the sixth material layer;
  etching the sixth material layer with the eighth band-like material layer and the tenth band-like material layer as a mask to form an eleventh band-like material layer in contact with each side surface of the ninth band-like material layer; and
  removing the eighth band-like material layer and the ninth band-like material layer, or removing the tenth band-like material layer and the eleventh band-like material layer to make a lower layer or both upper and lower layers of a remaining band-like material layer as the seventh band-like material layer.

It is desirable in the manufacturing method that either one of the second band-like material layer or the fourth band-like material layer is formed wider than the other in planar view.

It is desirable in the manufacturing method that either one of the second band-like material layer or the sixth band-like material layer is formed wider than the other in planar view.

It is desirable in the manufacturing method that the three-dimensionally-shaped semiconductor layer is semiconductor pillar(s) standing in a vertical direction on the first substrate.

It is desirable in the manufacturing method that the semiconductor pillars consist of at least a first semiconductor pillar, a second semiconductor pillar, and a third semiconductor pillar being adjacent and aligned in the one direction or a direction orthogonal to the one direction, and the method includes steps of:
  forming a first gate insulating layer surrounding side surfaces of the first semiconductor pillar, the second semiconductor pillar, and the third semiconductor pillar; and
  forming a first gate conductor layer surrounding the first gate insulating layer,
  wherein the first gate conductor layer is formed filling between at least two of the first semiconductor pillar, the second semiconductor pillar, and the third semiconductor pillar.

It is desirable in the manufacturing method that the method includes a step of removing any of a plurality of the semiconductor pillars formed on the substrate.

It is desirable in the manufacturing method that the method includes a step of not forming a part of area of the seventh band-like material layer in planar view before forming a plurality of the semiconductor pillars,
  wherein any of a plurality of the semiconductor pillars are not formed below the part of area of the seventh band-like material layer in planar view.

It is desirable in the manufacturing method that the method includes steps of:
  in parallel with the step of forming the second band-like material layer having the first band-like layer on its top, forming a thirteenth band-like material layer having a twelfth band-like material layer of a same planar shape on its top, extended in the same one direction, on the first material layer;
  in parallel with a step of forming the fourth band-like material layer having the third band-like layer on its top, forming a fifteenth band-like material layer having a fourteenth material layer of a same planar shape on its top, extended in the same one direction, on the first material layer;
  forming a sixteenth band-like material layer between the opposing fourth band-like material layer and the fifteenth band-like material layer, in contact with each side surface of them, and having a shape the same as the sixth band-like material layer; and
  removing the third band-like material layer, the fourth band-like material layer, the fourteenth band-like material layer, and the fifteenth band-like material layer.

It is desirable in the manufacturing method that the third band-like material layer is formed by oxidizing the top of the smoothed second material layer.

It is desirable in the manufacturing method that the third band-like material layer is formed by ion implantation of atomic ion to the top of the smoothed second material layer.

It is desirable in the manufacturing method that the method includes steps of:
  forming the second substrate in a configuration in which, each end thereof in one direction is in contact with each support material layer in planar view, and plural pairs of a first semiconductor layer and an eighth material layer are piled upwards in a vertical direction;
  removing the eighth material layer after forming the three-dimensionally-shaped semiconductor layer;
  forming a second gate insulating layer surrounding the first semiconductor layer of the three-dimensionally-shaped semiconductor layer;

forming a second gate conductor layer surrounding the second gate insulating layer;

removing the support material layer; and forming each impurity layer containing donor or acceptor impurities in contact with each end of the first semiconductor layer in the one direction in planar view.

A method for manufacturing a three-dimensional semiconductor device according to a second aspect of the present invention includes steps of:

forming a first material layer on a second substrate consisting at least a part or entirely of a semiconductor layer on a first substrate;

forming a second band-like material layer having a first band-like material layer of a same planar view shape on its top, extended in one direction, in planar view, over the first material layer;

forming a second material layer and a third material layer from below, covering entire area;

smoothing the second material layer and the third material layer such that their upper surface positions come to an upper surface position of the first band-like material layer;

forming a third band-like material layer between side surfaces of the smoothed third material layer and the first band-like material layer on top of the smoothed third material layer;

removing the smoothed second material layer;

etching the second material layer with the first band-like material layer and the third band-like material layer as a mask to form a fourth band-like material layer having the third band-like material layer on its top;

removing the first band-like material layer and the second band-like material layer;

with a fifth band-like material layer consisting of a single layer or multiple layers orthogonal to the fourth band-like material layer in planar view being formed above or below the third band-like material layer, forming a rectangular or circular first mask material layer in planar view based on the first material layer, or the fourth band-like material layer, or the fifth band-like material layer, in a first overlapping area of the fourth band-like material layer and the fifth band-like material layer in planar view; and etching the second substrate with the first mask material layer as a mask to form a three-dimensionally-shaped semiconductor layer consisting of the semiconductor layer on the substrate, wherein the three-dimensionally-shaped semiconductor layer is a channel.

It is desirable in the manufacturing method that the step of forming the third band-like material layer includes steps of:

etching a top of the second material layer with the first band-like material layer and the third material layer as a mask to form a first recess; and forming the third band-like material layer filling the first recess and its upper surface position being the same as the upper surface position of the first band-like material layer.

It is desirable in the manufacturing method that either one of the second band-like material layer or the fourth band-like material layer is formed wider than the other in planar view.

It is desirable in the manufacturing method that the three-dimensionally-shaped semiconductor layer is semiconductor pillar(s) standing in a vertical direction on the first substrate.

It is desirable in the manufacturing method that the semiconductor pillars consist of at least a first semiconductor pillar and a second semiconductor pillar being adjacent and aligned in the one direction or a direction orthogonal to the one direction, and the method includes steps of:

forming a first gate insulating layer surrounding side surfaces of the first semiconductor pillar and the second semiconductor pillar; and forming a first gate conductor layer surrounding the first gate insulating layer, wherein the first gate conductor layer is formed filling between the first semiconductor pillar and the second semiconductor pillar.

It is desirable in the manufacturing method that the method includes a step of removing any of a plurality of the semiconductor pillars formed on the substrate.

It is desirable in the manufacturing method that the method includes a step of not forming a part of area of the seventh band-like material layer in planar view before forming a plurality of the semiconductor pillars, wherein any of a plurality of the semiconductor pillars are not formed below the part of area of the seventh band-like material layer in planar view.

It is desirable in the manufacturing method that the method includes steps of:

simultaneously with forming the first band-like material layer and the second band-like material layer, forming a seventh band-like material layer having a sixth band-like material layer on its top, parallel to the first band-like material layer and the second band-like material layer, in planar view;

simultaneously with forming the third band-like material layer and the fourth band-like material layer, forming a ninth band-like material layer having an eighth band-like material layer on its top, in contact with each side surface of the sixth band-like material layer and the seventh band-like material layer; and removing the sixth band-like material layer and the seventh band-like material layer in parallel with the step of removing the first band-like material layer and the second band-like material layer.

It is desirable in the manufacturing method that space of the ninth band-like material layer and the fourth band-like material layer in planar view is formed the same as one or both of the second band-like material layer or the seventh band-like material layer.

It is desirable in the manufacturing method that the third band-like material layer is formed by oxidizing the top of the smoothed second material layer.

It is desirable in the manufacturing method that the third band-like material layer is formed by ion implantation of atomic ion to the top of the smoothed second material layer.

It is desirable in the manufacturing method that the method includes steps of:

forming the second substrate in a configuration in which, each end thereof in one direction is in contact with each support material layer in planar view, and plural pairs of the semiconductor layer and a fourth material layer are piled upwards in a vertical direction;

removing the fourth material layer after forming the three-dimensionally-shaped semiconductor layer;

forming a second gate insulating layer surrounding the semiconductor layer of the three-dimensionally-shaped semiconductor layer;

forming a second gate conductor layer surrounding the second gate insulating layer;

removing the support material layer; and forming each impurity layer containing donor or acceptor impurities in contact with each end of the semiconductor layer in the one direction in planar view.

According to the present invention, the high-density pillar-shaped semiconductor device is achieved.

BRIEF DESCRIPTION OF THE DRAWINGS

FIG. 1OA and FIGS. 1OB and 1OC are respectively a plan view and cross-sectional structural views for describing a pillar-shaped semiconductor device having SGTs according to the first embodiment.

FIG. 1SA and FIGS. 1SB and 1SC are respectively a plan view and cross-sectional structural views for describing a pillar-shaped semiconductor device having SGTs according to the first embodiment.

FIG. 1ZA and FIGS. 1ZB and 1ZC are respectively a plan view and cross-sectional structural views for describing a pillar-shaped semiconductor device having SGTs according to the first embodiment.

FIG. 1XXA and FIGS. 1XXB and 1XXC are respectively a plan view and cross-sectional structural views for describing a pillar-shaped semiconductor device having SGTs according to the first embodiment.

FIG. 1YYA and FIGS. 1YYB and 1YYC are respectively a plan view and cross-sectional structural views for describing a pillar-shaped semiconductor device having SGTs according to the first embodiment.

FIG. 5CA and FIGS. 5CB and 5CC are respectively a plan view and cross-sectional structural views for describing a pillar-shaped semiconductor device having SGTs according to the fifth embodiment.

FIG. 5DA and FIGS. 5DB and 5DC are respectively a plan view and cross-sectional structural views for describing a pillar-shaped semiconductor device having SGTs according to the fifth embodiment.

FIG. 5EA and FIGS. 5EB and 5EC are respectively a plan view and cross-sectional structural views for describing a pillar-shaped semiconductor device having SGTs according to the fifth embodiment.

FIG. 5FA and FIGS. 5FB and 5FC are respectively a plan view and cross-sectional structural views for describing a pillar-shaped semiconductor device having SGTs according to the fifth embodiment.

DESCRIPTION OF THE PREFERRED EMBODIMENTS

Hereinafter, the method for manufacturing a pillar-shaped semiconductor device according to embodiments of the present invention is described with reference to drawings.

First Embodiment

Hereinafter, a method for manufacturing a pillar-shaped semiconductor device having SGTs according to the first embodiment of the present invention is described with reference to FIGS. 1AA to 1YYC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

Figure 1A:
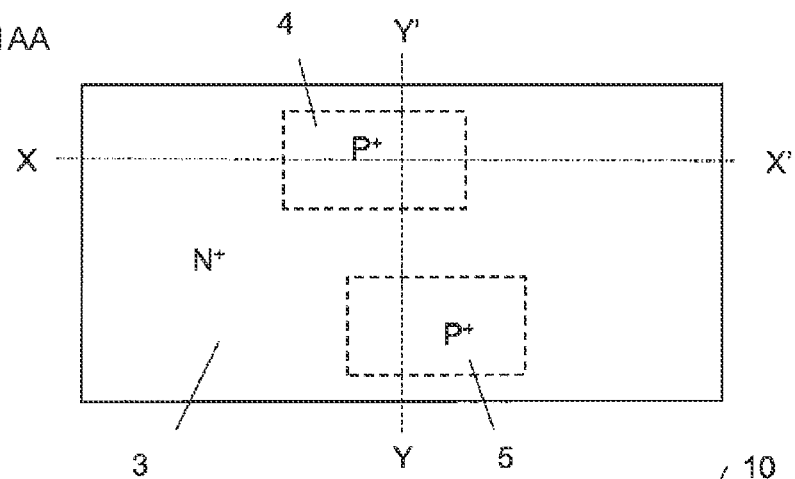
FIG. 1AA and FIGS. 1AB and 1AC are respectively a plan view and cross-sectional structural views for describing a pillar-shaped semiconductor device having SGTs according to the first embodiment.
Figure 1A:
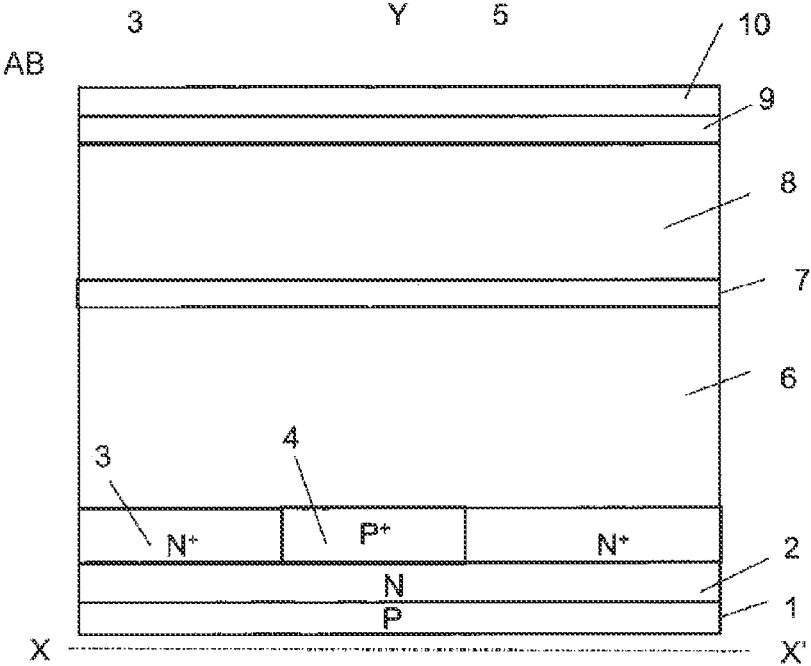
Figure 1A:
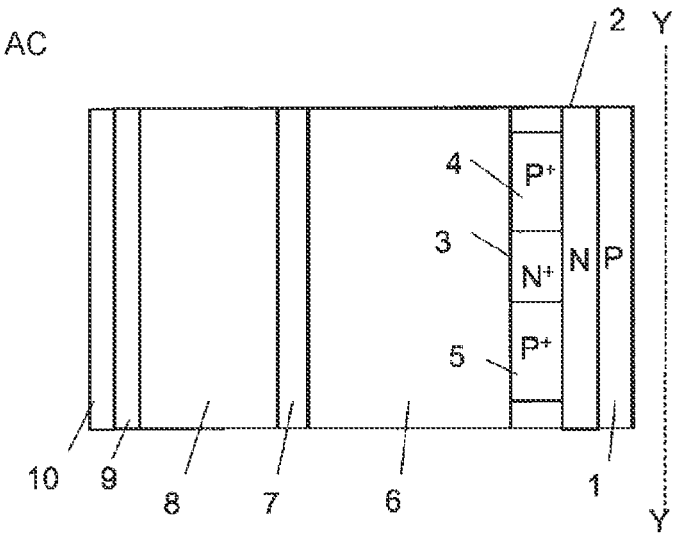

As shown in FIGS. 1AA to 1AC, an N layer 2 is formed on a P layer substrate 1 by an epitaxial crystal growth method. Then, an $N^+$ layer 3 and $P^+$ layers 4, 5 are formed on a surface layer of the N layer 2 by an ion implantation method. Then, an i layer (intrinsic Si layer) 6 is formed. Then, a mask material layer 7 consisting of, for example, a SiO₂ layer, an aluminum oxide (Al₂O₃, hereinafter referred as AlO) layer and a SiO₂ layer is formed. Also, the i layer 6 may be formed by N-type or P-type Si, which contains a small amount of donor or acceptor impurity. Then, a silicon nitride (SiN) layer 8 is deposited. Then, a mask material layer 9 consisting of a SiO₂ layer is deposited. Then, a mask material layer 10 consisting of a SiN layer is deposited.

Figure 1B:
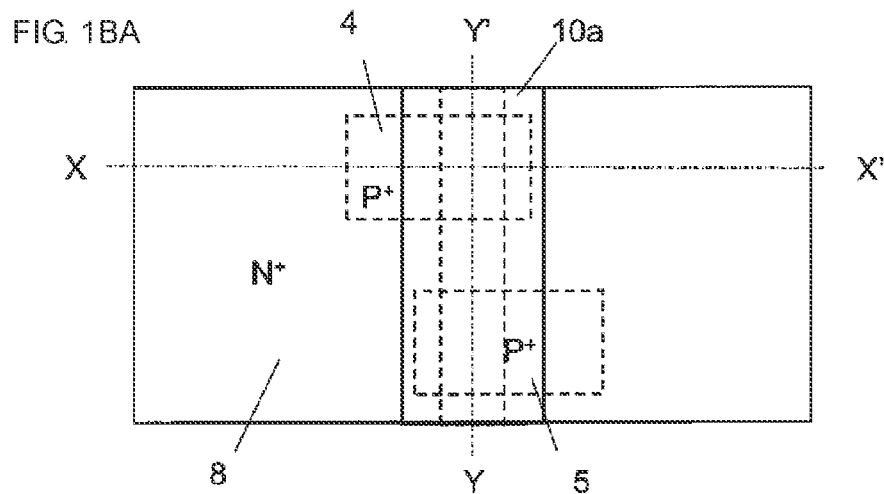
FIG. 1BA and FIGS. 1BB and 1BC are respectively a plan view and cross-sectional structural views for describing a pillar-shaped semiconductor device having SGTs according to the first embodiment.
Figure 1B:
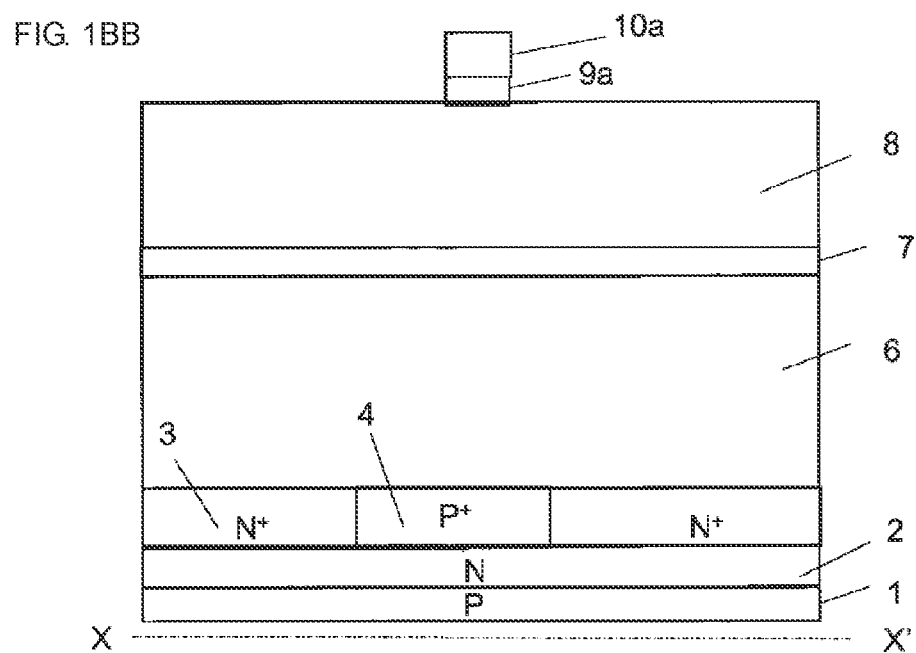
Figure 1B:
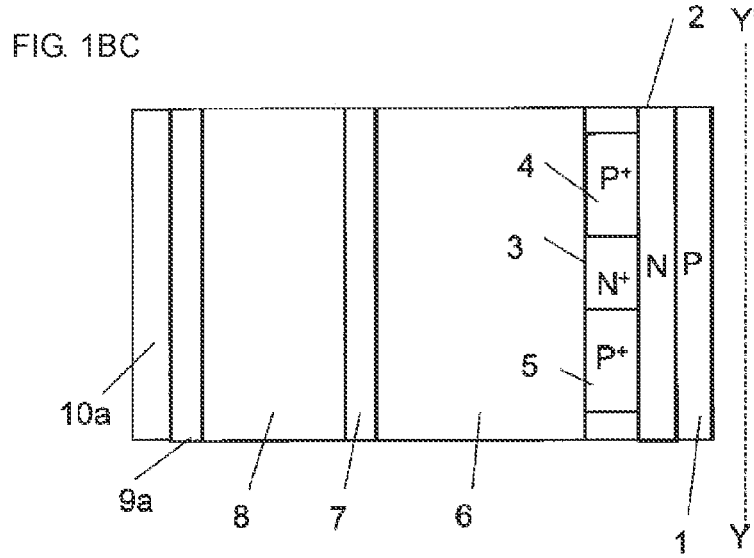

Next, as shown in FIGS. 1BA to 1BC, the mask material layer 10 is etched with a lithographically formed band-like resist layer (not shown) extended in Y direction in planar view as a mask. A band-like mask material layer 10*a* extended in the Y direction in planar view is thus formed. Here, the band-like mask material layer 10*a* may be subjected to an isotropic etching such that the width of the band-like mask material layer 10*a* is formed to become smaller than the width of the resist layer. Thus, it may be possible to form a band-like mask material layer 10*a* having a width smaller than the smallest width of a resist layer which can be formed lithographically. Then, the mask material layer 9 is etched, for example by RIE (Reactive Ion Etching), with the band-like mask material layer 10*a* as an etching mask, to form a band-like mask material layer 9*a*. While the band-like mask material layer 10*a* formed by the isotropic etching has a trapezoidal cross section with its bottom width being wider than its top width, the mask material layer 9*a* is etched by RIE, and thus has a rectangular cross section. This rectangular cross section leads an enhanced precision of etching pattern, which is etched with the band-like mask 9*a* as a mask.

Figure 1C:
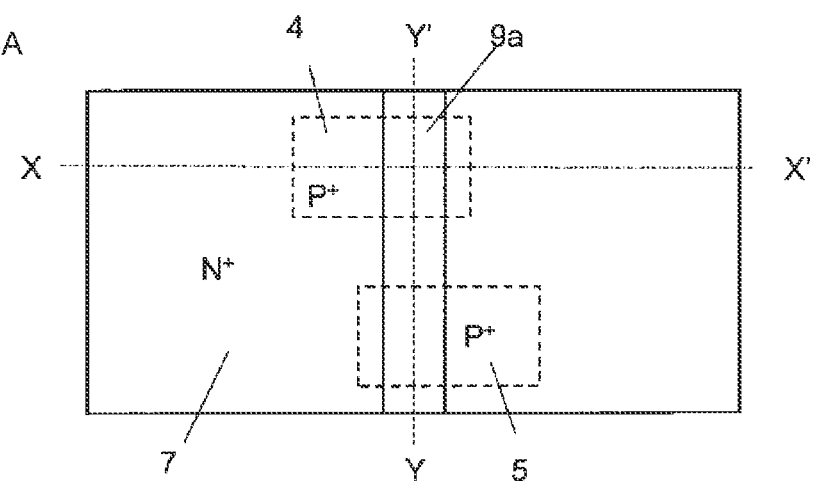
FIG. 1CA and FIGS. 1CB and 1CC are respectively a plan view and cross-sectional structural views for describing a pillar-shaped semiconductor device having SGTs according to the first embodiment.
Figure 1C:
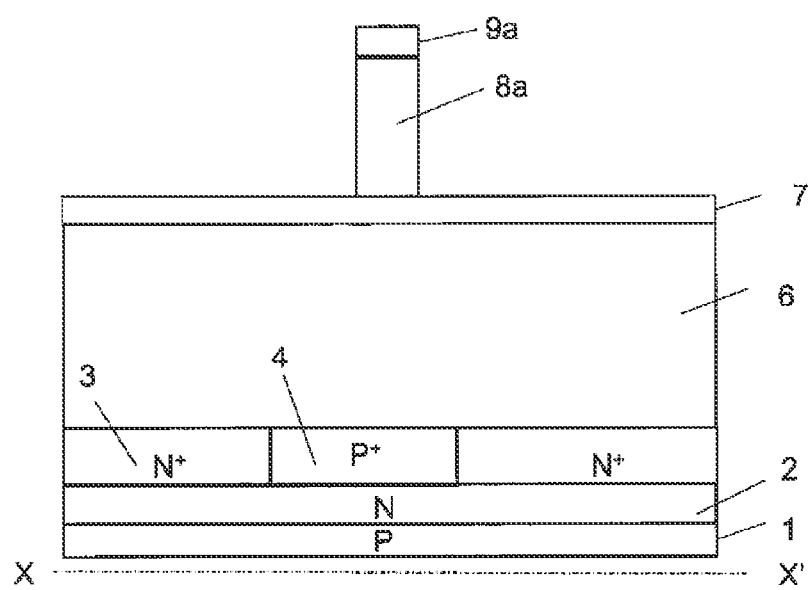
Figure 1C:
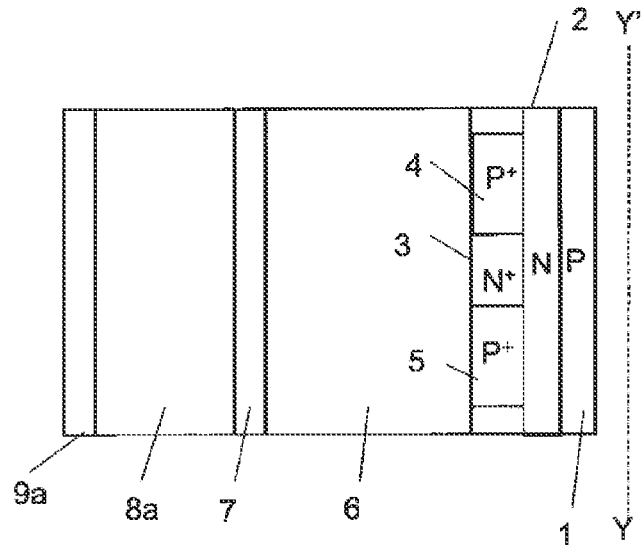

Next, as shown in FIGS. 1CA to 1CC, the mask material layer 8 is etched, for example by RIE method with the band-like mask material layer 9*a* as a mask to form a band-like mask material layer 8*a*. The band-like mask material layer 10*a* may be removed prior to the etching of the mask material layer 8 or may remain.

Figure 1D:
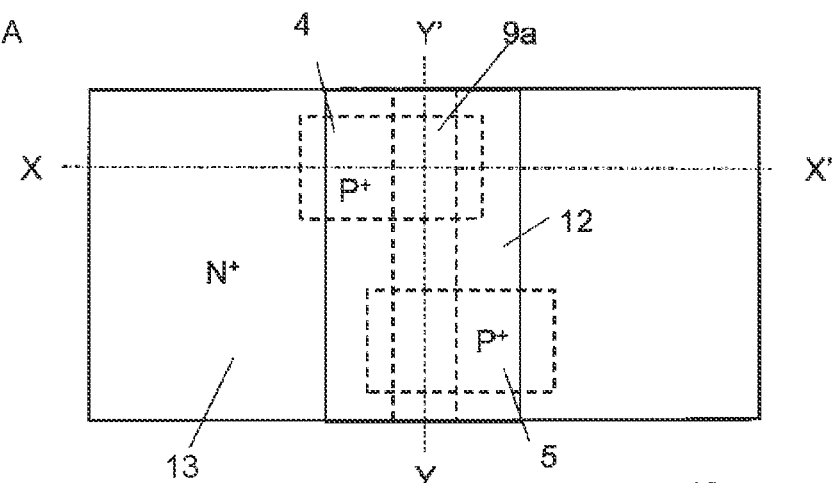
FIG. 1DA and FIGS. 1DB and 1DC are respectively a plan view and cross-sectional structural views for describing a pillar-shaped semiconductor device having SGTs according to the first embodiment.
Figure 1D:
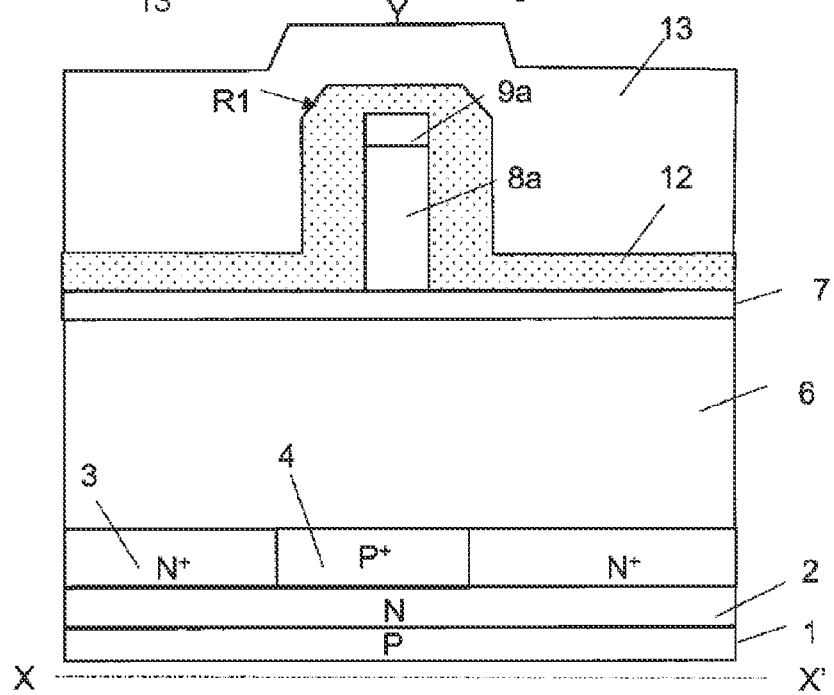
Figure 1D:
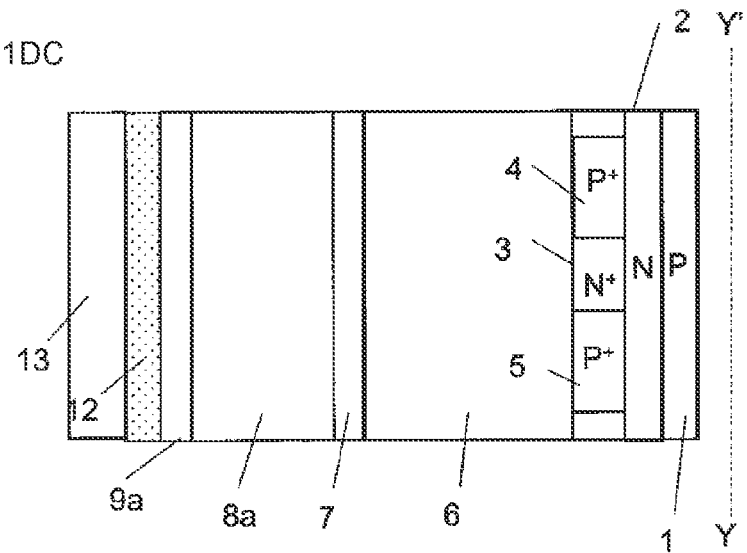

Next, as shown in FIGS. 1DA to 1DC, a SiGe layer 12 and a SiO₂ layer 13 are entirely formed over the mask material layer 7 (first material layer), the band-like mask material layer 8*a* (second band-like material layer) and the layer 9*a* (first band-like material layer) by ALD (Atomic Layered Deposition) method. In this case, a cross section of the SiGe layer 12 (second material layer) provides a round part R1 at its top. It is desirable to form the round part R1 to be positioned above the band-like mask material layer 8*a*.

Figure 1E:
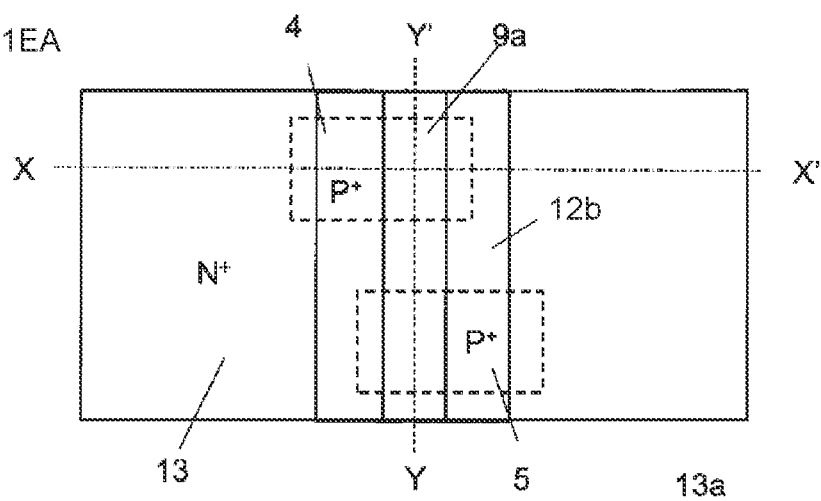
FIG. 1EA and FIGS. 1EB and 1EC are respectively a plan view and cross-sectional structural views for describing a pillar-shaped semiconductor device having SGTs according to the first embodiment.
Figure 1E:
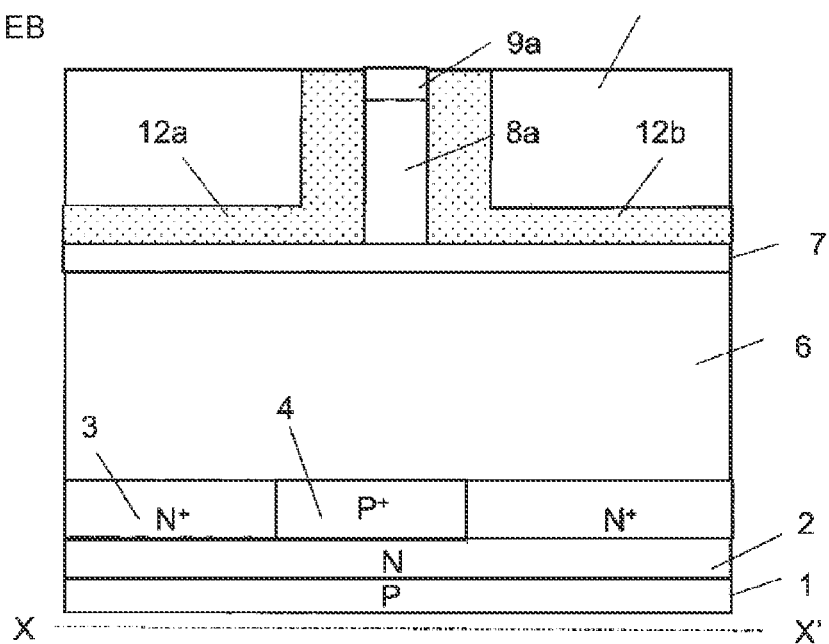
Figure 1E:
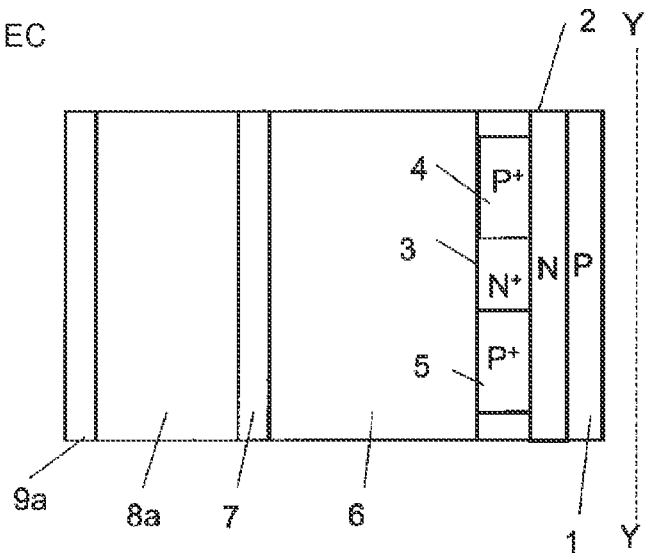

Next, as shown in FIGS. 1EA to 1EC, the entire area is covered with a SiO₂ layer (not shown) for example by Flow CVD (Flow Chemical Vapor Deposition) method, and then the SiO₂ layer 13 (third material layer) and the SiGe layer 12 are polished by CMP (Chemical Mechanical Polishing) such that their upper surface positions come to the upper surface position of the band-like mask material layer 9*a* to form a SiO₂ layer 13*a* and SiGe layers 12*a*, 12*b*. In this case, it is desirable that the top side surfaces of the SiGe layers 12*a*, 12*b* are vertical. For this purpose, it is desirable that the round part R1 of the top of the SiGe layer 12 in FIG. 1DB has been removed during the polishing process of the SiO₂ layer 13 and the SiGe layer 12.

Figure 1F:
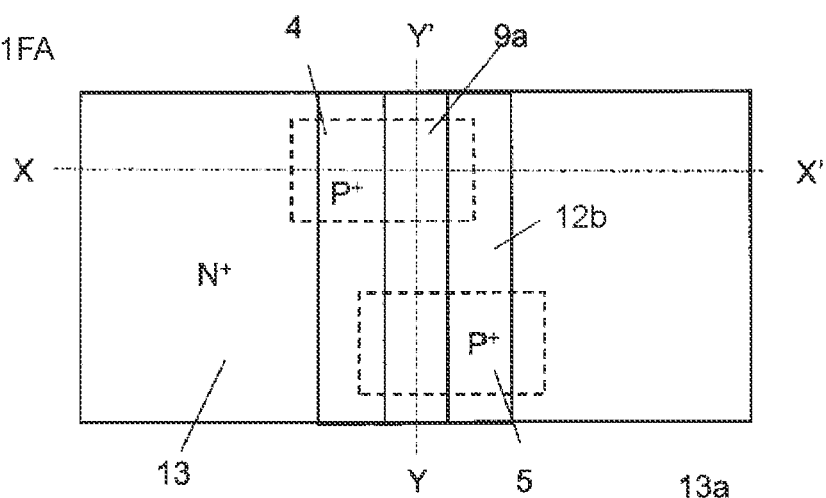
FIG. 1FA and FIGS. 1FB and 1FC are respectively a plan view and cross-sectional structural views for describing a pillar-shaped semiconductor device having SGTs according to the first embodiment.
Figure 1F:
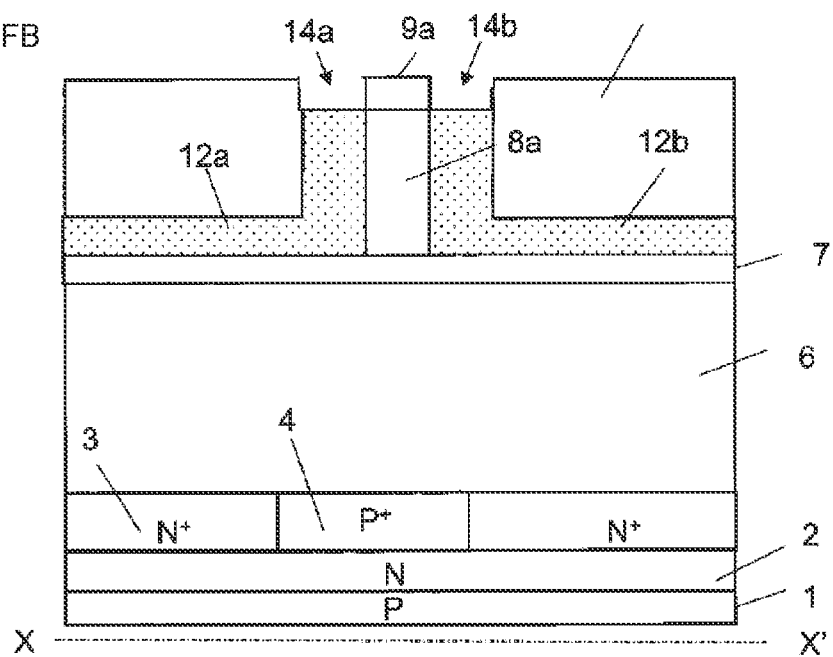
Figure 1F:
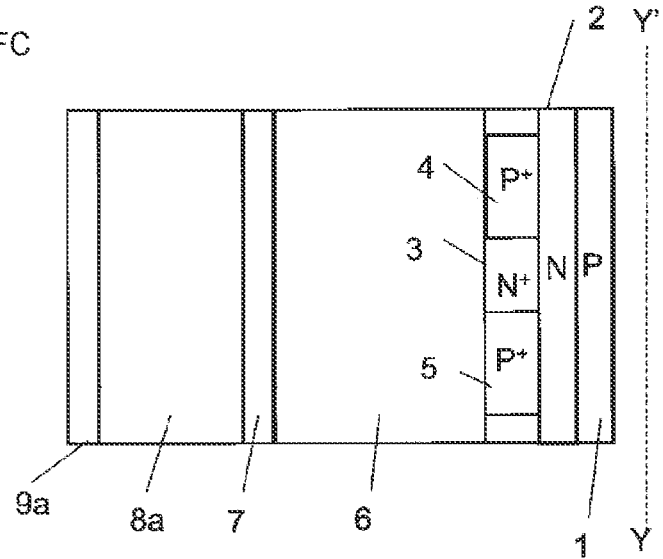

Next, as shown in FIGS. 1FA to 1FC, each of the top of the SiGe layers 12*a*, 12*b* is etched with the SiO₂ layer 13 and the band-like mask material layer 9*a* as a mask to form recesses 14*a*, 14*b* (first recess). It is desirable that the bottom positions of the recesses 14*a*, 14*b* come to the lower position of the mask material layer 9*a* and that the round part R1 of the top of the SiGe layers 12*a*, 12*b* has been etched. During the polishing process of the SiO₂ layer and the SiGe layer 12, the round part R1 of the top of the SiGe layer 12 in FIG. 1DB is removed, and thus the recesses 14*a*, 14*b* having vertical peripheral side surfaces are formed.

Figure 1G:
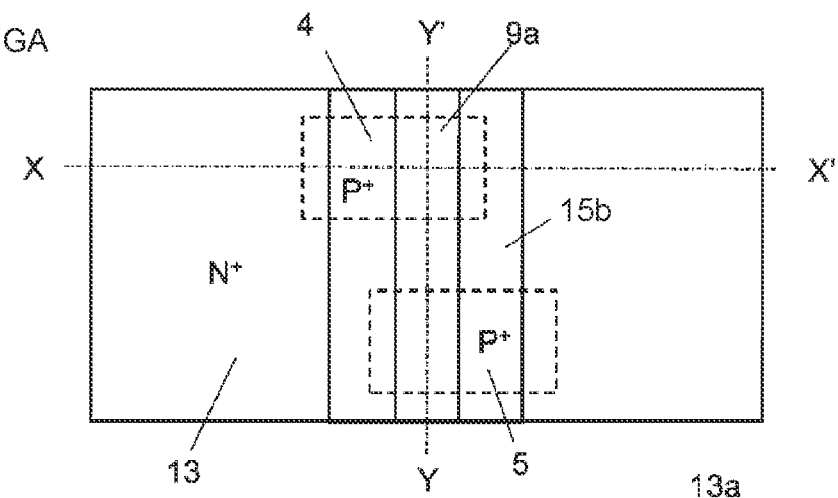
FIG. 1GA and FIGS. 1GB and 1GC are respectively a plan view and cross-sectional structural views for describing a pillar-shaped semiconductor device having SGTs according to the first embodiment.
Figure 1G:
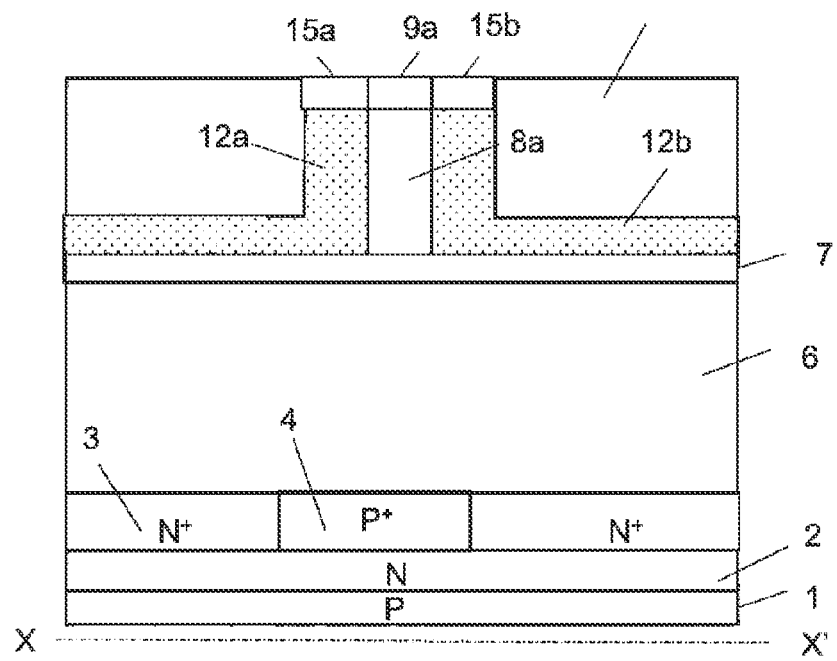
Figure 1G:
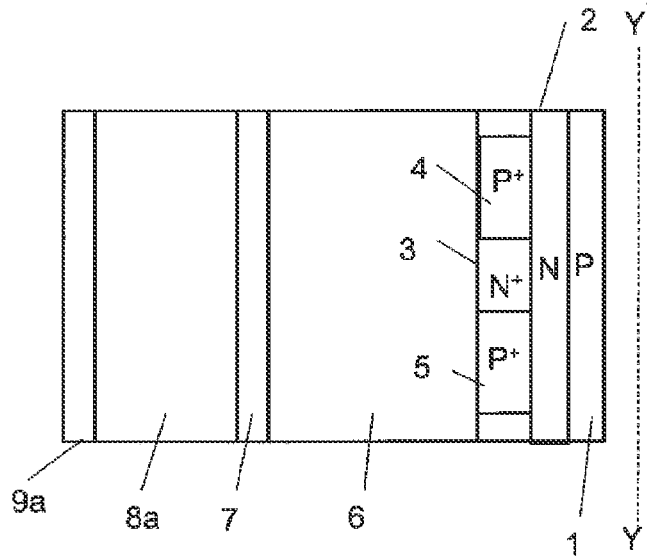

Next, as shown in FIGS. 1GA to 1GC, the entire area is covered with a SiN layer (not shown), and the SiN layer is entirely polished by CMP method such that its upper surface position comes to the upper surface position of the mask material layer 9*a*. Thus, SiN layers 15*a*, 15*b* (third band-like material layer) having the same shape as the shape of the top of the SiGe layers 12*a*, 12*b* in planar view are formed at each side of the band-like mask material layers 8*a*, 9*a*.

Figure 1H:
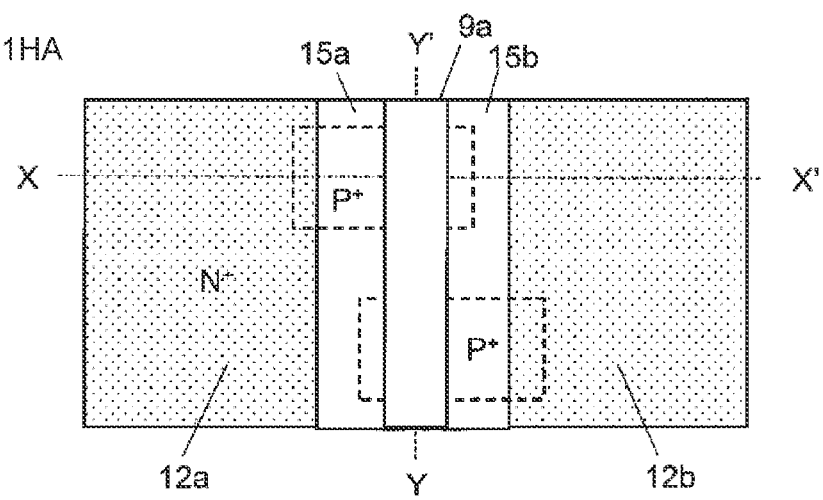
FIG. 1HA and FIGS. 1HB and 1HC are respectively a plan view and cross-sectional structural views for describing a pillar-shaped semiconductor device having SGTs according to the first embodiment.
Figure 1H:
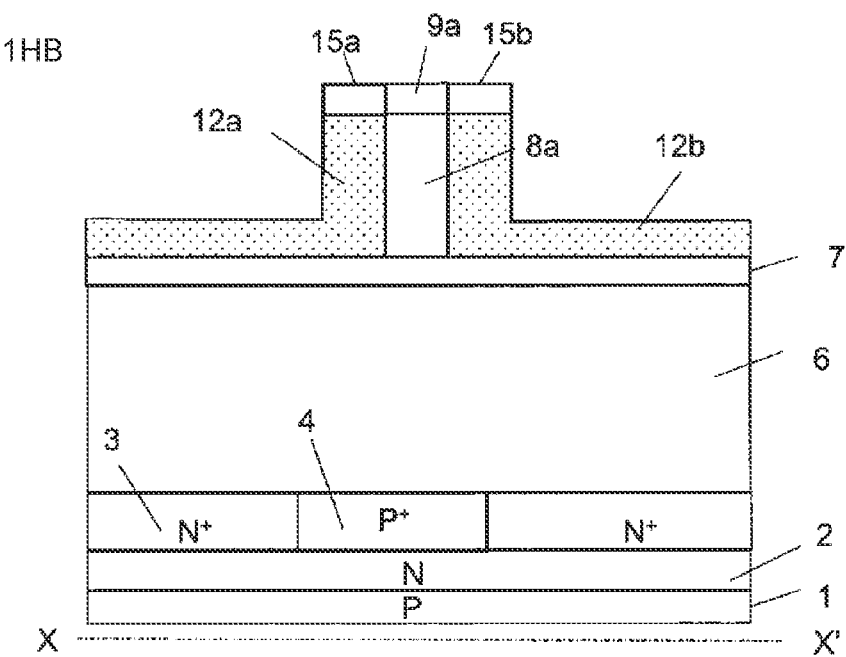
Figure 1H:
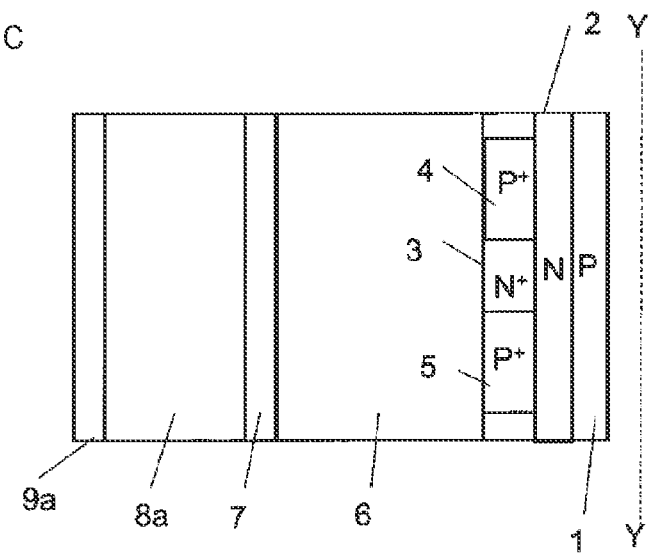

Then, as shown in FIGS. 1HA to 1HC, the SiO₂ layer 13 is removed.

Figure 1I:
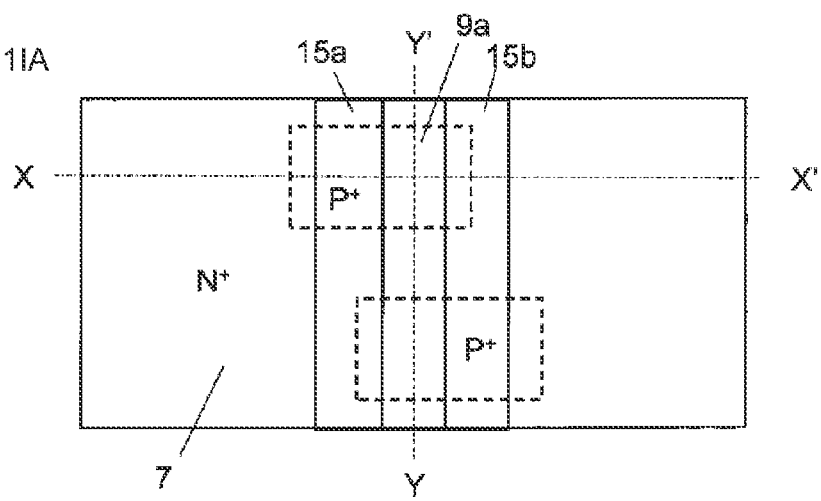
FIG. 1IA and FIGS. 1IB and 1IC are respectively a plan view and cross-sectional structural views for describing a pillar-shaped semiconductor device having SGTs according to the first embodiment.
Figure 1I:
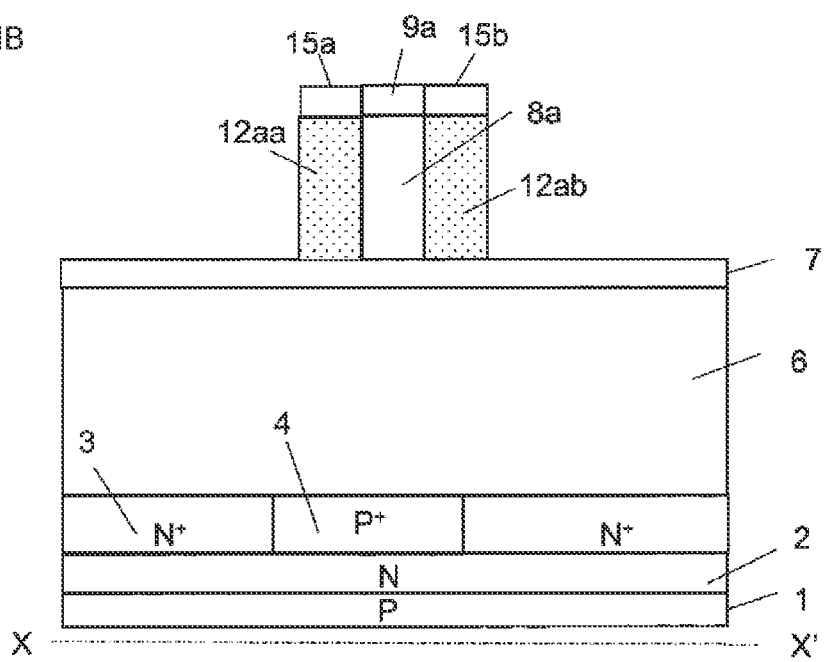
Figure 1I:
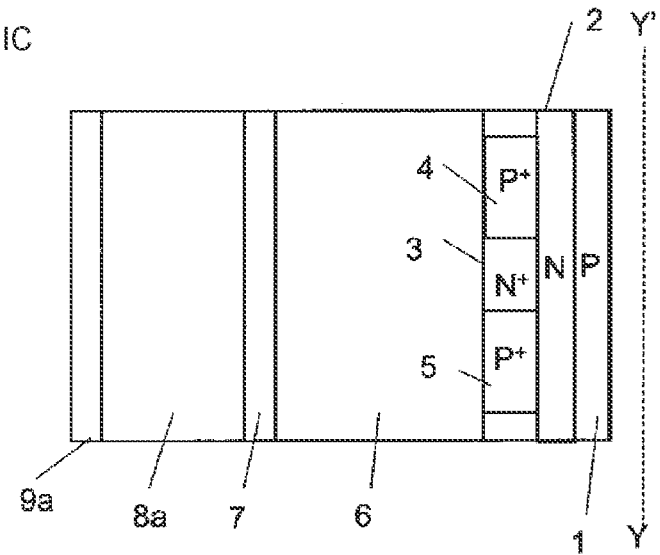

Next, as shown in FIGS. 1IA to 1IC, the SiGe layers 12*a*, 12*b* are etched with the band-like mask material layers 9*a*, 15*a*, 15*b* as a mask to form band-like SiGe layers 12*aa*, 12*ab* (fourth band-like material layer). In this case, the band-like SiGe layer 12*aa* and the band-like SiGe layer 12*ab* have the same width in planar view.

Figure 1J:
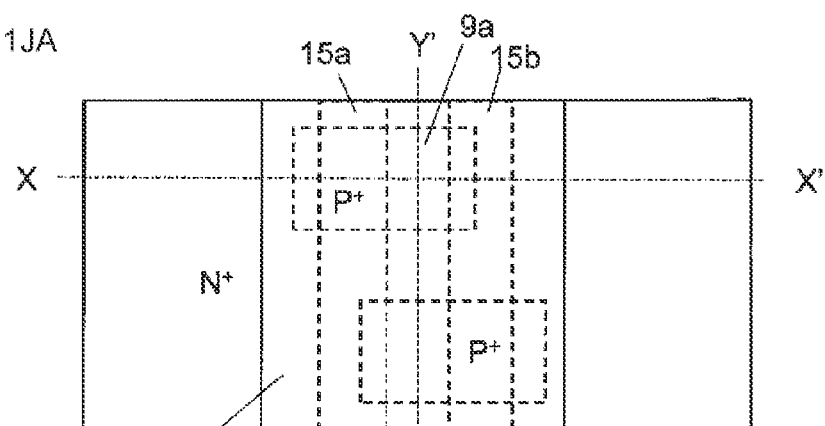
FIG. 1JA and FIGS. 1JB and 1JC are respectively a plan view and cross-sectional structural views for describing a pillar-shaped semiconductor device having SGTs according to the first embodiment.
Figure 1J:
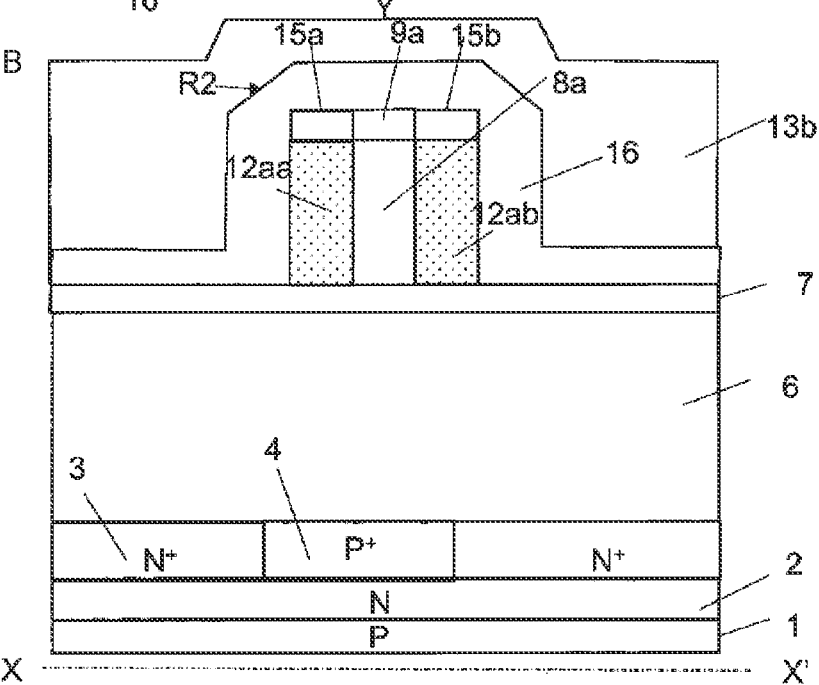
Figure 1J:
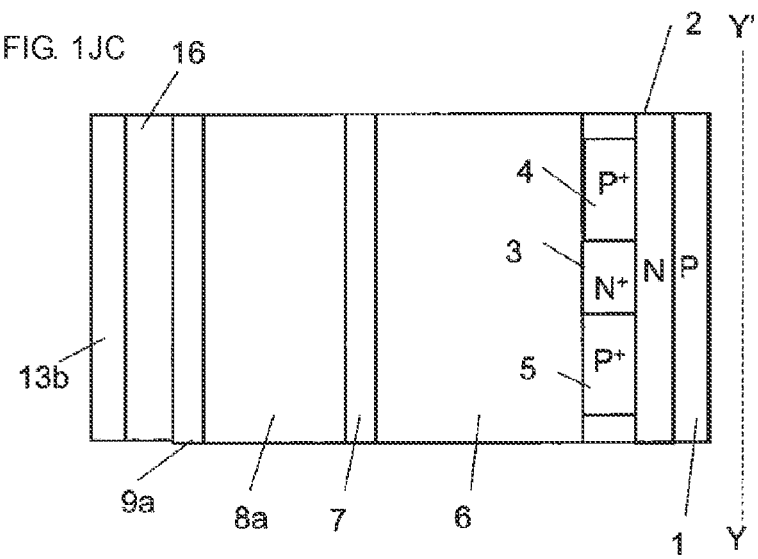

Next, as shown in FIGS. 1JA to 1JC, a SiN layer 16 by ALD method and a SiO₂ layer 13*b* by FCVD method are formed to cover the entire area. In this case, similar to FIG. 1DB, a round part R2 provided at the top of the SiN layer 16 (fourth material layer) is desirably positioned above the band-like mask material layer 9*a*.

Figure 1K:
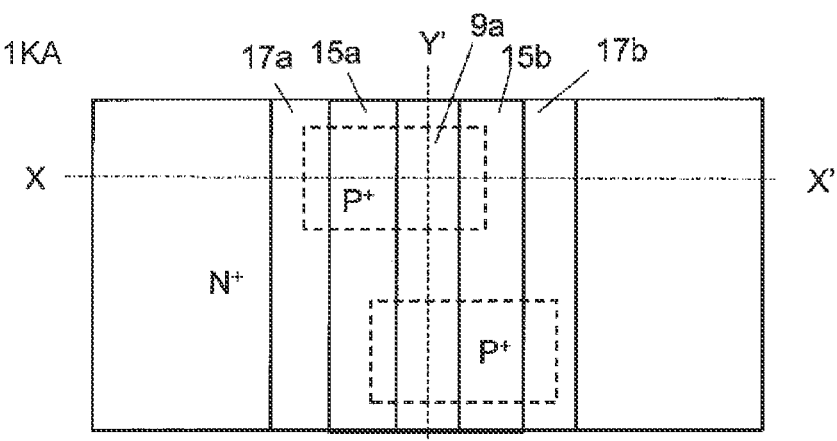
FIG. 1KA and FIGS. 1KB and 1KC are respectively a plan view and cross-sectional structural views for describing a pillar-shaped semiconductor device having SGTs according to the first embodiment.
Figure 1K:
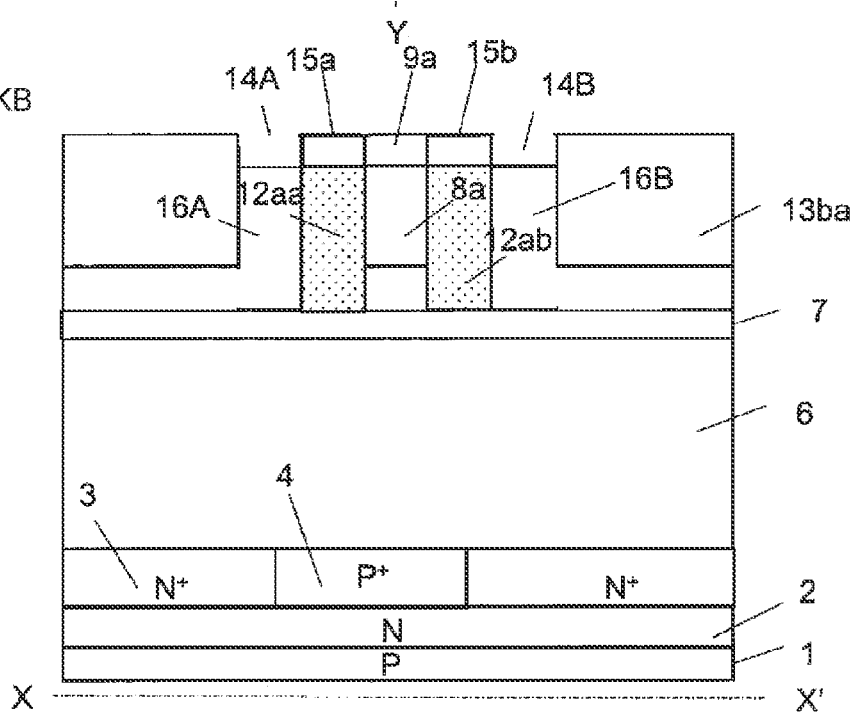
Figure 1K:
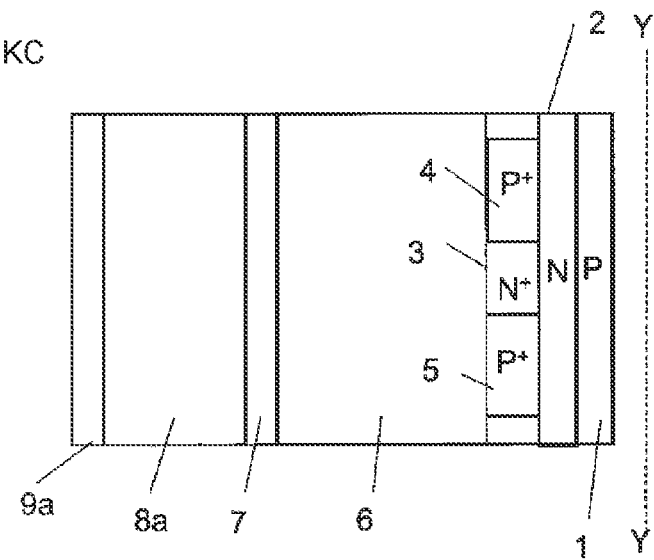

Next, the SiO₂ layer 13*b* (fifth material layer) and the SiN layer 16 are polished such that their upper surface positions come to the same position as the upper surface of the mask material layer 9*a*. Then, by performing processes similar to those of FIGS. 1EA and 1FC, recesses 14A, 14B (second recess) are formed above band-like SiN layers 16A, 16B, and between band-like mask material layers 15*a*, 15*b* and a SiO₂ layer 13*ba*, as shown in FIGS. 1KA to 1KC.

Figure 1L:
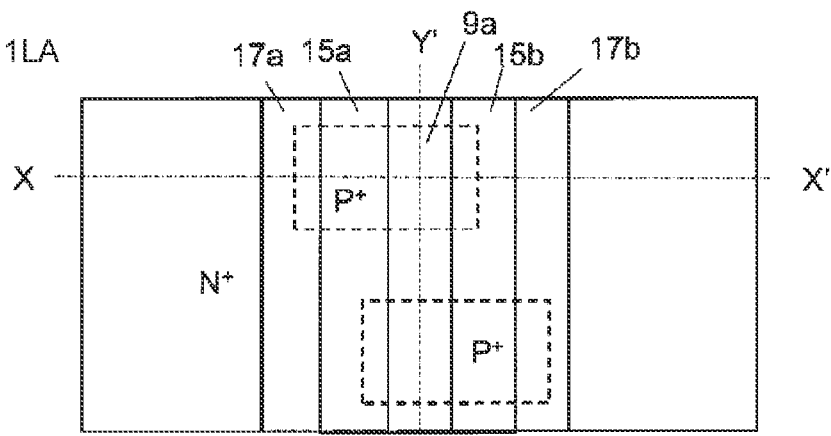
FIG. 1LA and FIGS. 1LB and 1LC are respectively a plan view and cross-sectional structural views for describing a pillar-shaped semiconductor device having SGTs according to the first embodiment.
Figure 1L:
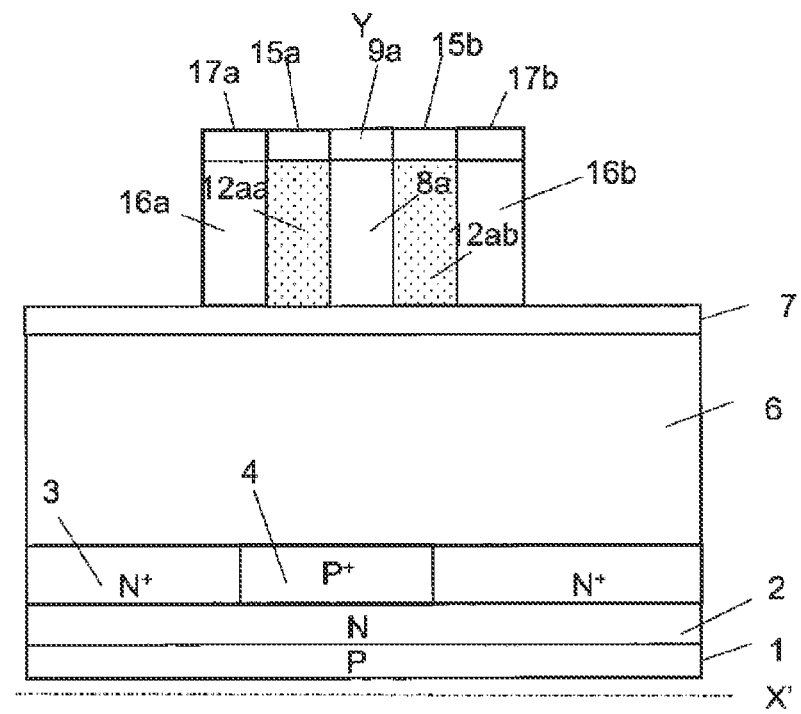
Figure 1L:
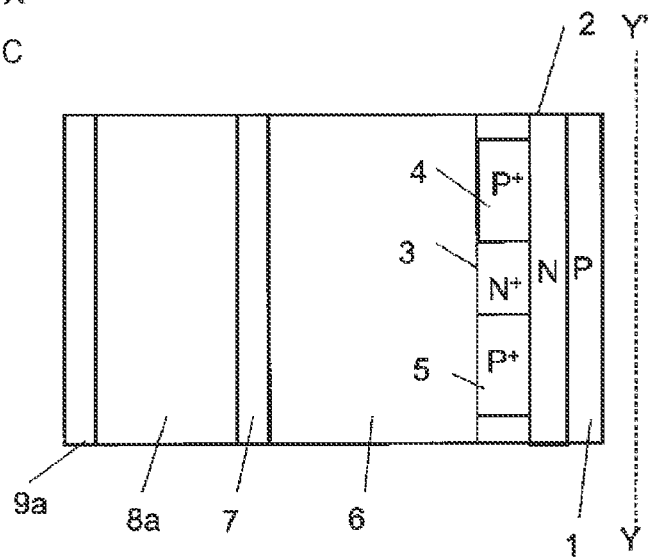

As shown in FIGS. 1LA to 1LC, band-like SiN layers 16*a*, 16*b* in contact with each side surface of the band-like SiGe layers 12*aa*, 12*ab*, and band-like mask material layers 17*a*, 17*b* (fifth band-like material layer) in contact with each side surface of the band-like mask material layers 15*a*, 15*b* are formed.

Figure 1M:
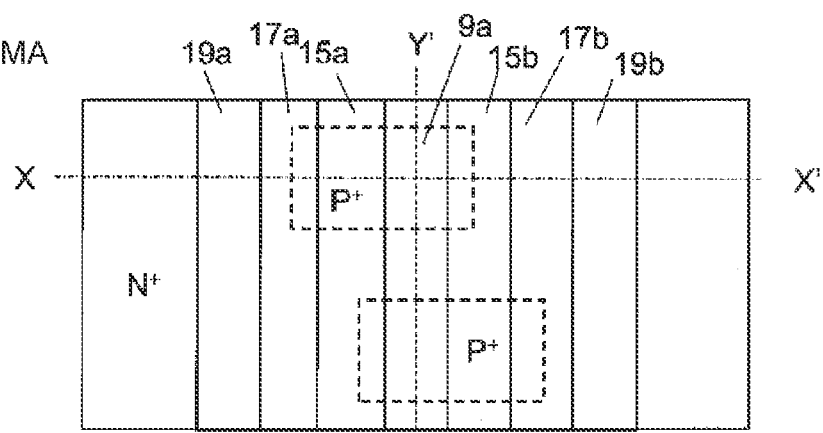
FIG. 1MA and FIGS. 1MB and 1MC are respectively a plan view and cross-sectional structural views for describing a pillar-shaped semiconductor device having SGTs according to the first embodiment.
Figure 1M:
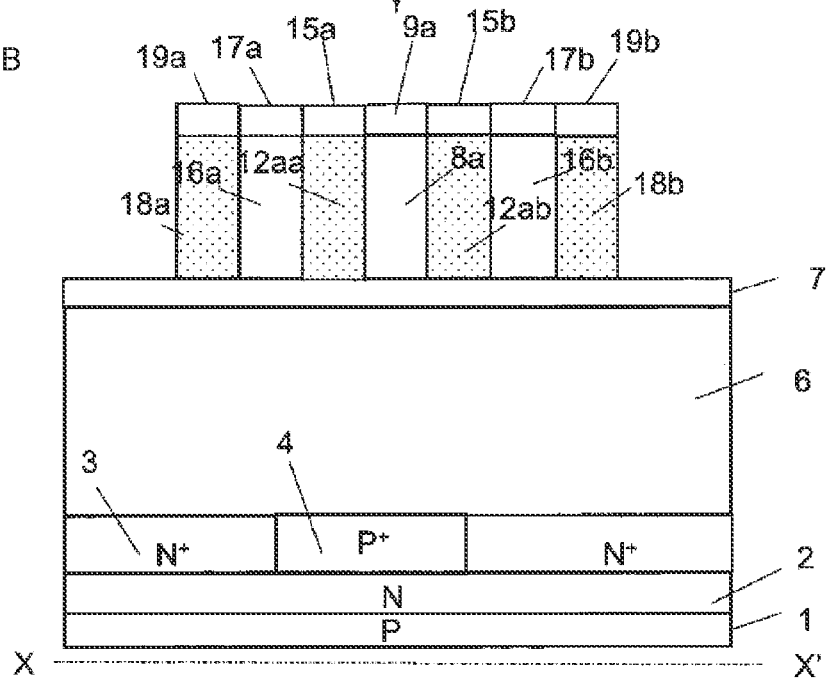
Figure 1M:
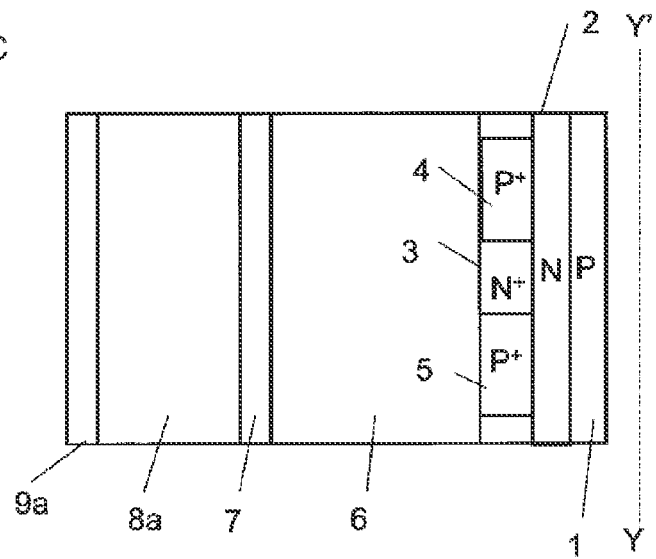

Next, a SiGe layer (not shown) is formed by ALD method to cover the entire area. Then, a SiO₂ layer (not shown) is formed to cover the entire area. Then, the SiO₂ layer and the SiGe layer are polished such that their upper surface positions come to the same position as the upper surface of the band-like mask material layer 9*a*. Then, by performing processes similar to those of FIGS. 1EA to 1IC, band-like SiGe layers 18*a*, 18*b* in contact with each side surface of the band-like mask material layers 16*a*, 16*b* (sixth band-like material layer), and band-like mask material layers 19*a*, 19*b* in contact with each side surface of the band-like mask material layers 17*a*, 17*b* are formed, as shown in FIGS. 1MA to 1MC.

Figure 1N:
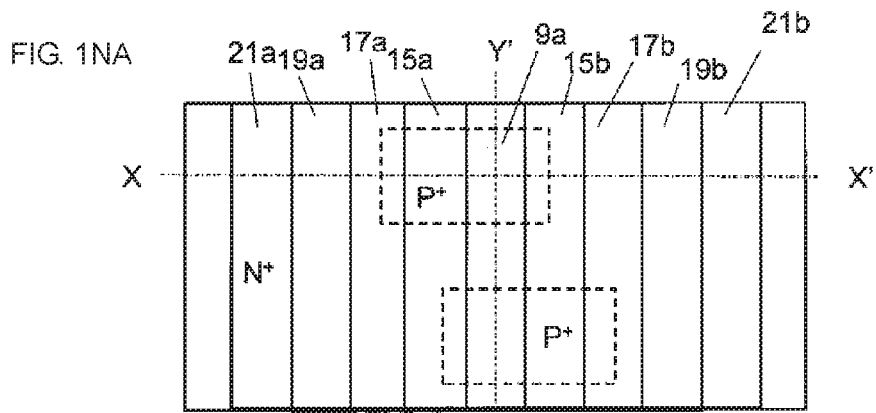
FIG. 1NA and FIGS. 1NB and 1NC are respectively a plan view and cross-sectional structural views for describing a pillar-shaped semiconductor device having SGTs according to the first embodiment.
Figure 1N:
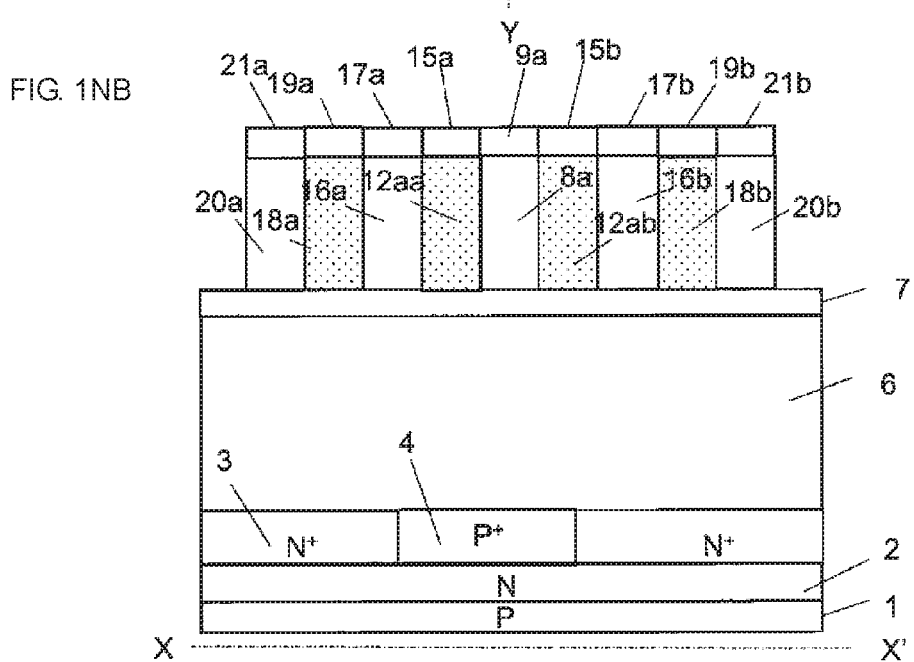
Figure 1N:
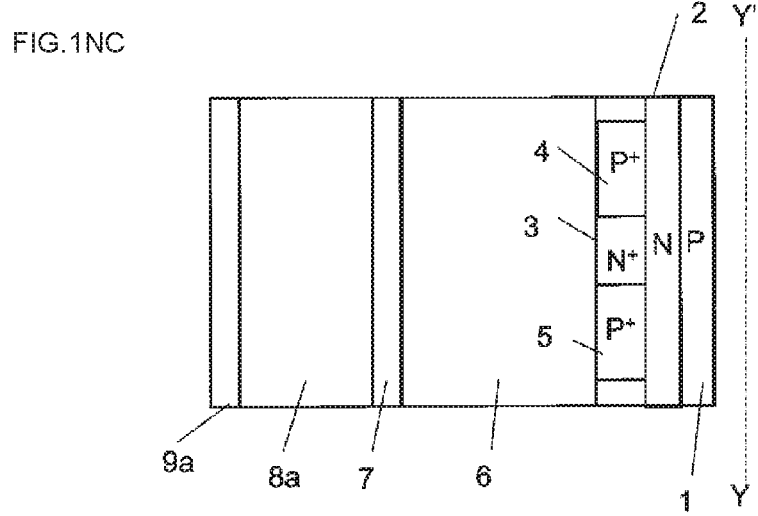

Next, a SiN layer (not shown) is formed by ALD method to cover the entire area. Then, a SiO₂ layer (not shown) is formed to cover the entire area. Then, the SiO₂ layer and the SiN layer are polished such that their upper surface positions come to the same position as the upper surface of the band-like mask material layer 9*a*. Then, by performing processes similar to those of FIGS. 1EA to 1IC, band-like mask material layers 20*a*, 20*b* in contact with each side surface of the band-like mask material layers 18*a*, 18*b*, and band-like mask material layers 21*a*, 21*b* in contact with each side surface of the band-like mask material layers 19*a*, 19*b* are formed, as shown in FIGS. 1NA to 1NC.

Next, the band-like mask material layers 15*a*, 15*b*, 19*a*, 19*b* and the band-like SiGe layers 12*aa*, 12*ab*, 18*a*, 18*b* are removed by etching. Thus, as shown in FIGS. 1OA to 1OC, band-like mask material layers 8*a*, 16*a*, 16*b*, 20*a*, 20*b* and the mask material layers 9*a*, 17*a*, 17*b*, 21*a*, 21*b* on the band-like mask material layers 8*a*, 16*a*, 16*b*, 20*a*, 20*b* are formed on the mask material layer 7.

Figure 1P:
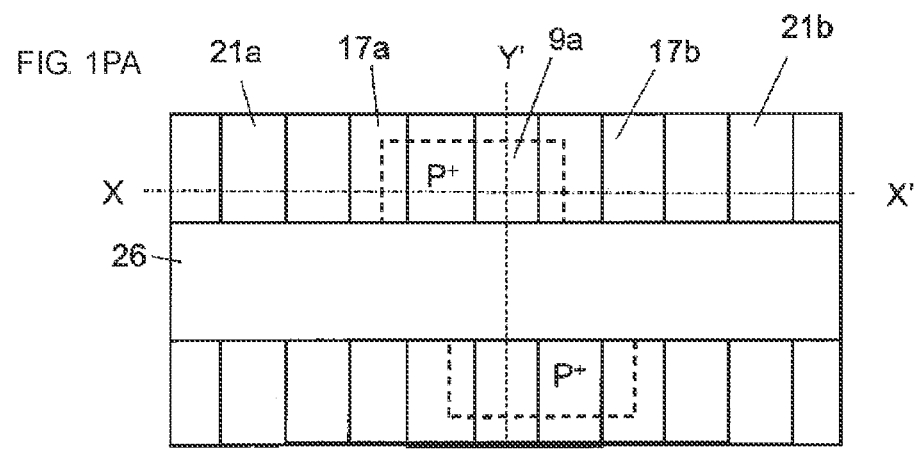
FIG. 1PA and FIGS. 1PB and 1PC are respectively a plan view and cross-sectional structural views for describing a pillar-shaped semiconductor device having SGTs according to the first embodiment.
Figure 1P:
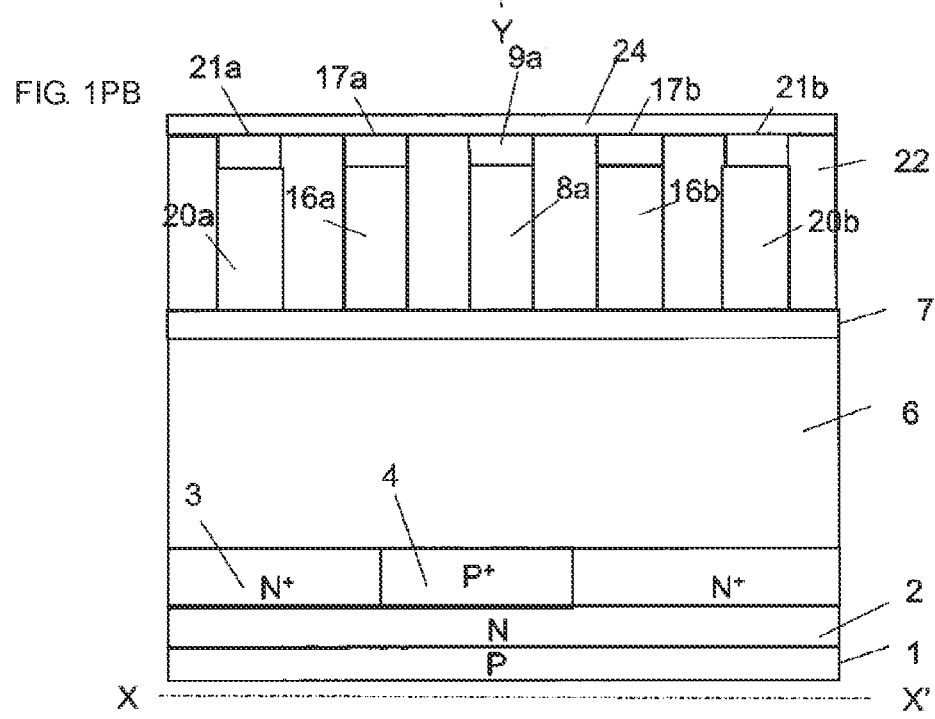
Figure 1P:
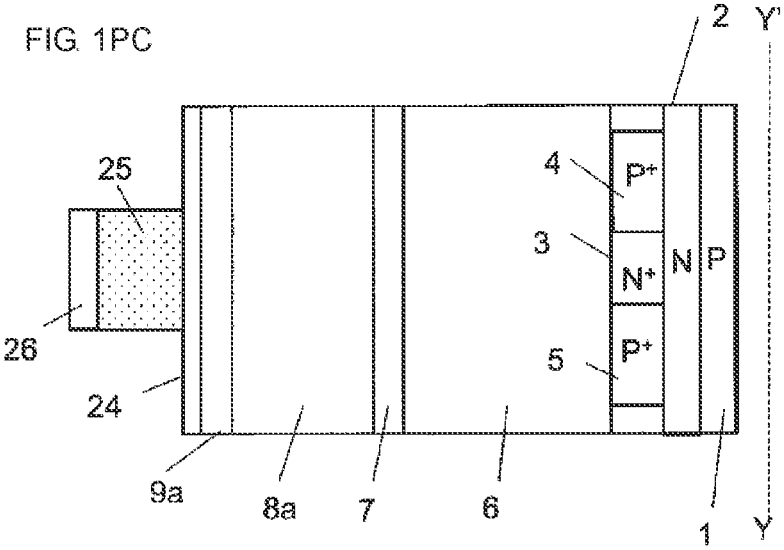

Next, the entire area is covered with a SiO₂ layer (not shown). Then, as shown in FIGS. 1PA to 1PC, the SiO₂ layer is polished by CMP method such that its upper surface position comes to the upper surface position of the band-like mask material layer 9*a* to form a SiO₂ layer 22. Then, a SiN layer 24 and a SiGe layer (not shown) are entirely formed. Then, a band-like mask material layer 26 (eighth band-like material layer) of SiN layer extended in X direction is formed. Then, the SiGe layer is etched by lithography and RIE method with the formed band-like mask material layer 26 as a mask to form a band-like SiGe layer 25 (ninth band-like material layer) extended in X direction.

Figure 1Q:
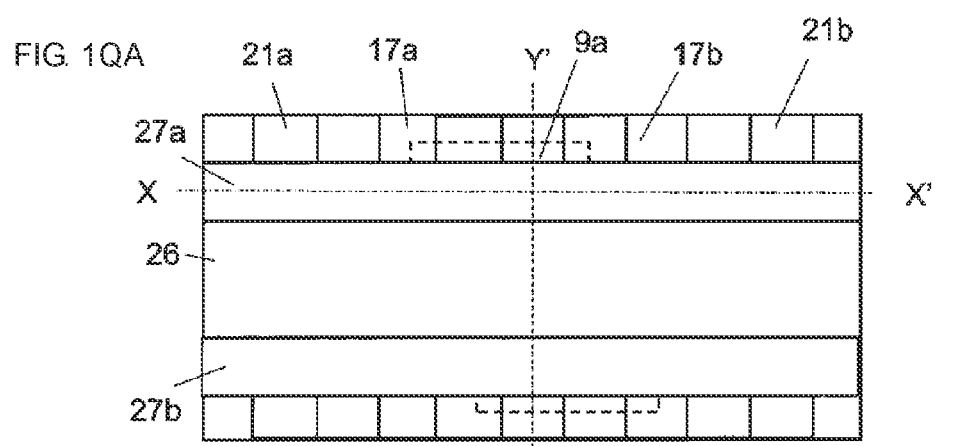
FIG. 1QA and FIGS. 1QB and 1QC are respectively a plan view and cross-sectional structural views for describing a pillar-shaped semiconductor device having SGTs according to the first embodiment.
Figure 1Q:
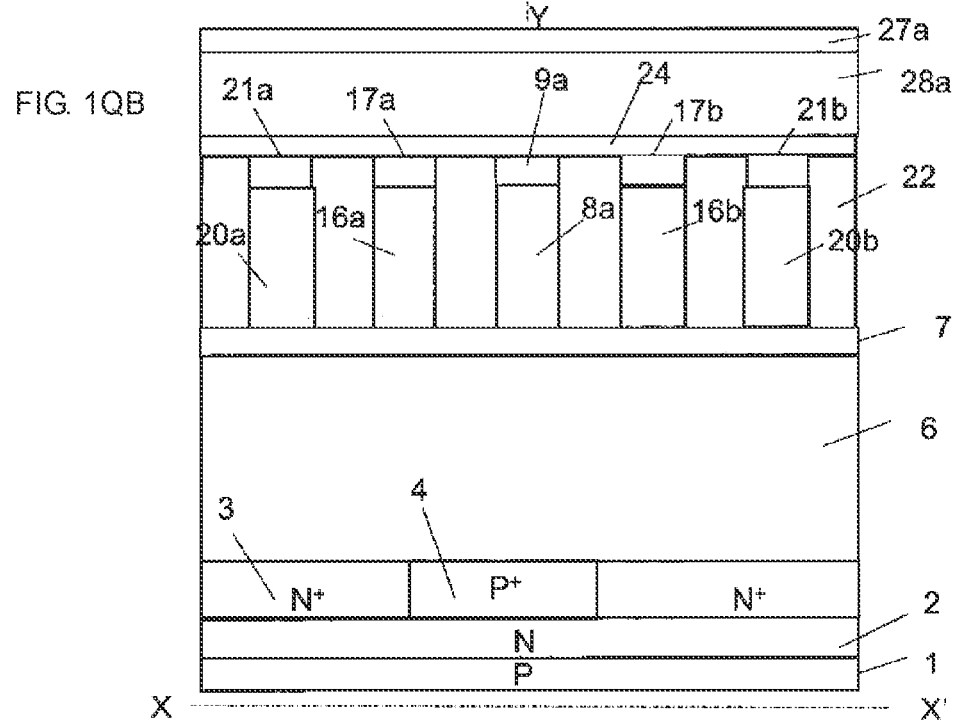
Figure 1Q:
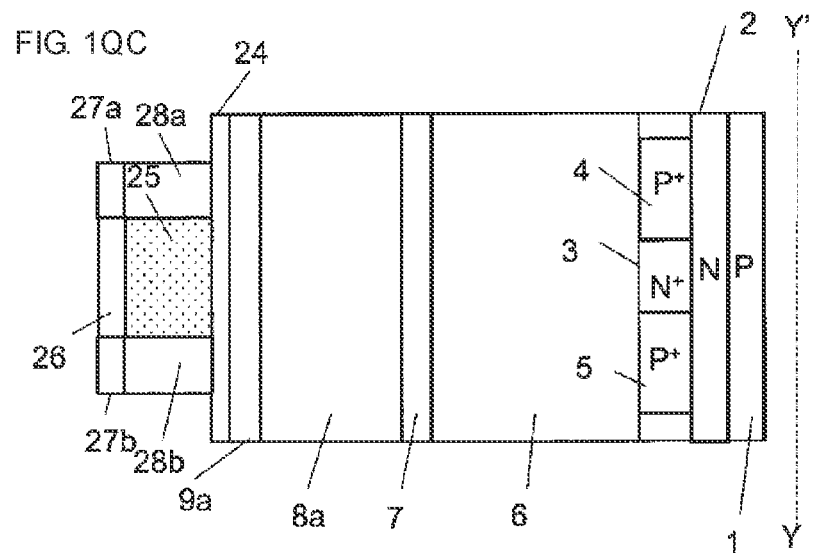

Next, by performing processes similar to those of FIGS. 1CA to 1IC (processes similar to FIGS. 1CA to 1IC are performed as processes for forming sixth material layer, seventh material layer, third recess, tenth band-like material layer, and eleventh band-like material layer), band-like mask material layers 28*a*, 28*b* (seventh band-like material layer) of SiN layer in contact with each side surface of the band-like SiGe layer 25 and band-like mask material layers 27*a*, 27*b* (seventh band-like material layer) consisting of SiO₂ layer, AlO layer, SiO₂ layer in contact with each side surface of the band-like mask material layer 26 are formed, as shown in FIGS. 1QA to 1QC.

Figure 1R:
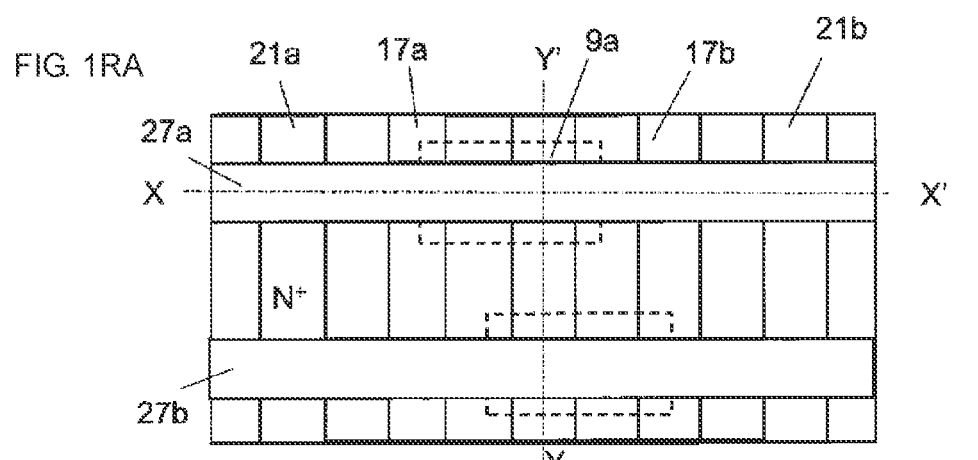
FIG. 1RA and FIGS. 1RB and 1RC are respectively a plan view and cross-sectional structural views for describing a pillar-shaped semiconductor device having SGTs according to the first embodiment.
Figure 1R:
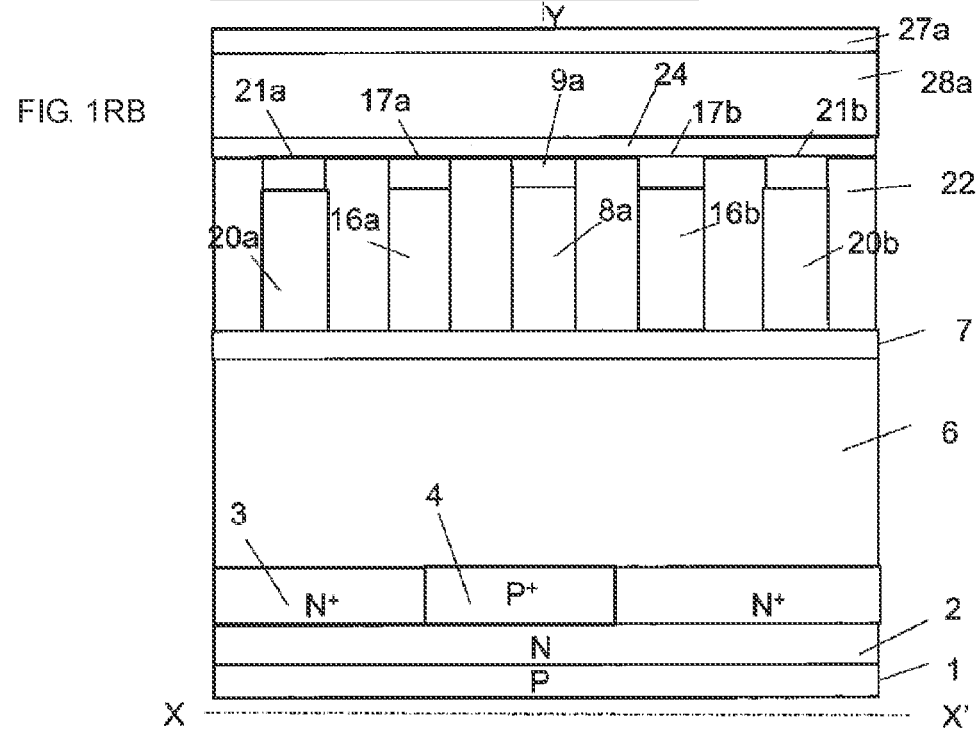
Figure 1R:
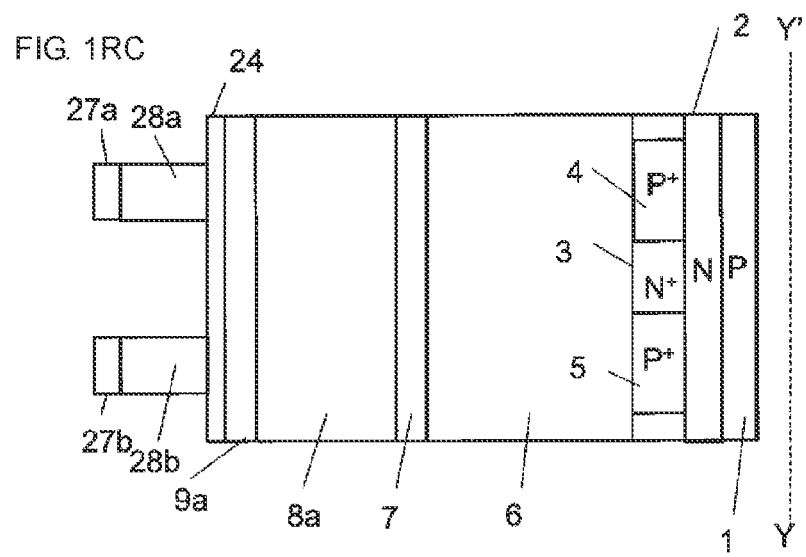

Next, as shown in FIGS. 1RA to 1RC, the band-like mask material layer 26 and the band-like SiGe layer 25 are removed to form band-like mask material layers 28*a*, 28*b* and band-like mask material layers 27*a*, 27*b* on the band-like mask material layers 28*a*, 28*b*, extended in X direction in planar view, on the SiN layer 24.

Next, as shown in FIGS. 1SA to 1SC, the SiN layer 24, the band-like mask material layers 9*a*, 17*a*, 17*b*, 21*a*, 21*b*, 8*a*, 16*a*, 16*b*, 20*a*, 20*b*, and the SiO₂ layer 22 are etched with the band-like mask material layers 27*a*, 27*b*, 28*a*, 28*b* as a mask. Thus, a band-like SiN layer 24*a*, and in planar view, square-shaped mask material layers 21*aa*, 21*ab*, 17*aa*, 17*ab*, 9*aa*, and square-shaped mask material layer 20*aa*, 20*ab*, 16*aa*, 16*ab*, 8*aa* located under the square-shaped mask material layers 21*aa*, 21*ab*, 17*aa*, 17*ab*, 9*aa* are formed under the band-like mask material layers 27*a*, 28*a*. Similarly, a band-like SiN layer 24*b*, and in planar view, square-shaped mask material layers 21*ba*, 21*bb*, 17*ba*, 17*bb*, 9*ab*, and square-shaped mask material layer 20*ba* (not shown), 20*bb* (not shown), 16*ba* (not shown), 16*bb* (not shown), 8*ab* located under the square-shaped mask material layers 21*ba*, 21*bb*, 17*ba*, 17*bb*, 9*ab* are formed under the band-like mask material layers 27*b*, 28*b*. Also, at the same time, a SiO₂ layer 22*a* is formed under the band-like SiN layer 24*a* and between the square-shaped mask material layers 21*aa*, 21*ab*, 17*aa*, 17*ab*, 9*aa*, 20*aa*, 20*ab*, 16*aa*, 16*ab*, 8*aa*. Similarly, a SiO₂ layer 22*b* (not shown) is formed under the band-like SiN layer 24*b* and between the square-shaped mask material layers 21*ba*, 21*bb*, 17*ba*, 17*bb*, 9*ab*, 20*ba*, 20*bb*, 16*ba*, 16*bb*, 8*ab*.

Figure 1T:
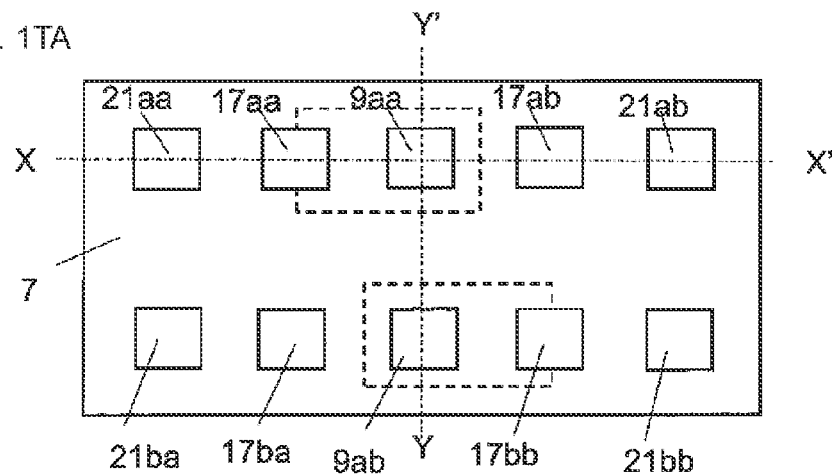
FIG. 1TA and FIGS. 1TB and 1TC are respectively a plan view and cross-sectional structural views for describing a pillar-shaped semiconductor device having SGTs according to the first embodiment.
Figure 1T:
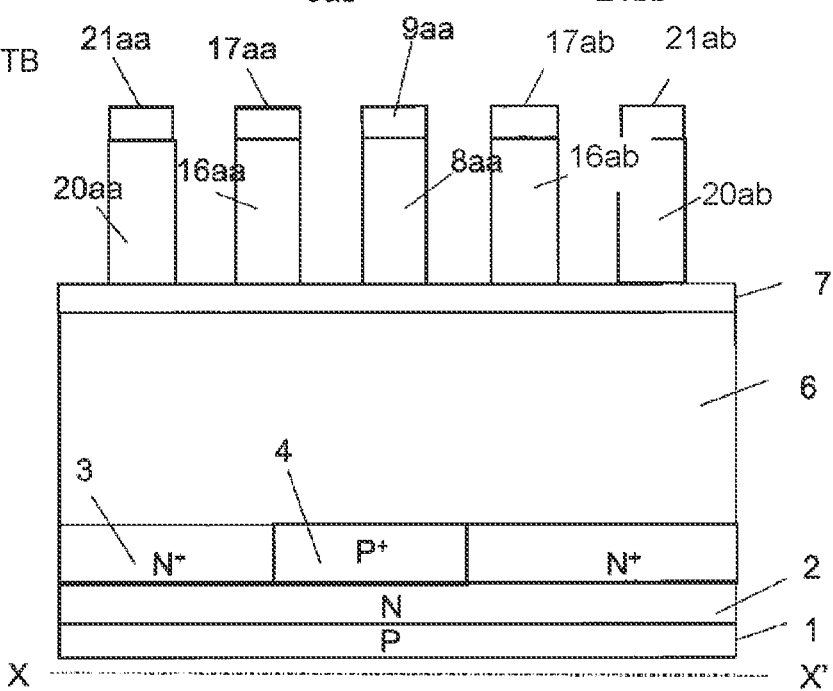
Figure 1T:
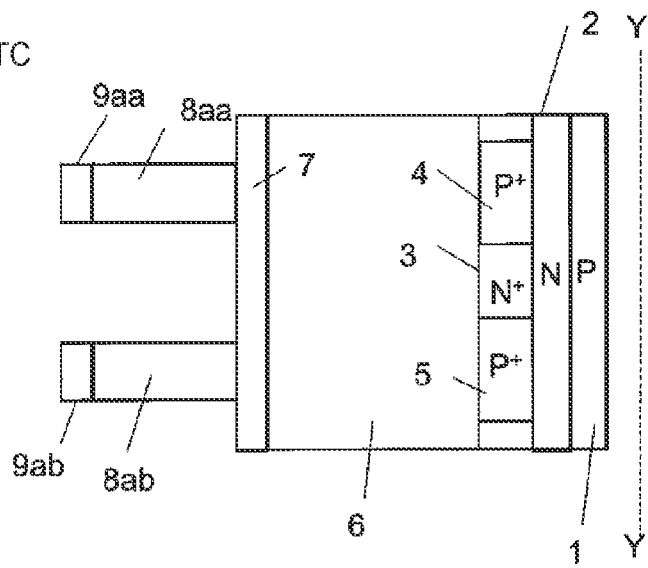

Next, as shown in FIGS. 1TA to 1TC, the band-like mask material layers 27*a*, 27*b*, 28*a*, 28*b*, the band-like SiN layers 24*a*, 24*b* and the SiO₂ layers 22*a*, 22*b* are removed. Thus, in planar view, square-shaped mask material layers 21*aa*, 21*ab*, 21*ba*, 21*bb*, 17*aa*, 17*ab*, 17*ba*, 17*bb*, 9*aa*, 9*ab* and square-shaped mask material layers 20*aa*, 20*ab*, 20*ba*, 20*bb*, 16*aa*, 16*ab*, 16*ba*, 16*bb*, 8*aa*, 8*ab* are formed on the mask material layer 7.

Figure 1U:
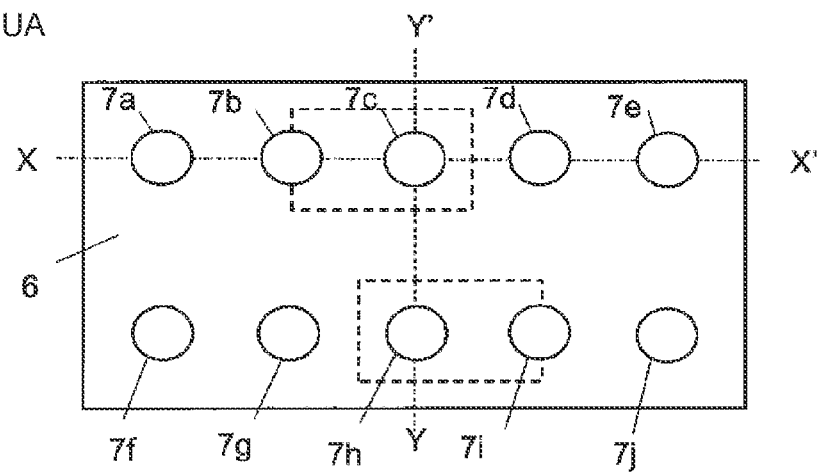
FIG. 1UA and FIGS. 1UB and 1UC are respectively a plan view and cross-sectional structural views for describing a pillar-shaped semiconductor device having SGTs according to the first embodiment.
Figure 1U:
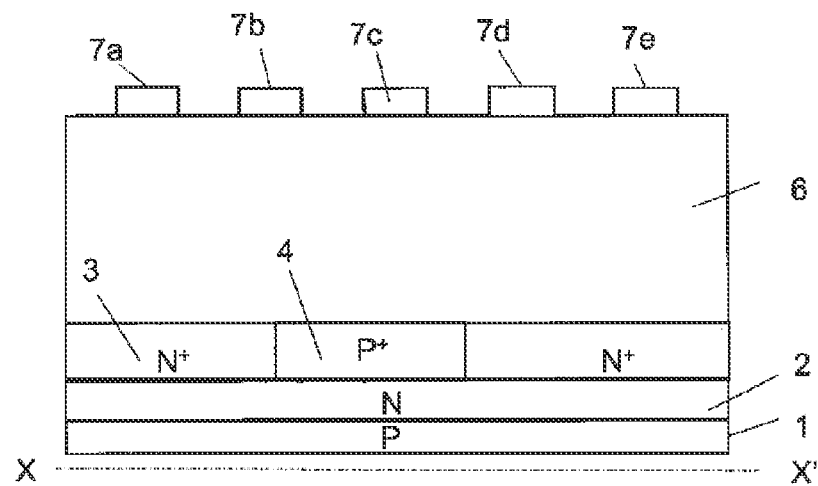
Figure 1U:
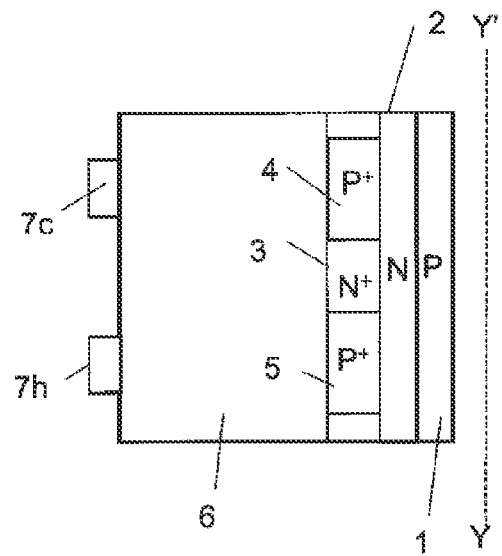

Next, the mask material layer 7 is etched by RIE method with the mask material layers 21*aa*, 21*ab*, 21*ba*, 21*bb*, 17*ab*, 17*ba*, 17*bb*, 9*aa*, 9*ab* and the mask material layers 20*aa*, 20*ab*, 20*ba*, 20*bb*, 16*aa*, 16*ab*, 16*ba*, 16*bb*, 8*aa*, 8*ab* as a mask. Then, the mask material layers 21*aa*, 21*ab*, 21*ba*, 21*bb*, 17*aa*, 17*ab*, 17*ba*, 17*bb*, 9*aa*, 9*ab* and the material layers 20*aa*, 20*ab*, 20*ba*, 20*bb*, 16*aa*, 16*ab*, 16*bb*, 16*ab*, 8*aa*, 8*ab* are removed. Thus, as shown in FIGS. 1UA to 1UC, mask material layers 7*a*, 7*b*, 7*c*, 7*d*, 7*e*, 7*f*, 7*g*, 7*h*, 7*i*, 7*j* (first mask material layer) are formed on the i layer 6. For example, before the RIE etching of the mask material layer 7, either or both of the square-shaped mask material layers 21*aa*, 21*ab*, 21*ba*, 21*bb*, 17*aa*, 17*ab*, 17*ba*, 17*bb*, 9*aa*, 9*ab* and the square-shaped mask material layers 20*aa*, 20*ab*, 20*ba*, 20*bb*, 16*aa*, 16*ab*, 16*ba*, 16*bb*, 8*aa*, 8*ab* are slightly etched isotropically. This makes mask material layers 7*a* to 7*j* circular shape in planar view.

Figure 1V:
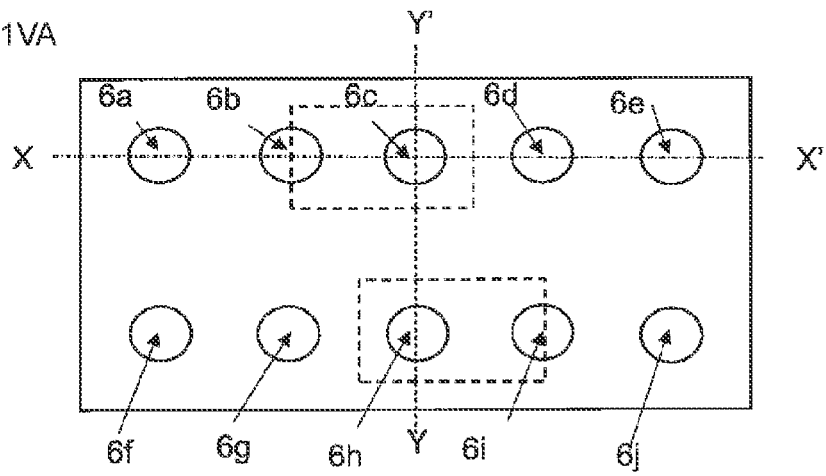
FIG. 1VA and FIGS. 1VB and 1VC are respectively a plan view and cross-sectional structural views for describing a pillar-shaped semiconductor device having SGTs according to the first embodiment.
Figure 1V:
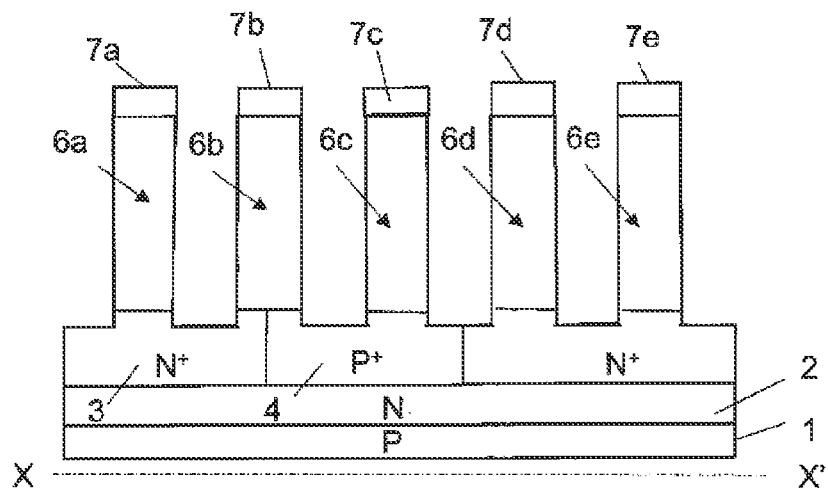
Figure 1V:
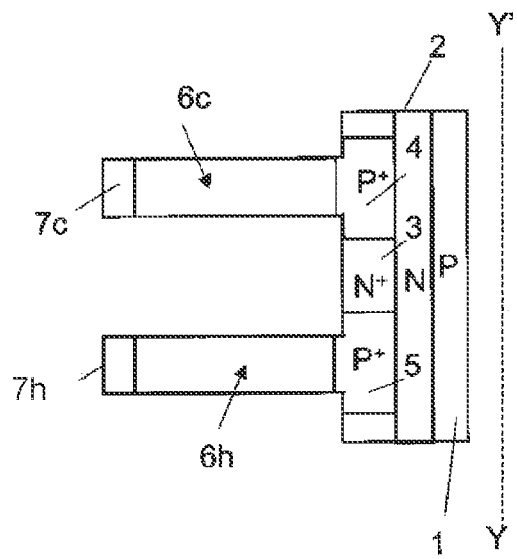

Next, as shown in FIGS. 1VA to 1VC, the i layer 6 is etched with the mask material layers 7*a* to 7*j* as a mask to form Si pillars 6*a*, 6*b*, 6*c*, 6*d*, 6*e*, 6*f*, 6*g*, 6*h*, 6*i*, 6*j* (three-dimensionally-shaped semiconductor layer) on the N⁺ layer 3 and the P⁺ layer 4.

Figure 1W:
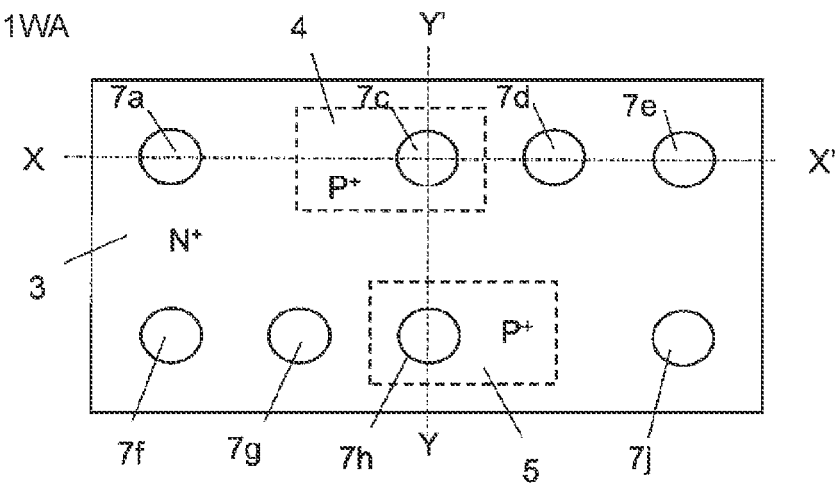
FIG. 1WA and FIGS. 1WB and 1WC are respectively a plan view and cross-sectional structural views for describing a pillar-shaped semiconductor device having SGTs according to the first embodiment.
Figure 1W:
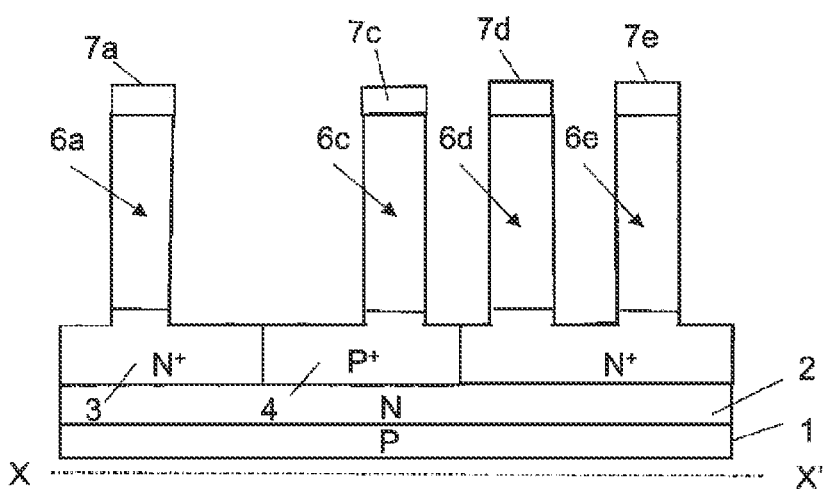
Figure 1W:
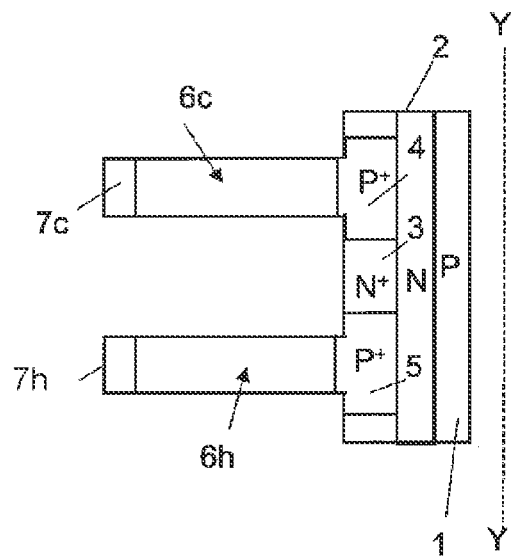

Next, a SiO₂ layer (not shown) is deposited by FCVD method, and then polished by CMP method such that its surface position comes to the top position of the mask material layers 7*a* to 7*j*. Then, the mask material layers 7*b*, 7*i* and the Si pillars 6*b*, 6*i* are removed by lithography and RIE etching method. Then, the SiO₂ layer formed by the FCVD method is removed. Thus, as shown in FIGS. 1WA to 1WC, the Si pillars 6*a*, 6*c*, 6*d*, 6*e*, 6*f*, 6*g*, 6*h*, 6*j* are formed on the N⁺ layer 3 and the P⁺ layers 4, 5.

Figure 1X:
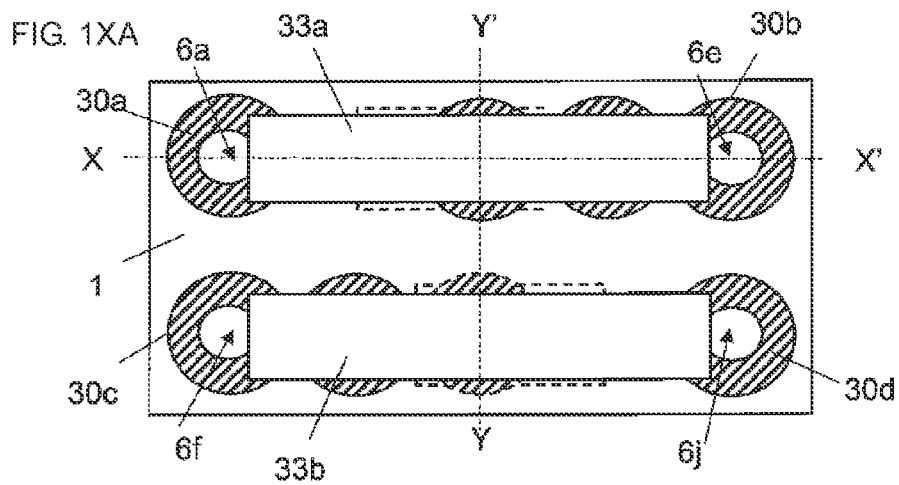
FIG. 1XA and FIGS. 1XB and 1XC are respectively a plan view and cross-sectional structural views for describing a pillar-shaped semiconductor device having SGTs according to the first embodiment.
Figure 1X:
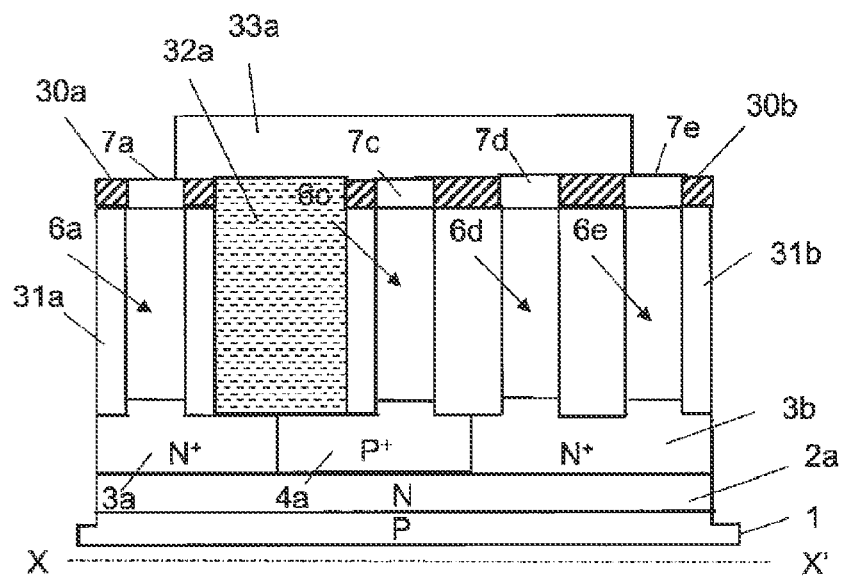
Figure 1X:
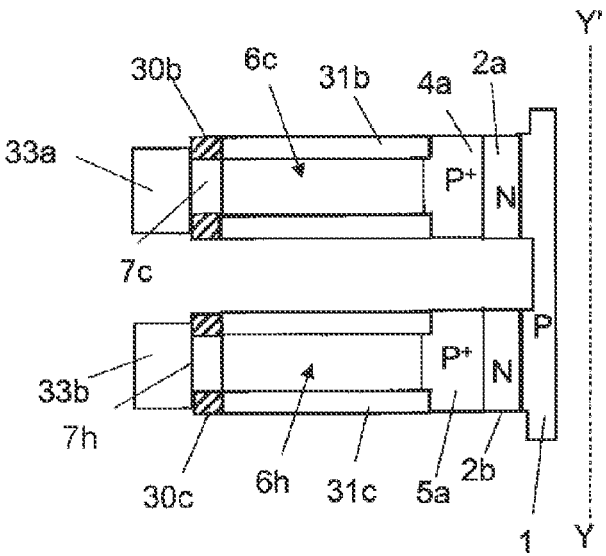

Next, as shown FIGS. 1XA to 1XC, mask material layers 30*a*, 30*b*, 30*c*, 30*d* surrounding side surfaces of the mask material layers 7*a* to 7*j* (the mask material layers 7*b*, 7*i* are absent) and mask material layers 31*a*, 31*b*, 31*c*, 31*d* (not shown) surrounding side surfaces of the Si pillars 6*a* to 6*j* (the Si pillars 6*b*, 6*i* are absent) are formed. Then, a SiO₂ layer (not shown) is deposited over the entire area by FCVD method, and then polished by CMP method such that its surface position comes to the top position of the mask material layers 7*a* to 7*j* (mask material layers 7*b*, 7*i* are absent). Then, on the smoothed face, in planar view, a band-like mask material layer 33*a* of, for example, SiO₂ layer, linked to the Si pillars 6*a*, 6*c*, 6*d*, 6*e*, and a band-like mask material layer 33*b* of, for example, SiO₂ layer, linked to the Si pillars 6*f*, 6*g*, 6*h*, 6*j* are formed. Then, the SiO₂ layer, the N⁺ layer 3, the P⁺ layers 4, 5, the N layer 2, and the P layer 1 are etched by RIE with the mask material layers 30*a*, 30*b*, 30*c*, 30*d*, 7*a* to 7*j*, 33*a*, and 33*b* as a mask. Thus, N layer 2*a*, N⁺ layers 3*a*, 3*b* and a P⁺ layer 4*a* are formed under the Si pillars 6*a*, 6*c*, 6*d*, 6*e* and on the P layer 1. Similarly, an N layer 2*b*, N⁺ layers 3*c* (not shown), 3*d* (not shown) and a P⁺ layer 5*a* are formed under the Si pillars 6*f*, 6*g*, 6*h*, 6*j* and on the P layer 1. Then, a SiO₂ layer 32*a* is formed under the mask material layer 33*a* and between the Si pillars 6*a* and 6*c*. Similarly, a SiO₂ layer 32*b* (not shown) is formed under the mask material layer 33*b* and between the Si pillars 6*h* and 6*j*.

Figure 1Y:
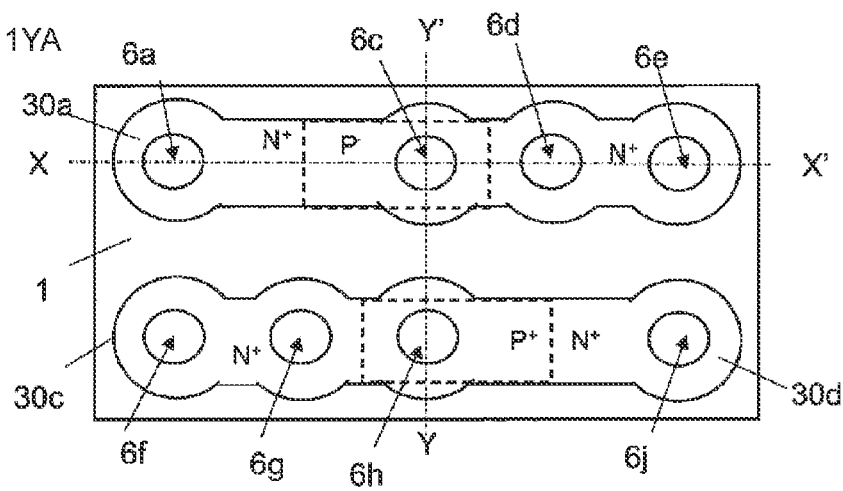
FIG. 1YA and FIGS. 1YB and 1YC are respectively a plan view and cross-sectional structural views for describing a pillar-shaped semiconductor device having SGTs according to the first embodiment.
Figure 1Y:
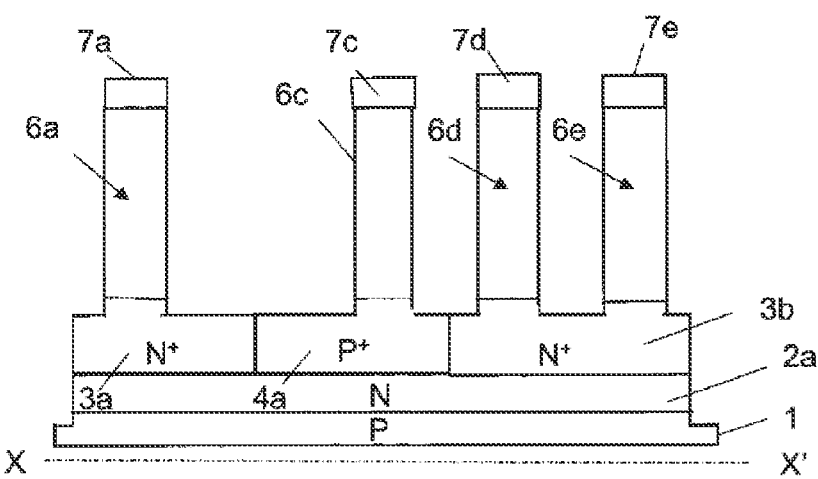
Figure 1Y:
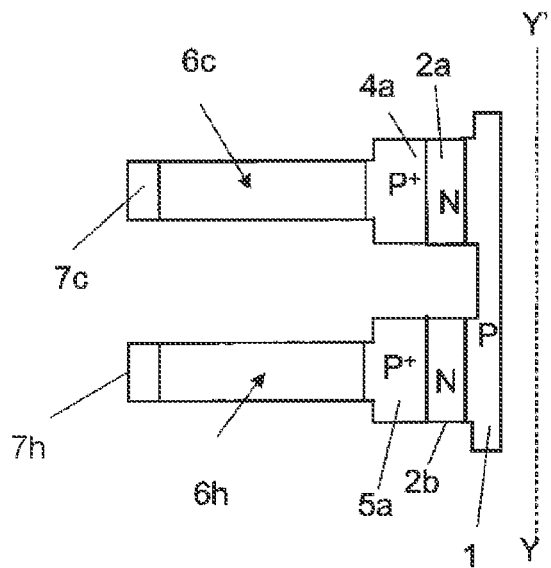

Next, as shown in FIGS. 1YA to 1YC, the mask material layers 33*a*, 33*b*, the SiO₂ layers 32*a*, 32*b*, and the mask material layers 30*a*, 30*b*, 30*c*, 30*d*, 31*a*, 31*b*, 31*c*, 31*d* are removed.

Next, as shown in FIGS. 1ZA to 1ZC, a SiO₂ layer 34 is formed on the periphery of the N⁺ layers 3*a*, 3*b*, 3*c*, 3*d*, the P⁺ layer 4*a*, 5*a*, and the N layer 2*a*, 2*b* and on the P layer substrate 1. Then, a HfO₂ layer (not shown), a TiN layer (not shown), and a SiO₂ layer (not shown) are formed over the entire area by ALD method. In this case, the TiN layers between the Si pillars 6*c*, 6*d*, and 6*e* are desirably in contact with each other at their side surfaces. Similarly, the TiN layers between the Si Pillars 6f, 6g, and 6h are desirably in contact with each other at their side surfaces. Then, the HfO₂ layer, the TiN layer and the SiO₂ layer are polished by CMP method such that their upper surface positions come to the upper surface position of the mask material layers 7a to 7j. Then, the SiO₂ layer is etch-backed by RIE method. Then, the TiN layer and the HfO₂ layer are etched with the SiO₂ layer as a mask such that their upper surface positions come to the upper positions of the Si pillars 6a to 6j. Then, a SiN layer (not shown) is formed over the entire area by CVD method. Then, the SiN layer is polished by CMP method such that its upper surface position comes to the upper surface position of the mask material layers 7a to 7j. Thus, SiN layers 37a, 37b, 37c, 37d (not shown) having equal width in planar view are formed on the periphery of the top of the Si pillars 6a to 6j.

Then, mask material layers 38a, 38b, 38c, 38d respectively contacting the Si pillars 6a, 6d, 6g, 6j in planar view are formed on the mask material layers 7a to 7j. Then, the SiO₂ layer and the TiN layer on the periphery of the mask material layers 37a, 37b, 37c, 37d in planar view are etched with the mask material layers 7a to 7j, 37a, 37b, 37c, 37d, 38a, 38b, 38c, 38d as a mask. Thus, a TiN layer 40a linked to the periphery of the Si pillar 6a, a TiN layer 40b linked to the periphery of the Si pillars 6c, 6d, 6e, a TiN layer 40c linked to the periphery of the Si pillars 6f, 6g, 6h, and a TiN layer 40d (not shown) linked to the periphery of the Si pillar 6j are formed. Then, the mask material layers 38a to 38d, 37a to 37d, and 7a to 7j are removed.

Next, as shown in FIGS. 1XXA to 1XXC, the entire area is covered with a SiO₂ layer (not shown) and then the SiO₂ layer is polished by CMP method such that its upper surface position comes to the upper surface position of the top of the Si pillars 6a to 6j. Then, an upper portion of the SiO₂ layer is etched by RIE method until its upper surface position comes to the top position of the TiN layers 40a to 40d. Then, a SiN layer 42 is formed on the periphery of the top of the Si pillars 6a to 6j.

Then, after the top of the Si pillar 6c, 6h is covered with a SiO₂ layer (not shown), an N⁺ layer 43a containing donor impurities is formed around the top of the Si pillar 6a by selective epitaxial crystal growth method. At the same time, an N⁺ layer 43c covering the top of the Si pillar 6d, an N⁺ layer 43d (not shown) covering the top of the Si pillar 6e, an N⁺ layer 43e (not shown) covering the top of the Si pillar 6f, an N⁺ layer 43f (not shown) covering the top of the Si pillar 6g, and an N⁺ layer 43h (not shown) covering the top of the Si pillar 6j are formed. Then, the SiO₂ layer covering the top of the Si pillars 6c, 6h is removed. Then, a SiO₂ layer (not shown) is formed over the Si pillars 6a, 6d, 6e, 6f, 6g, 6j. Then, P⁺ layers 43b, 43g containing acceptor impurities are formed around the top of the Si pillars 6c, 6h by selective epitaxial crystal growth method. Then, the donor impurities in the N⁺ layers 43a, 43c, 43d, 43e, 43f, 43h are diffused into the top of the Si pillars 6a, 6d, 6e, 6f, 6g, 6j by heat treatment to form N⁺ layers 44a, 44c, 44d, 44e (not shown), 44f (not shown), 44h (not shown). At the same time, the acceptor impurities are diffused from the P⁺ layers 43b, 43g to form P⁺ layers 44b, 44g.

Next, as shown in FIGS. 1YYA to 1YYC, a SiO₂ layer 46 having a flat upper surface is formed over the entire area. Then, a connection line metal layer C1 is formed via a contact hole 47a formed on the interface between the N⁺ layer 3a and the P⁺ layer 4a and on the TiN layer 40b. At the same time, a connection line metal layer C2 (not shown) is formed via a contact hole 47b formed on the interface between the N⁺ layer 3d and the P⁺ layer 5a and on the TiN layer 40b. A SiO₂ layer 48 having a flat upper surface is formed over the entire area. Then, a word line metal layer WL is formed via contact holes 49a, 49b formed on the TiN layer 40a, 40d. A SiO₂ layer 50 having a flat upper surface is formed over the entire area. Then, a ground line metal layer Vss1 is formed via contact holes 51a, 51b formed on the N⁺ layers 43c, 43d. At the same time, a ground line metal layer Vss2 is formed via contact holes 51c, 51d formed on the N⁺ layers 43e, 43f. Then, a SiO₂ layer 52 having a flat upper surface is formed over the entire area. Then, a supply line metal layer Vdd is formed via contact holes 53a, 53b formed on the P⁺ layers 43b, 43g. Then, a SiO₂ layer 54 having a flat upper surface is formed over the entire area. Then, a bit output line metal layer BL and a reverse bit output line metal layer RBL are formed via contact holes 55a, 55b formed on the N⁺ layer 43a, 43h. Thus, a SRAM cell circuit is formed on the P layer substrate 1.

According to the manufacturing method of the first embodiment, following features are provided.

1. In this embodiment, as shown in FIGS. 1VA to 1VC, ten Si pillars 6a to 6j are formed in one SRAM cell area. In these pillars, lithography is only used to form band-like SiN layer 8a for forming Si pillars (6c, 6h) in a row in X direction. Other eight Si pillars (6a to 6j excluding 6c, 6h) are formed by band-like SiGe layers 12aa, 12ab, 18a, 18b and band-like SiN layer 16a, 16b, 20a, 20b formed by ALD method. Band-like SiGe layers 12a, 12b are formed by ALD method, and on the band-like SiGe layers 12a, 12b, band-like mask material layers 15a, 15b, having a shape in which the shape of top part of the band-like SiGe layers 12a, 12b remains as it is, are formed. In ALD method, a material layer can be deposited in each monoatomic or monomolecular layer in controlled manner. Thus, a thickness of band-like SiGe layers 12a, 12b in planar view can be thin with high precision, depending on design requirement. This makes it possible to narrow distances between Si pillars 7a to 7j with high precision without constraints of lithography. Thus, high integration of SRAM cell can be provided. Also, when distance between only the Si pillars 6c, 6h and the Si pillars 6b, 6d, 6g, 6i in X direction are to be formed with high precision and as being the narrowest, only the band-like SiGe layers 12aa, 12ab, and the band-like mask material layers 15a, 15b may be formed by the manufacturing method provided in the present invention.

2. Similarly, band-like SiN layers 16A, 16B are formed by ALD method, and on the band-like SiN layers 16A, 16B, band-like mask material layers 17a, 17b, having a shape in which the shape of top part of the band-like SiN layers 16A, 16B remains as it is, are formed. Thus, diameters of the Si pillars 7a to 7j in planar view can be reduced with high precision, without constraints of lithography. This makes it possible to design cells without limitation for high integration of cells due to lithography. Thus, high precision and high integration of SRAM cell can be provided.

3. As high integration of cell proceeds, it is required that both diameters of Si pillar 6a to 6j in planar view and distances between the Si pillars 6a to 6j are made to be high precision and high density. For this purpose, in this embodiment, as shown in FIGS. 1DA to 10C, both band-like SiGe layers 12aa, 12ab, 18a, 18b and band-like SiN layers 16a, 16b, 20a, 20b on each side of band-like SiN layer 8a can be formed with high precision and narrow, in a cross-section in X direction. High precision of the thickness of the band-like SiN layers 16a, 16b, 20a, 20b leads to high precision of the diameter of the Si pillar 6a to 6j. Then, high precision of the thickness of the band-like SiGe layers 12aa, 12ab, 18a, 18b leads to high precision of the distance between the Si pillars 6a to 6j. Thus, high precision and high integration of SRAM cell can be provided.

4. When SiGe layers 12a, 12b and SiN layers 16A, 16B are etched by RIE method, portions of band-like mask material layers 15a, 15b, 17a, 17b where etching ion is impacted are etched, although the etching rate is low. When the band-like mask material layers 15a, 15b, 17a, 17b have a trapezoidal shape having a bottom side longer than a top side, for example, a portion of the bottom side of the band-like mask material layers 15a, 15b, 17a, 17b is etched during etching. Thus, end positions of mask layer of the band-like mask material layers 15a, 15b, 17a, 17b are changed over etching time in planar view. This makes it difficult to form the band-like SiGe layers 12aa, 12ab and the band-like SiN layers 16a, 16b rectangular in cross-sectional view. On the other hand, in this embodiment, SiGe layers 12a, 12b and SiN layers 16A, 16B having a same thickness in vertical direction are formed on each side of the band-like SiN layer 8a and band-like mask material layer 9a. Then, band-like mask material layers 15a, 15b, 17a, 17b, having a shape in which the shape of top part of SiGe layers 12a, 12b and the SiN layers 16A, 16B remains as it is, are formed. Thus, band-like mask material layers 15a, 15b, 17a, 17b having a rectangular cross-section are formed. Furthermore, SiGe layers 12a, 12b and SiN layers 16A, 16B are etched with the band-like mask material layers 15a, 15b, 17a, 17b having a rectangular cross-section as a mask to form band-like SiGe layer 12aa, 12ab and band-like SiN layer 16a, 16b having a rectangular cross-section. Thus, high precision and high integration of SRAM cell can be provided.

5. For example, as shown in FIGS. 1EA to 1IC, in band-like mask material layers 15a, 15b which are an etching mask for band-like SiGe layers 12aa, 12ab, SiGe layer 12 is deposited over band-like SiN layer 8a and band-like mask material layer 9a by ALD method. Then, a SiO₂ layer (not shown) is deposited. Then, the SiO₂ layer and the SiGe layer 12 are polished by CMP method such that their upper surface positions come to the upper surface position of the band-like mask material layer 9a. Upper round parts R1 of SiGe layer 12 are removed by this polishing. By removing the upper round part R1, shapes of recesses 14a, 14b are formed so as to conform with shapes of side surfaces of the band-like mask material layer 9a and SiO₂ layer 13 on each side of SiGe layer 12a, 12b, and to conform with shapes of band-like SiGe layers 12a, 12b having equal width in vertical direction. Thus, cross-sectional shapes of the recesses 14a, 14b are formed substantially rectangular. Thus, overall cross-sectional shapes of band-like mask material layers 15a, 15b are made to be substantially rectangular with their width remaining equal in vertical direction. This indicate that band-like SiGe layers 12aa, 12ab, which are formed by etching SiGe layer 12a by RIE method with the band-like mask material layers 15a, 15b as a mask, can be formed with high precision both in planar view and cross-sectional view. Similarly, band-like SiN layer 16a, 16b, 20a, 20b and band-like SiGe layer 18a, 18b can be formed with high precision.

6. In this embodiment, as shown in FIGS. 1ZA to 1ZC, each of gate TiN layers 40b, 40c respectively linked to the periphery of Si pillars 7c, 7d, 7e and Si pillars 7f, 7g, 7h contacts at side surface between the Si pillars 7c, 7d and 7e, and between the Si pillars 7f, 7g and 7h. On the other hand, gate TiN layers 40a, 40d are formed independently at Si pillars 6a, 6j. The fact that each of the gate TiN layers 40b, 40c respectively linked to the periphery of Si pillars 7c, 7d, 7e and Si pillars 7f, 7g, 7h contacts at side surface between Si pillars 7c, 7d and 7e and between Si pillars 7f, 7g and 7h indicates that it is possible to reduce a distance between Si pillars 7c, 7d and 7e and between Si pillars 7f, 7g and 7h to such a length corresponding to twice of a sum of a thickness of a gate HfO₂ layer 35 and a thickness of gate TiN layers 40b, 40c. Then, as shown in FIGS. 1WA to 1WC, by removing Si pillars 7b, 7i, gate TiN layers 40a, 40d can be formed to be separated from the gate TiN layers 40b, 40c. This can be done, as shown in FIGS. 1WA to 1WC, by forming Si pillars 6a to 6j at high density in planar view, followed by removing Si pillars 7b, 7i to form areas having no Si pillar in planar view. Thus, contact holes 47a, 47b can be formed on the areas of the removed Si pillars 7b, 7i in planar view. Thus, SRAM cell can be provided at high density. This embodiment can be applied not only to the SRAM cell, but also to a circuit having a plurality of Si pillars in which gate conductor layers are connected with each other, and one or more Si pillars having gate conductor layers adjacent thereto and separated.

7. In this embodiment, as described in FIGS. 1PA to 1SC, band-like mask material layers 27a, 27b, 28a, 28b extended in X direction are formed to be orthogonal to band-like mask material layers 8a, 16a. 16b, 20a, 20b extended in Y direction by a method similar to the method for forming the band-like mask material layers 8a, 16a. 16b, 20a, 20b. This makes it possible to form Si pillars 6a to 6j with high precision and at high density both in X and Y directions. Also, in the description of the embodiment, the band-like mask material layers 28a, 28b are formed after forming the band-like mask material layers 8a, 16a, 16b, 20a, 20b. On the other hand, it may be also possible to form Si pillars 6a to 6j with high precision and at high density by a process in which the band-like mask material layers 8a, 16a, 16b, 20a, 20b are formed after forming the band-like mask material layers 28a, 28b. Further, in designing, when there is enough room in Y direction, the band-like mask material layers 27a, 27b, 28a, 28b may be directly formed by lithography and RIE etching method after entirely forming a mask material layer, without using this method. Also, when there is enough room in X direction, the band-like mask material layers 8a, 16a, 16b, 20a, 20b or the band-like mask material layers 9a, 17a, 17b, 21a, 21b may be directly formed by lithography and RIE etching method after entirely forming a mask material layer, without using this method.

Figure 10A:
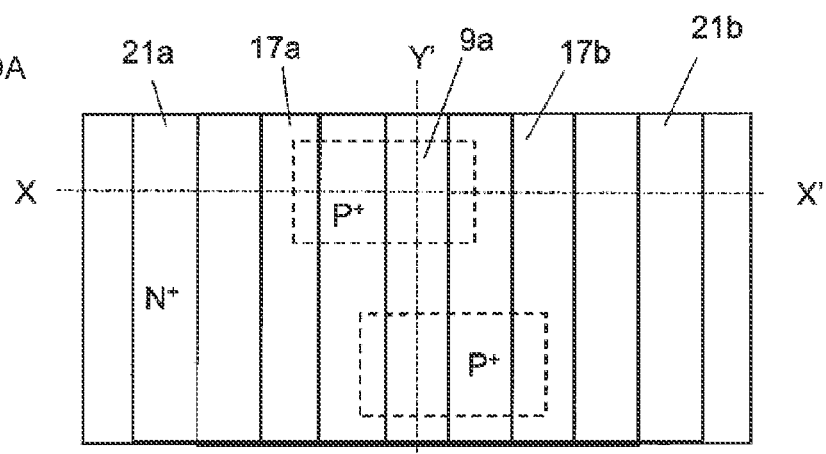
FIG. 10 is a schematic structural view showing a conventional SGT.
Figure 10B:
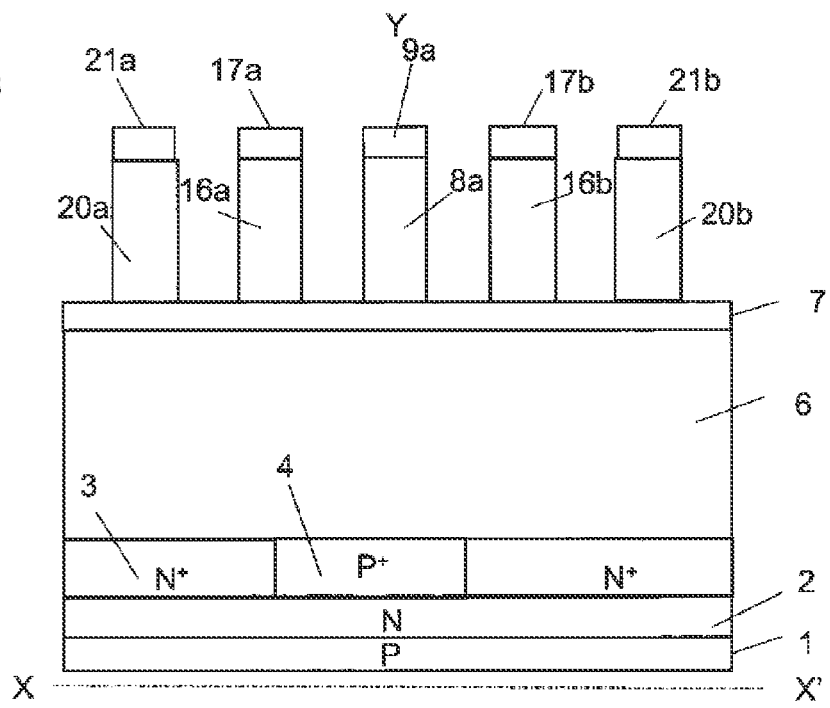
Figure 10C:
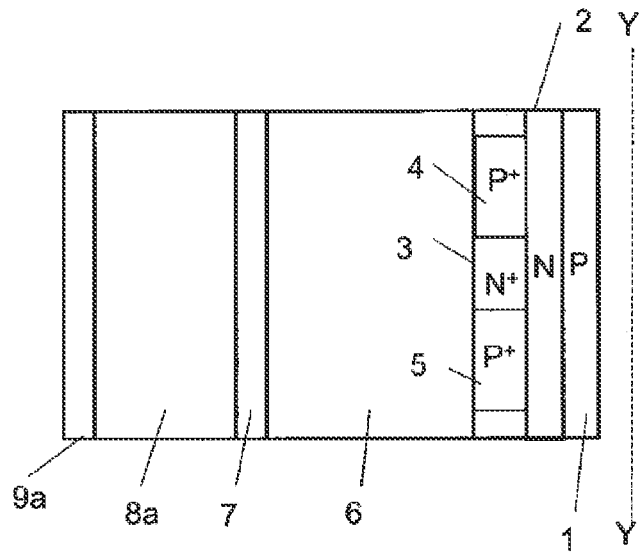

8. In this embodiment, as shown in FIGS. 10A to 10C, five band-like SiN layers 8a, 16a, 16b, 20a, 20b extended in Y direction in planar view are formed. On the other hand, by changing the material of the band-like SiN layer 8a from SiN to SiGe, and changing the material of the band-like SiGe material layer 12aa, 12ab to SiN, two band-like SiN layers extended parallel to Y direction in planar view can be formed. Si pillars can be thus formed at high density at positions of these two band-like SiN layers in planar view. This makes it possible to form three, four, five or more band-like SiN layers extended in Y direction in planar view depending on the material of the band-like material layer consisting of the band-like SiN layer 8a which is formed first and the band-like mask material layer 9a, the material of the band-like SiN layer and the band-like mask material layer formed parallelly on each side of this band-like material layer, in planar view, and times repeated for forming the band-like SiN layer or the band-like SiGe layer. Si pillars at high density can be thus formed at positions of these band-like SiN layers in a plane.

Second Embodiment

Figure 2A:
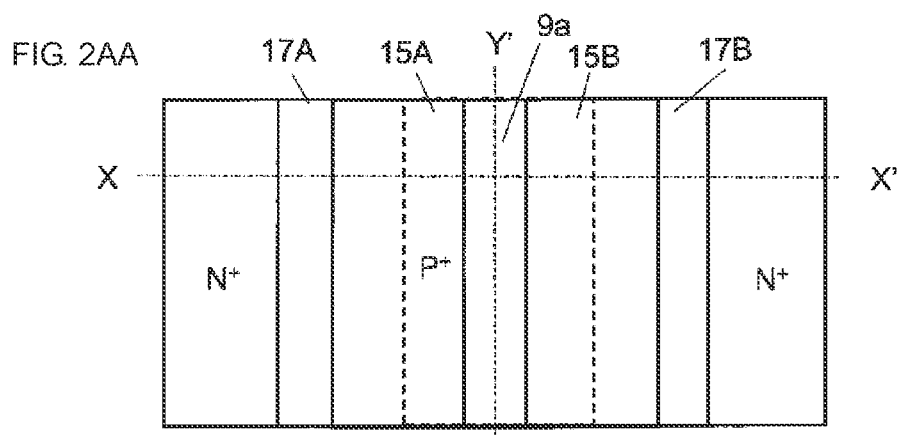
FIG. 2AA and FIGS. 2AB and 2AC are respectively a plan view and cross-sectional structural views for describing a pillar-shaped semiconductor device having SGTs according to the second embodiment.
Figure 2A:
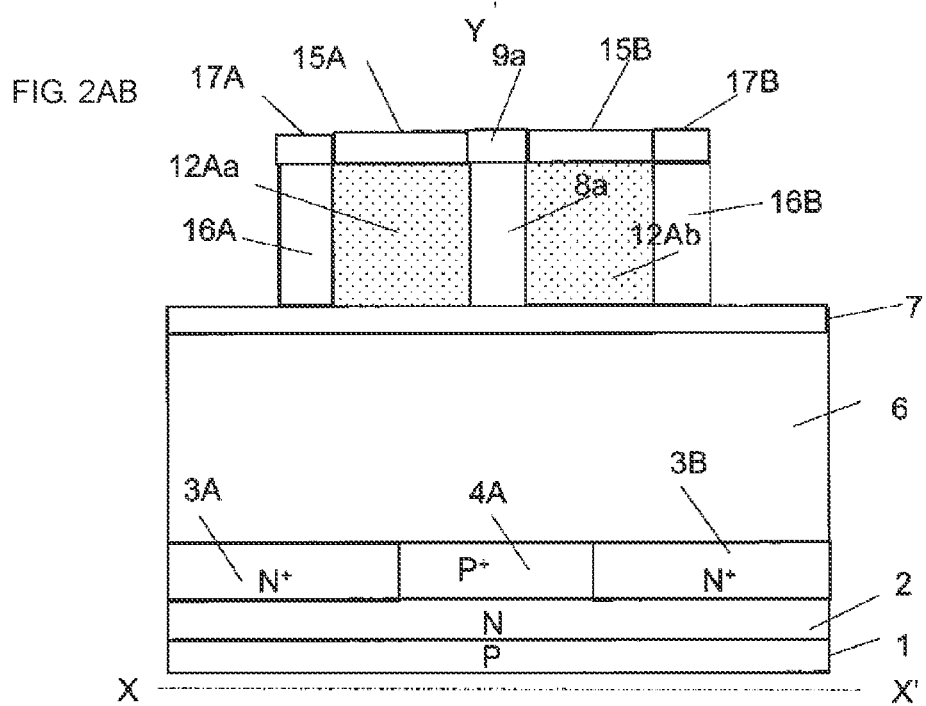
Figure 2A:
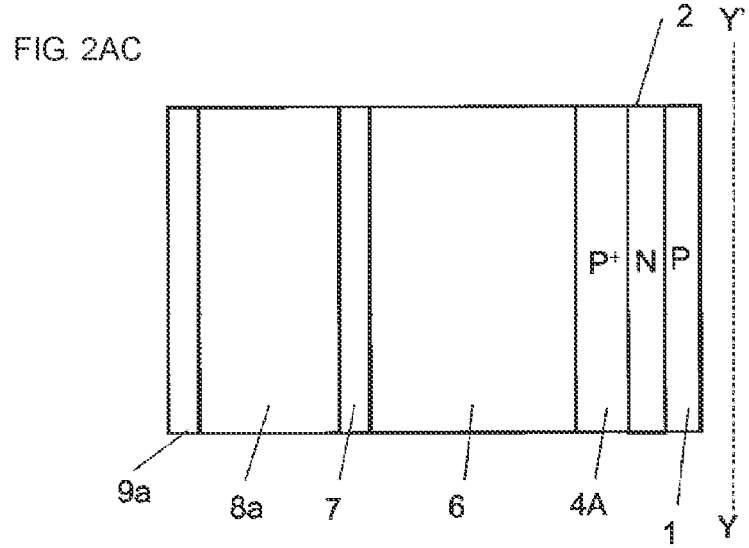

Hereinafter, a method for manufacturing a pillar-shaped semiconductor device having SGTs according to the second embodiment of the present invention is described with reference to FIGS. 2AA to 2DC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

Processes similar to those shown in FIGS. 1AA to 1LC are performed. In these processes, the arrangement of $N^+$ layer 3 and $P^+$ layer 4 in FIGS. 1AA to 1AC is different in planar view, and as shown in FIGS. 2AA to 2AC, band-like $N^+$ layers 3A, 3B are formed at each side of a $P^+$ layer 4A. Then, SiGe layers 12Aa, 12Ab wider than the band-like SiGe layers 12aa, 12ab are formed at each side of the band-like SiN layer 8a having a band-like mask material layer 9a on its top, in planar view. Also, band-like mask material layers 15A, 15B are respectively formed on top of the SiGe layers 12Aa, 12Ab. Then, band-like SiN layers 16A, 16B having width the same as that of the band-like SiN layer 8a, respectively having band-like mask material layers 17A, 17B on its top, are formed at each side of the band-like SiGe layers 12Aa, 12Ab.

Figure 2B:
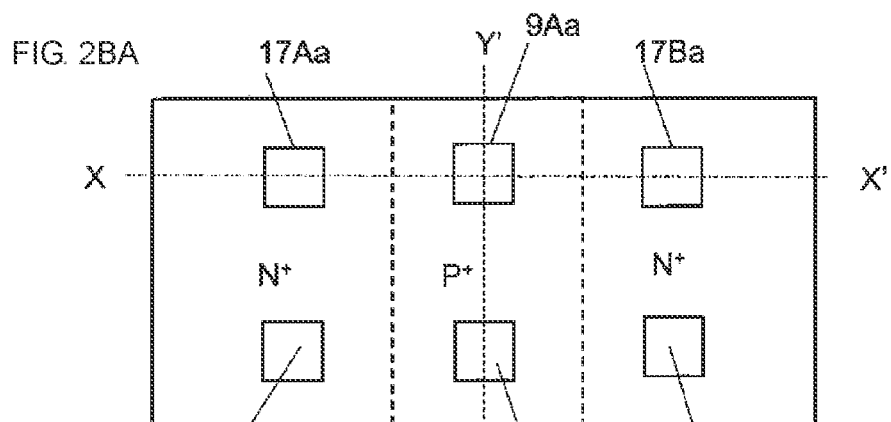
FIG. 2BA and FIGS. 2BB and 2BC are respectively a plan view and cross-sectional structural views for describing a pillar-shaped semiconductor device having SGTs according to the second embodiment.
Figure 2B:
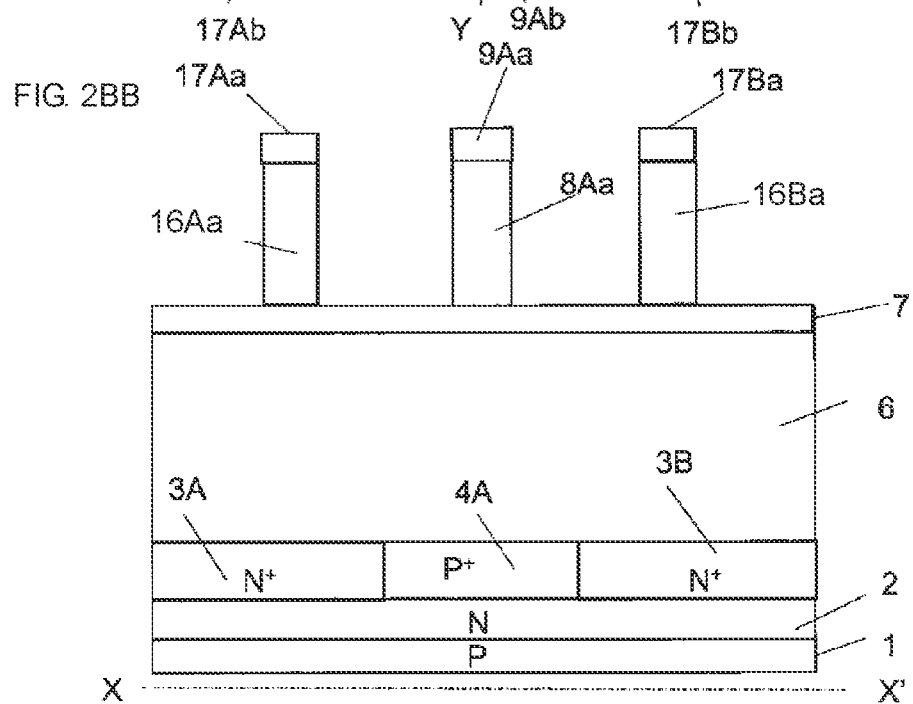
Figure 2B:
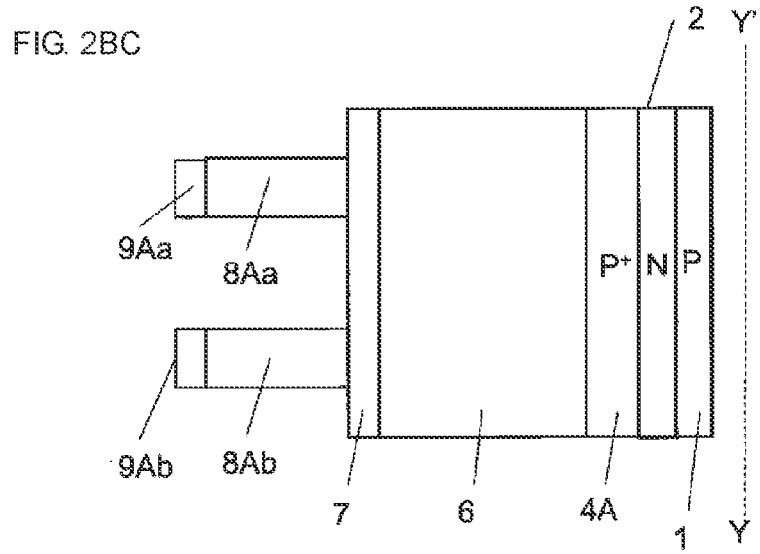

Then, processes the same as FIGS. 1NA to 1TC are performed. As shown in FIGS. 2BA to 2BC, square-shaped SiN layers 8Aa, 8Ab, 16Aa, 16Ab (not shown), 16Ba, 16Bb (not shown) respectively having square-shaped mask material layers 9Aa, 9Ab, 17Aa, 17Ab, 17Ba, 17Bb on its top in planar view are thereby formed on a mask material layer 7.

Figure 2C:
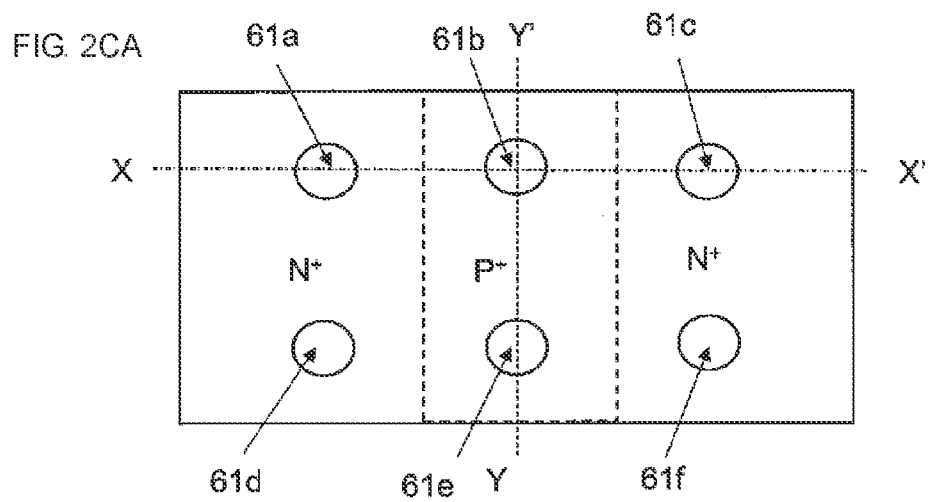
FIG. 2CA and FIGS. 2CB and 2CC are respectively a plan view and cross-sectional structural views for describing a pillar-shaped semiconductor device having SGTs according to the second embodiment.
Figure 2C:
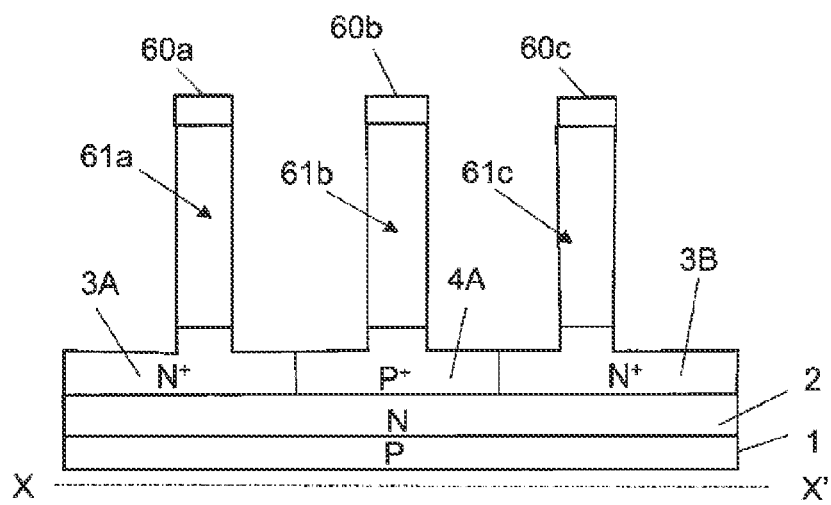
Figure 2C:
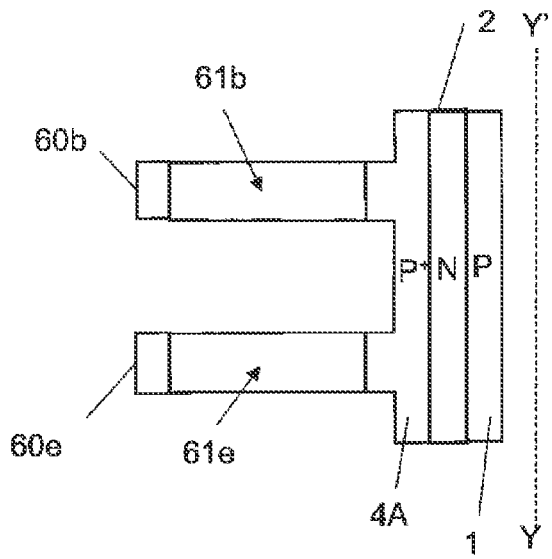

Then, same processes as shown in FIGS. 1UA to 1VC are performed. Thus, as shown in FIGS. 2CA to 2CC, Si pillars 61a, 61c, 61d, 61f are formed on $N^+$ layer 3A, 3B. At the same time, Si pillars 61b, 61e are formed on $P^+$ layer 4A.

Figure 2D:
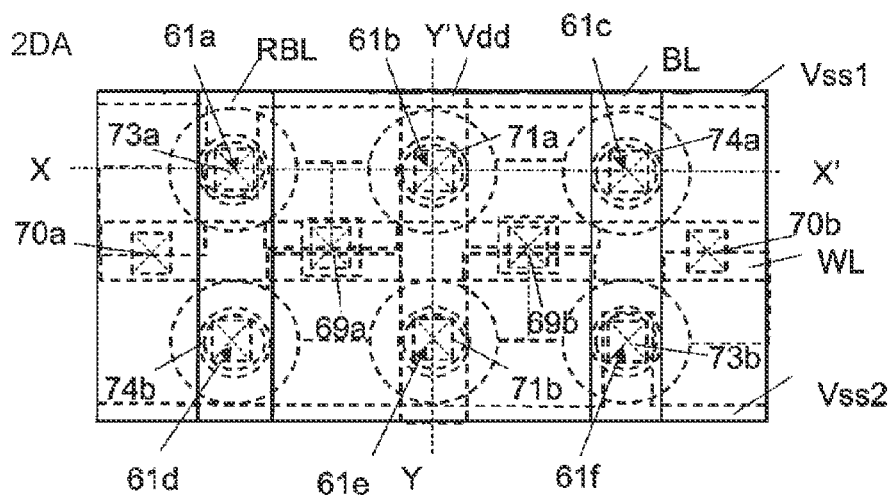
FIG. 2DA and FIGS. 2DB and 2DC are respectively a plan view and cross-sectional structural views for describing a pillar-shaped semiconductor device having SGTs according to the second embodiment.
Figure 2D:
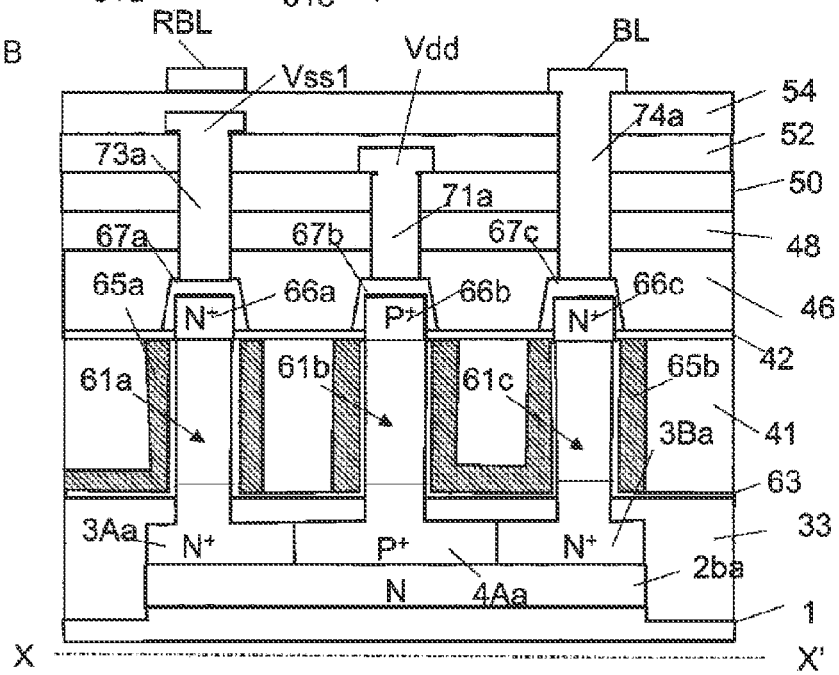
Figure 2D:
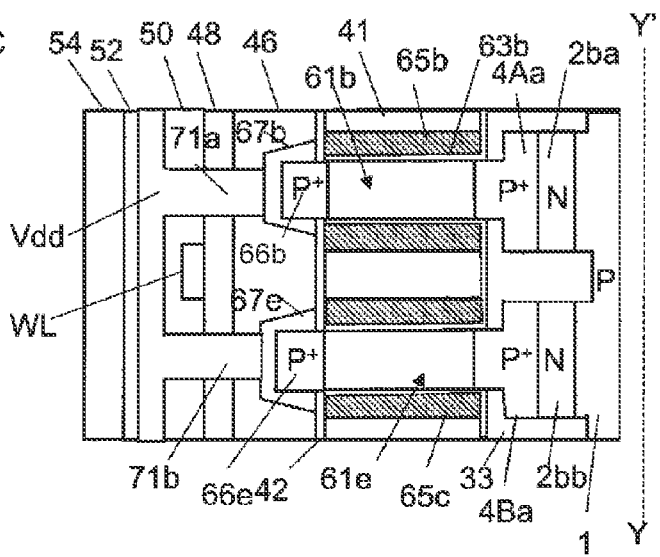

Then, same processes as shown in FIGS. 1XA to 1YYC are performed. Thus, as shown in FIGS. 2DA to 2DC, N layer 2A, $N^+$ layers 3Aa, 3Ba and $P^+$ layer 4Aa are formed under Si pillars 61a, 61b, 61c. Similarly, N layer 2B, $N^+$ layers 3Ba (not shown), 3Bb (not shown) and $P^+$ layer 4Ba are formed under Si pillars 61d, 61e, 61f. Then, $SiO_2$ layer 33 is formed surrounding lower part of the Si pillars 61a to 61f. Then, a $HfO_2$ layer 63, which is a gate insulating layer, is formed surrounding the Si pillars 61a to 61f. Then, gate TiN layers 65a, 65b, 65c, 65d (not shown), and $SiO_2$ layer 41 are formed surrounding the $HfO_2$ layer 63. Then, SiN layer 42 is formed on the periphery of the top of the Si pillars 61a to 61f. Then, $N^+$ layers 67a, 67c, 67d, 67f, and $P^+$ layers 67b, 67e are formed on the top of the Si pillars 61a to 61f by selective epitaxial crystal growth method. Then, heat treatment is applied to form $N^+$ layers 66a, 66c, 66d (not shown), 66f (not shown), and $P^+$ layers 66b, 66e on the top of the Si pillars 61a to 61f.

Then, after the $SiO_2$ layer 46 is formed entirely, the $N^+$ layer 3Aa, the $P^+$ layer 4Aa, and the gate TiN layer 65c are connected by a metal layer (not shown) via a contact hole 69a formed on the interface between the $N^+$ layer 3Aa and the $P^+$ layer 4Aa and on the gate TiN layer 65c. At the same time, the $N^+$ layer 3Bb, the $P^+$ layer 4Ba, and the gate TiN layer 65b are connected by a metal layer (not shown) via a contact hole 69b formed on the interface between the $N^+$ layer 3Bb and the $P^+$ layer 4Ba and on the gate TiN layer 65b. Then, after the $SiO_2$ layer 48 is formed entirely, the gate TiN layers 65a, 65d and a word line metal layer WL are connected via a contact hole 70a formed on the gate TiN layer 65a and a contact hole 70b formed on the gate TiN layer 65d. Then, after the $SiO_2$ layer 50 is formed entirely, the $P^+$ layers 67b, 67e and a supply line metal layer Vdd are connected via contact holes 71a, 71b formed on the $P^+$ layers 67b, 67e. Then, after the $SiO_2$ layer 52 is formed entirely, the $N^+$ layer 67a and a ground line metal layer Vss1 are connected via a contact hole 73a. At the same time, the $N^+$ layer 67f and a ground line metal layer Vss2 are connected via a contact hole 73b. Then, after the $SiO_2$ layer 54 is formed entirely, the $N^+$ layer 67c and a bit line metal layer BL are connected via a contact hole 74a. At the same time, the $N^+$ layer 67d and a reverse bit line metal layer RBL are connected via a contact hole 74b. Thus, a SRAM cell is formed on a P layer substrate 1.

According to the manufacturing method of this embodiment, following features are provided. 1. In the first embodiment, five band-like SiN layers 8a, 16a, 16b, 20a, 20b are formed on a mask material layer 7 as shown in FIGS. 1NA to 1NC. On the other hand, in this embodiment, a SRAM cell can be formed by forming three band-like SiN layers 8a, 16A, 16B as shown in FIGS. 2AA to 2AC. This makes it possible to simplify the processes. 2. In the first embodiment, as shown in FIGS. 1VA to 1VC, the process for removing the Si pillars 6b, 6i formed in the SRAM cell was necessary. On the other hand, in the present invention, such process for removing Si pillars is unnecessary. This makes it possible to simplify the processes.

Third Embodiment

Hereinafter, a method for manufacturing a pillar-shaped semiconductor device having SGTs according to the third embodiment of the present invention is described with reference to FIGS. 3AA to 3FC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

Figure 3A:
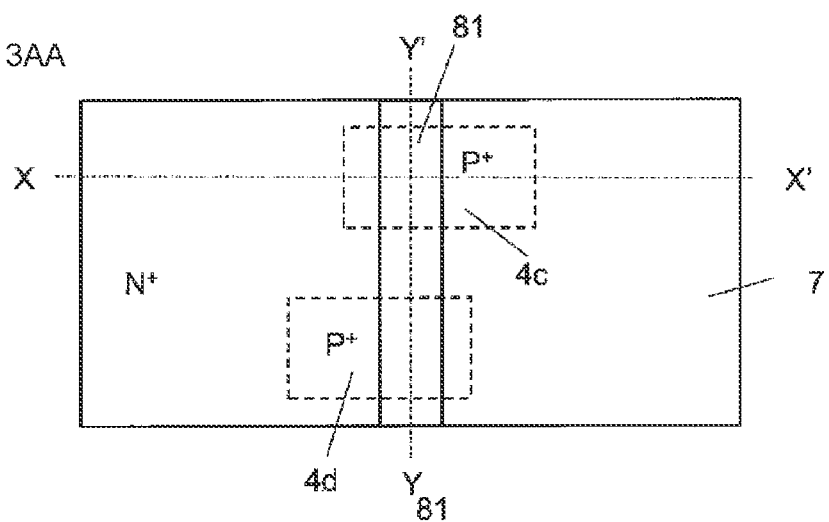
FIG. 3AA and FIGS. 3AB and 3AC are respectively a plan view and cross-sectional structural views for describing a pillar-shaped semiconductor device having SGTs according to the third embodiment.
Figure 3A:
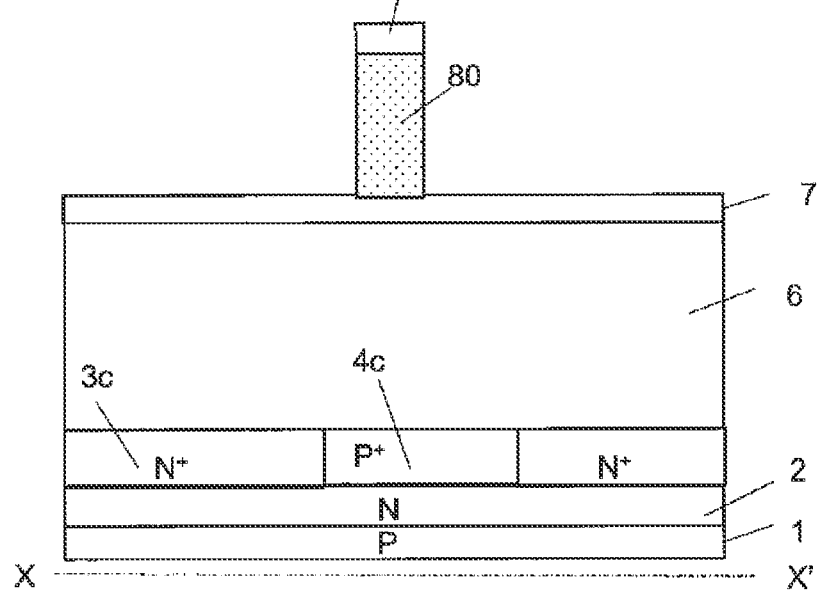
Figure 3A:
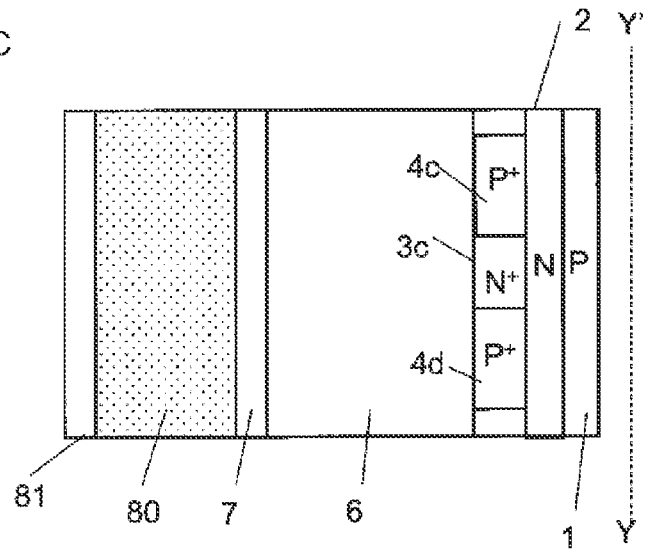

As shown in FIGS. 3AA to 3AC, at first, a band-like SiGe layer 80 (second band-like material layer) is formed with a band-like mask material layer 81 (first band-like material layer) as an etching mask, instead of a band-like SiN layer 8a and a mask material layer 9a shown in FIGS. 1CA to 1CC.

Figure 3B:
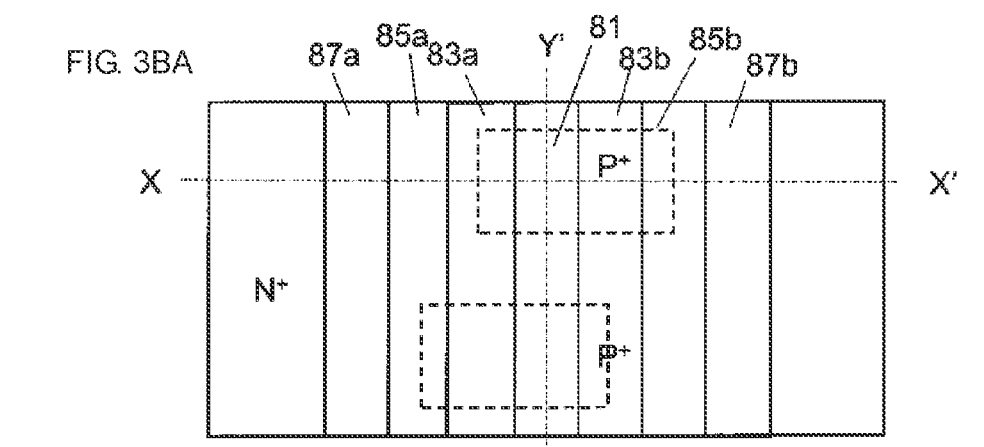
FIG. 3BA and FIGS. 3BB and 3BC are respectively a plan view and cross-sectional structural views for describing a pillar-shaped semiconductor device having SGTs according to the third embodiment.
Figure 3B:
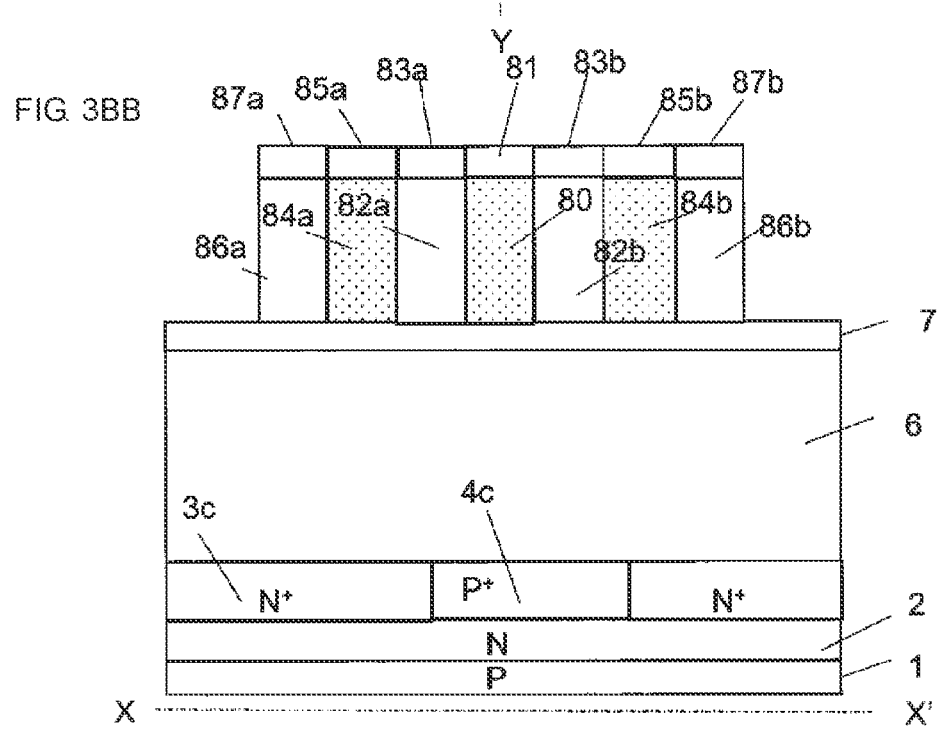
Figure 3B:
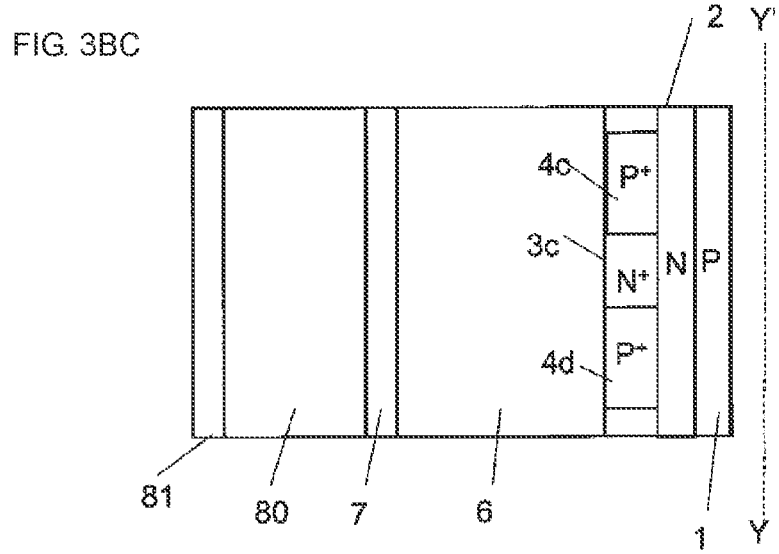

Then, processes similar to those shown in FIGS. 1DA to 1MC are performed. Thus, as shown in FIGS. 3BA to 3BC, on each side of the band-like SiGe layer 80 having the band-like mask material layer 81 on its top, band-like SiN layers 82a, 82b (fourth band-like material layer) having band-like mask material layer layers 83a, 83b (third band-like material layer of equal width on their top are formed. Then, on each side of the band-like SiN layers 82a, 82b, band-like SiN layers 84a, 84b having band-like mask material layers 85a, 85b of equal width on their top are formed. Then, on each side of the band-like SiGe layers 84a, 84b, band-like SiN layers 86a, 86b having band-like mask material layers 87a, 87b on their top are formed.

Figure 3C:
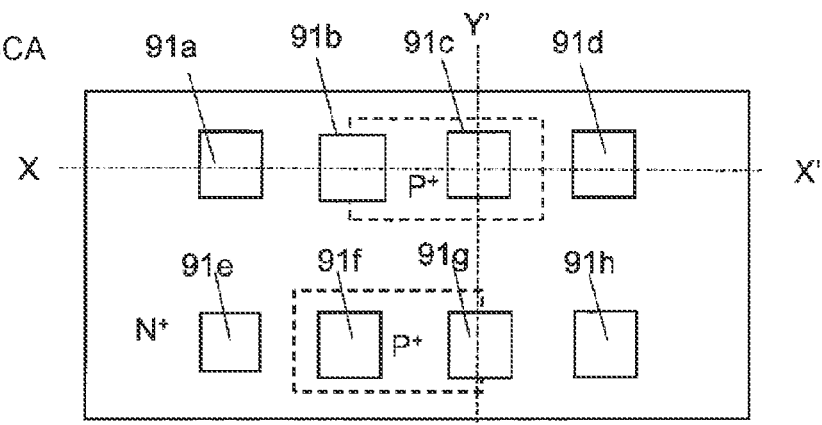
FIG. 3CA and FIGS. 3CB and 3CC are respectively a plan view and cross-sectional structural views for describing a pillar-shaped semiconductor device having SGTs according to the third embodiment.
Figure 3C:
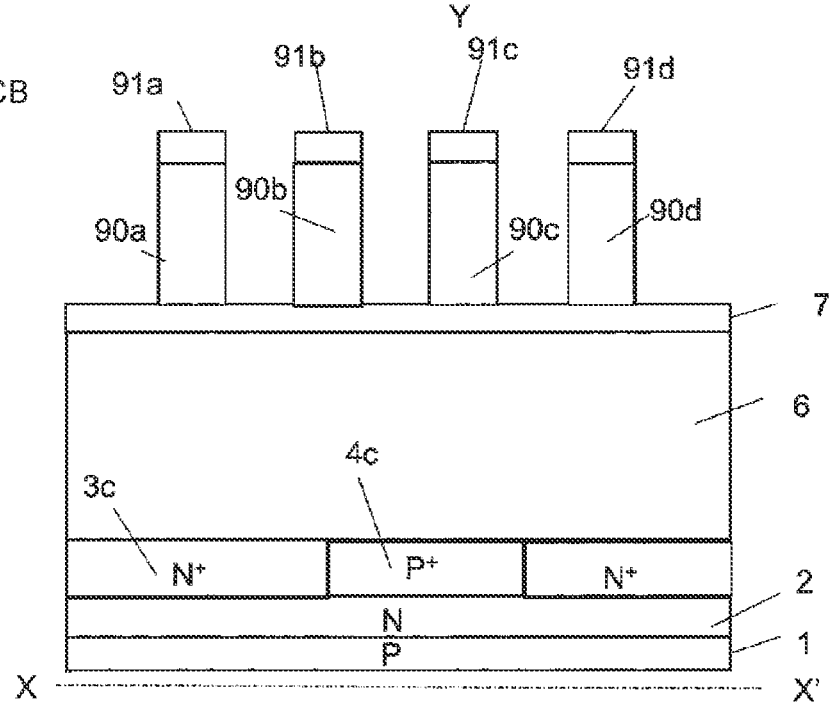
Figure 3C:
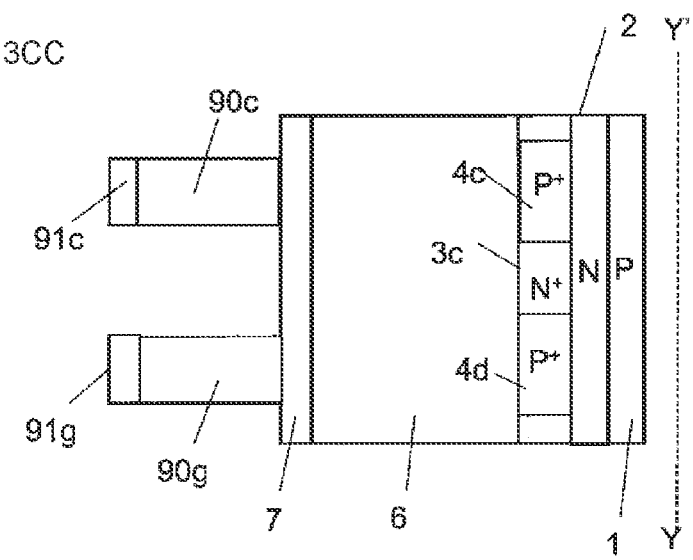

Then, processes similar to those shown in FIGS. 1NA to 1TC are performed. Thus, as shown FIGS. 3CA to 3CC, in planar view, square-shaped SiN layers 90a, 90b, 90c, 90d, 90e (not shown), 90f (not shown), 90g, 90h (not shown) having square-shaped mask material layers 91a, 91b, 91c, 91d, 91e, 91f, 91g, 91h (first mask material layer) on their top are formed on a mask material layer 7.

Figure 3D:
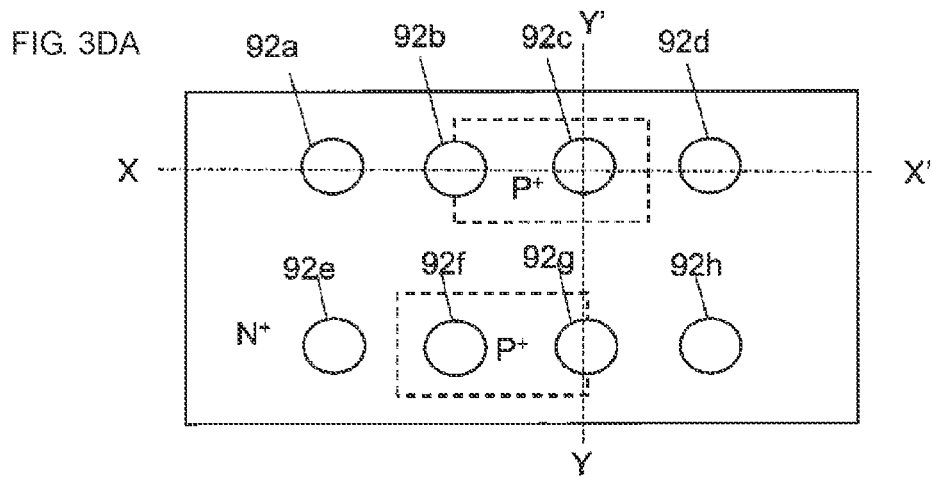
FIG. 3DA and FIGS. 3DB and 3DC are respectively a plan view and cross-sectional structural views for describing a pillar-shaped semiconductor device having SGTs according to the third embodiment.
Figure 3D:
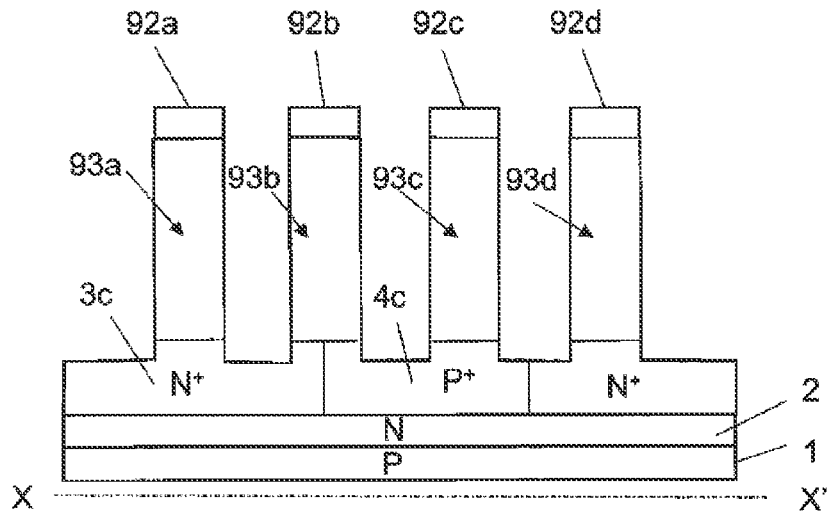
Figure 3D:
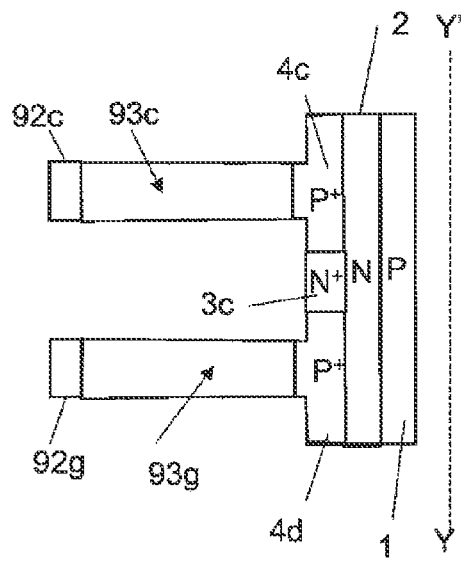

Then, same processes as shown in FIGS. 1UA to 1VC are performed. Thus, as shown in FIGS. 3DA to 3DC, Si pillars 93a, 93b, 93c, 93d, 93e, 93f, 93g, 93h (three-dimensionally-shaped semiconductor layer) having mask material layers 92a, 92b, 92c, 92d, 92e, 92f, 92g, 92h on their top are formed on $N^+$ layer 3c and $P^+$ layers 4c, 4d.

Figure 3E:
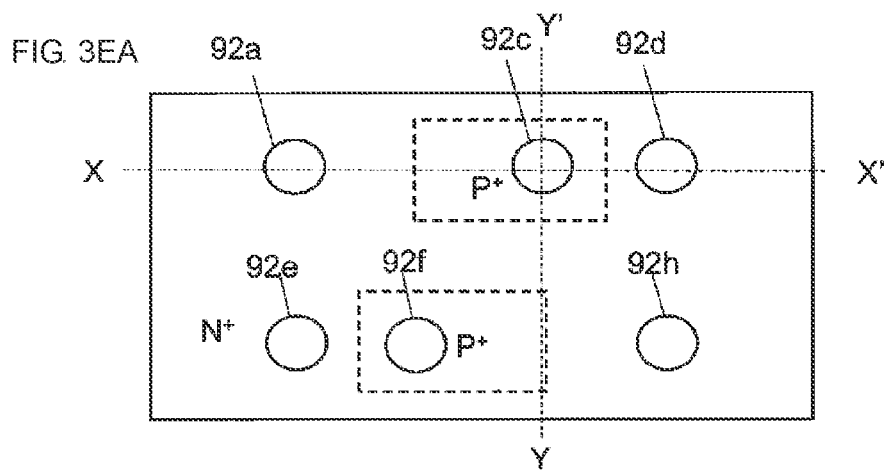
FIG. 3EA and FIGS. 3EB and 3EC are respectively a plan view and cross-sectional structural views for describing a pillar-shaped semiconductor device having SGTs according to the third embodiment.
Figure 3E:
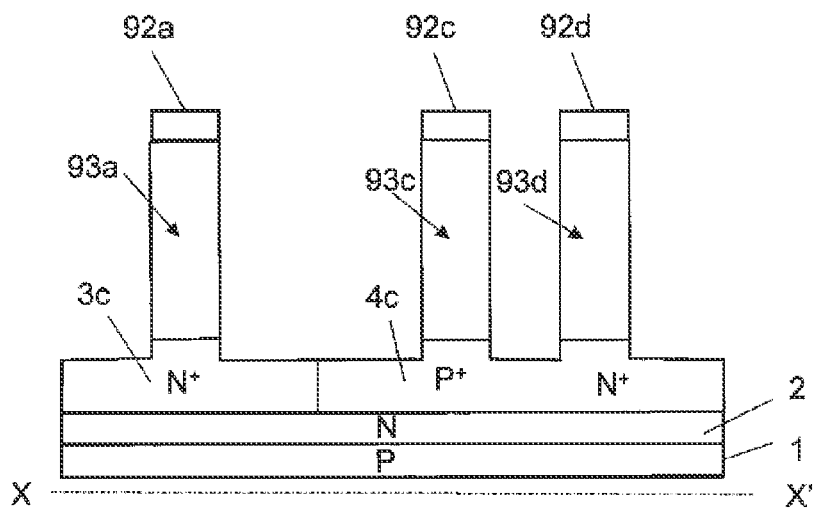
Figure 3E:
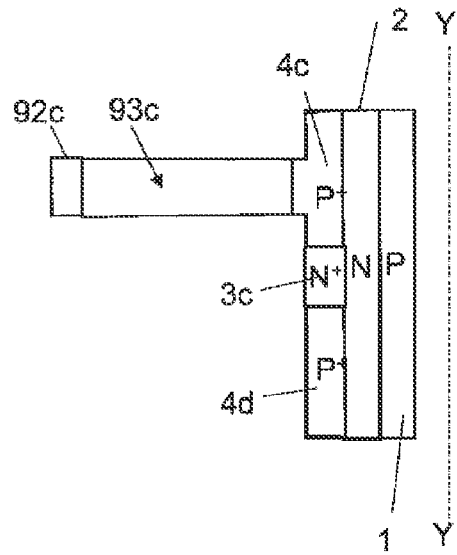

Then, as shown in FIGS. 3EA to 3EC, mask material layers 92b, 92g and Si pillars 93b, 93g are removed.

Figure 3F:
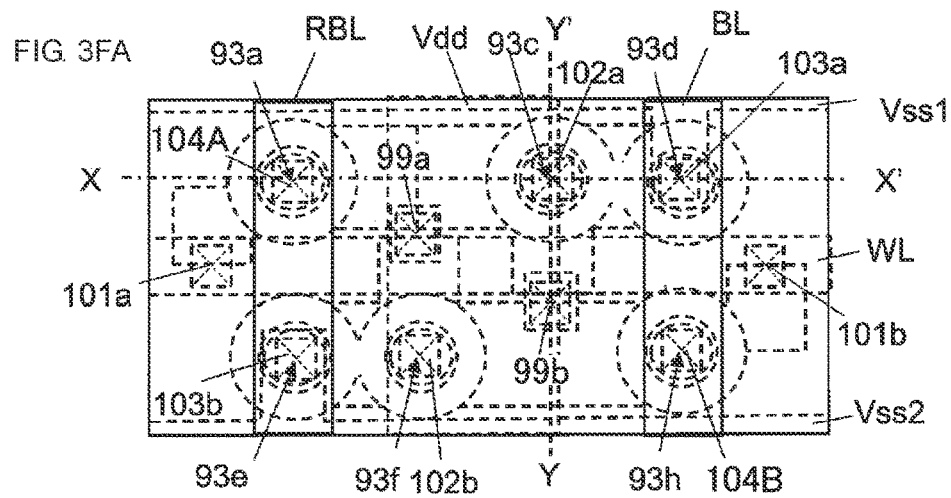
FIG. 3FA and FIGS. 3FB and 3FC are respectively a plan view and cross-sectional structural views for describing a pillar-shaped semiconductor device having SGTs according to the third embodiment.
Figure 3F:
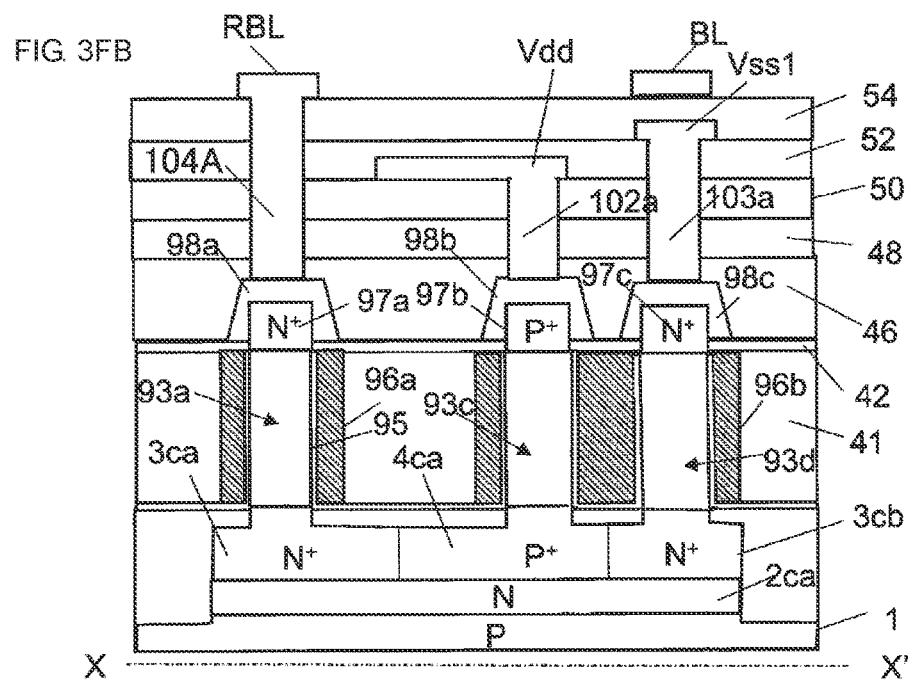
Figure 3F:
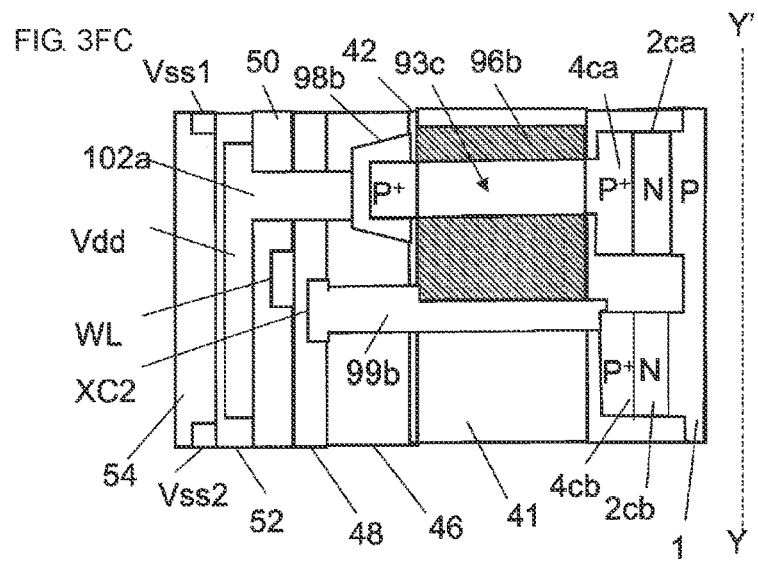

Then, same processes as shown in FIGS. 1ZA to 1YYC are performed. Thus, as shown in FIGS. 3FA to 3FC, N layer 2ca, $N^+$ layers 3ca, 3cb and $P^+$ layer 4ca are formed under Si pillars 93a, 93c, 93d. Similarly, N layer 2cb, $N^+$ layers 3da (not shown), 3db and $P^+$ layer 4cb (not shown) are formed under Si pillars 93e, 93f, 93h. Then, a $HfO_2$ layer 95, which is a gate insulating layer, is formed surrounding the Si pillars 93a to 93h. Then, gate TiN layers 96a, 96b, 96c, 96d (not shown) are formed surrounding the $HfO_2$ layer 95. Then, $N^+$ layers 98a, 98c, 98d (not shown), 98f (not shown) are formed on the top of the Si pillars 93a, 93d, 93e, 93h, and $N^+$ layers 97a, 97c, 97d (not shown), 97e (not shown) are formed on the top of the Si pillars 93a, 93d, 93e, 93h. Also, $P^+$ layers 98b, 98e (not shown) are formed on the top of the Si pillars 93c, 93f, and $P^+$ layers 97b, 97e (not shown) are formed on the top. Then, the $N^+$ layer 3ca, the $P^+$ layer 4ca, and the gate TiN layer 96c are connected by a metal layer (not shown) via a contact hole 99a formed on the interface between the $N^+$ layer 3ca and the $P^+$ layer 4ca and on the gate TiN layer 96c. At the same time, the $N^+$ layer 3db, the $P^+$ layer 4cb, and the gate TiN layer 96b are connected by a metal layer (not shown) via a contact hole 99b formed on the interface between the $N^+$ layer 3db and the $P^+$ layer 4cb and on the gate TiN layer 96b. Then, the gate TiN layers 96a, 96d and a word line metal layer WL are connected via a contact hole 101a formed on the gate TiN layer 96a and a contact hole 101b formed on the gate TiN layer 96d. Then, the $P^+$ layers 98b, 98e and a supply line metal layer Vdd are connected via contact holes 102a, 102b formed on the $P^+$ layers 98b, 98e. Then, the $N^+$ layer 98c and a ground line metal layer Vss1 are connected via a contact hole 103a. At the same time, the $N^+$ layer 98d and a ground line metal layer Vss2 are connected via a contact hole 103b. Then, the $N^+$ layer 98a and a reverse bit line metal layer RBL are connected via a contact hole 104A. At the same time, the $N^+$ layer 98f and a bit line metal layer BL are connected via a contact hole 104B. Thus, a SRAM cell is formed on a P layer substrate 1.

According to the manufacturing method of this embodiment, following features are provided.

3. In the first embodiment, five band-like SiN layers 8a, 16a, 16b, 20a, 20b are formed on a mask material layer 7 as shown in FIGS. 1NA to 1NC. On the other hand, in this embodiment, four band-like SiN layers 82a, 82b, 86a, 86b may be formed to form a SRAM cell as shown in FIGS. 3BA to 3BC. This makes it possible to simplify the processes.

4. In this embodiment, similar to the first embodiment, each of gate TiN layers 96b, 96c, which are respectively linked to periphery of Si pillars 93c, 93d and Si pillars 93e, 93f, contacts at side surface between the Si pillars 93c and 93d and between the Si pillars 93e and 93f. On the other hand, gate TiN layers 96a, 96d are formed independently at the Si pillars 93a, 93h. Thus, the fact that each of the gate TiN layers 96b, 96c contacts at side surface between the Si pillars 93c and 93d and between Si pillars 93e and 93f indicates that it is possible to reduce a distance between Si pillars 93c and 93d and between Si pillars 93e and 93f to such a length corresponding to twice of a sum of a thickness of gate $HfO_2$ layer 95 and a thickness of gate TiN layers 96b, 96c. Thus, high integration of SRAM cell can be provided.

Fourth Embodiment

Figure 4A:
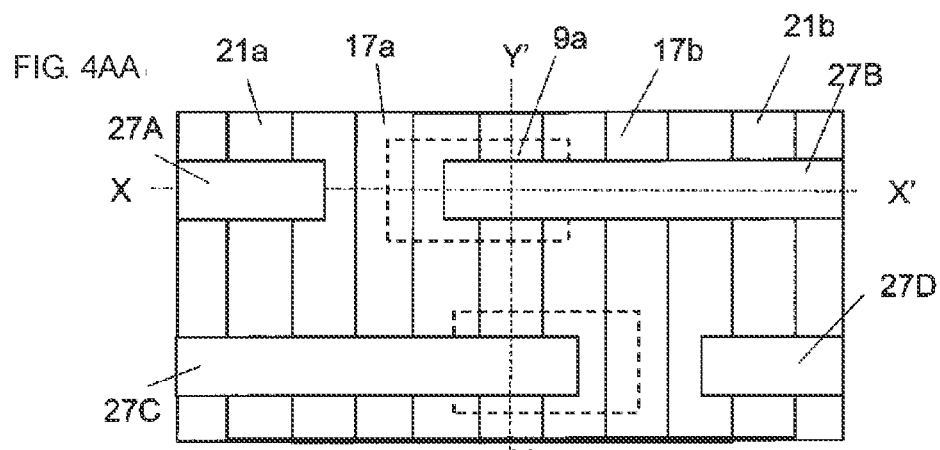
FIG. 4AA and FIGS. 4AB and 4AC are respectively a plan view and cross-sectional structural views for describing a pillar-shaped semiconductor device having SGTs according to the fourth embodiment.
Figure 4A:
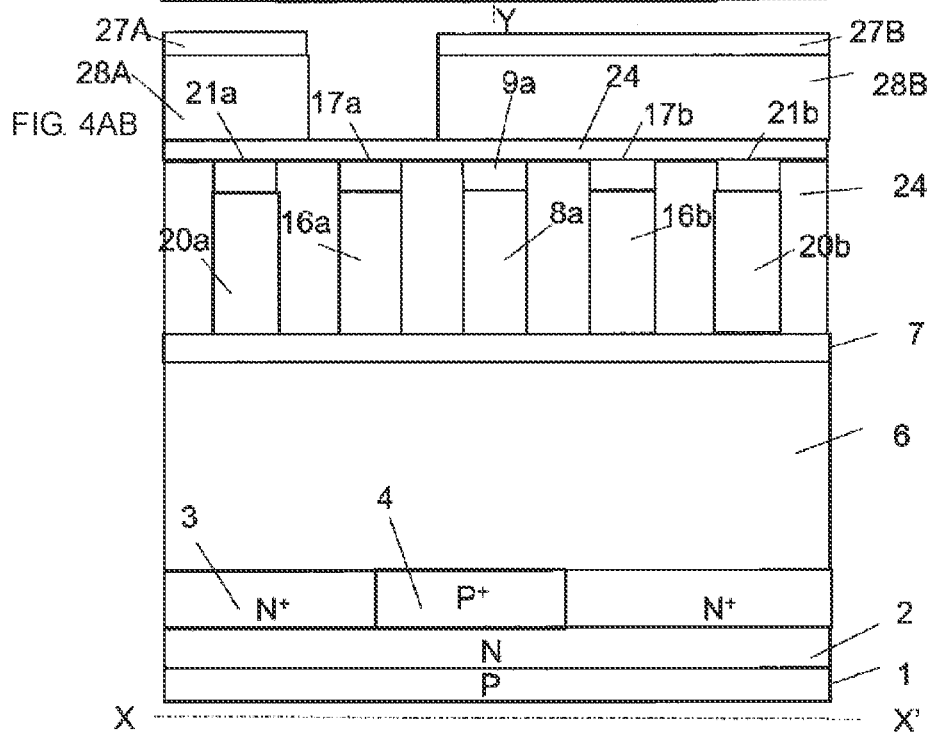
Figure 4A:
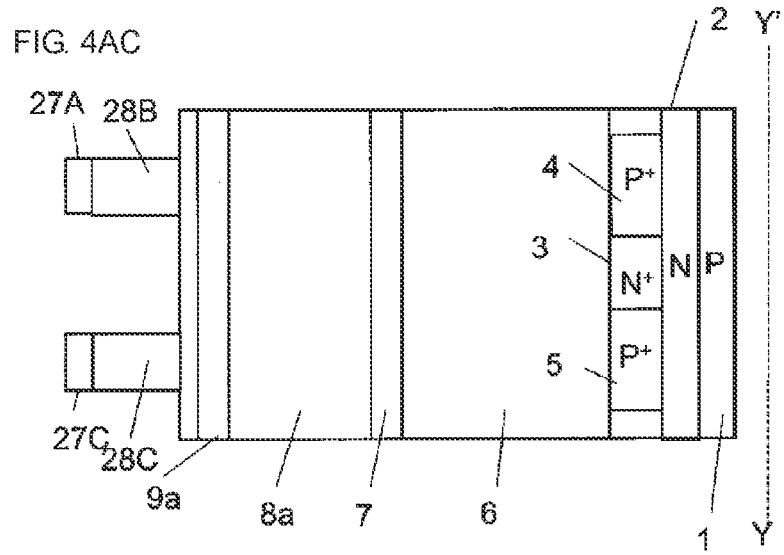
Figure 4B:
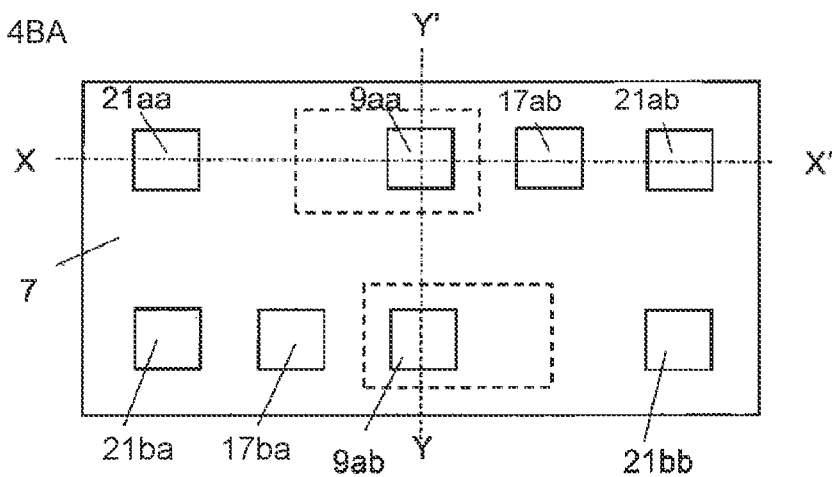
FIG. 4BA and FIGS. 4BB and 4BC are respectively a plan view and cross-sectional structural views for describing a pillar-shaped semiconductor device having SGTs according to the fourth embodiment.
Figure 4B:
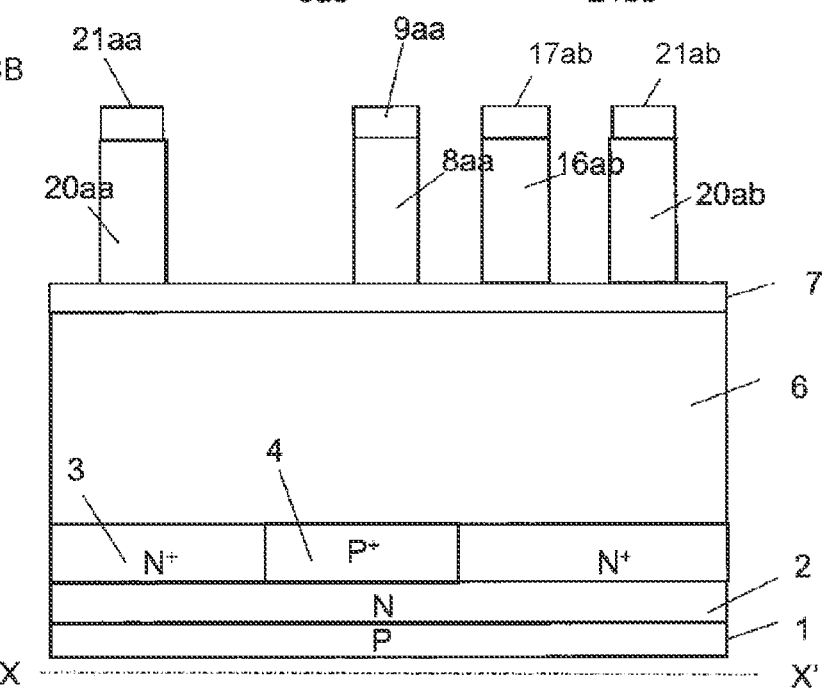
Figure 4B:
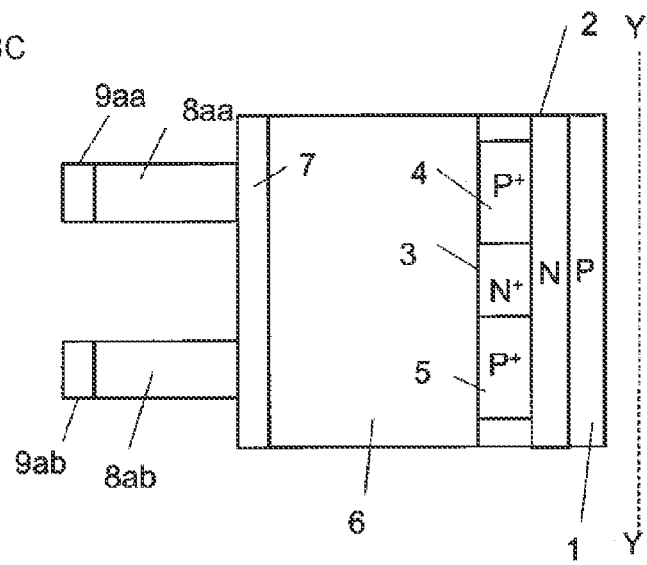

Hereinafter, a method for manufacturing a pillar-shaped semiconductor device having SGTs according to the fourth embodiment of the present invention is described with reference to FIGS. 4AA to 4BC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

Processes of FIGS. 1AA to 1RC are performed. Then, as shown in FIGS. 4AA to 4AC, band-like mask material layers 27a, 28a in an area on a SiN layer 16a in FIGS. 1RA to 1RC are removed in planar view by lithography and RIE etching to form band-like mask material layers 28A, 28B having band-like mask material layers 27A, 27B on their top. At the same time, band-like mask material layers 27b, 28b on a SiN layer 16b are removed in planar view to form band-like mask material layers 28C, 28D (not shown) having band-like mask material layers 27C, 27D on their top.

Next, by performing processes shown in FIGS. 1SA to 1TC, square-shaped mask material layers 21aa, 21ab, 21ba, 21bb, 17ab, 17ba, 9aa, 9ab and square-shaped mask material layer 20aa, 20ab, 20ba (not shown), 20bb, 16ab, 16ba (not shown), 8aa, 8ab are formed on a mask material layer 7 in planar view, as shown 4B. In this case, SiN layers 16aa, 16bb and mask material layers 17aa, 17bb in FIGS. 1SA to 1SC are absent. Then, by performing processes of FIGS. 1XA to 1YYC, a SRAM cell having a structure the same as that of the first embodiment is formed on a P layer substrate 1.

According to the manufacturing method of this embodiment, following features are provided.

In the first embodiment, Si pillars 6b, 6i and mask material layers 7b, 7i are removed after the Si pillars 6b, 6i and mask material layers 7b, 7i are formed. In such a case, the Si pillars 6b, 6i having a height in vertical direction must be removed by etching in controlled manner such that the end point of the etching comes to the same as the bottom of other Si pillars 6a, 6c, 6d, 6e, 6f, 6g, 6h, 6j. On the other hand, in this embodiment, only mask material layers 27a, 27b, 28a, 28b on the upper most surface shown in FIGS. 1RA to 1RC of the first embodiment may be etched. In this case, the end point of etching is a mask material layer 7, which is an etching stopper, and thus there is no problem of controllability for the end point of etching, as in the first embodiment.

Fifth Embodiment

Hereinafter, a method for manufacturing a pillar-shaped semiconductor device having SGTs according to the fifth embodiment of the present invention is described with reference to FIGS. 5AA to 5FC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

Figure 5A:
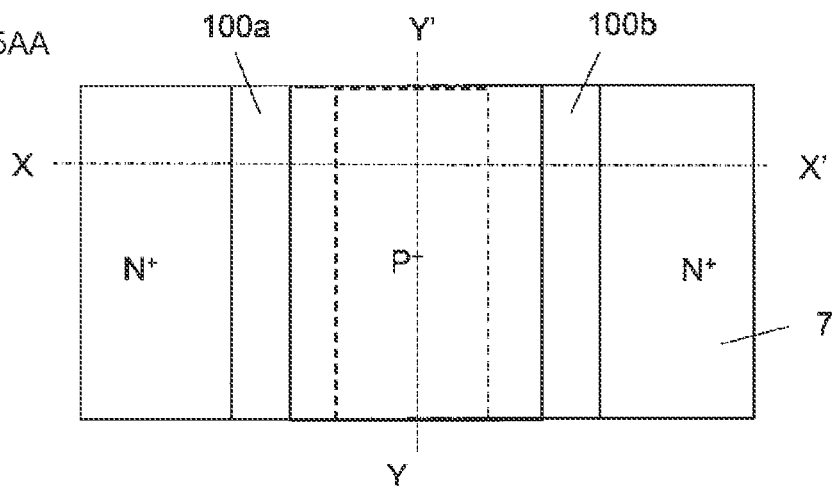
FIG. 5AA and FIGS. 5AB and 5AC are respectively a plan view and cross-sectional structural views for describing a pillar-shaped semiconductor device having SGTs according to the fifth embodiment.
Figure 5A:
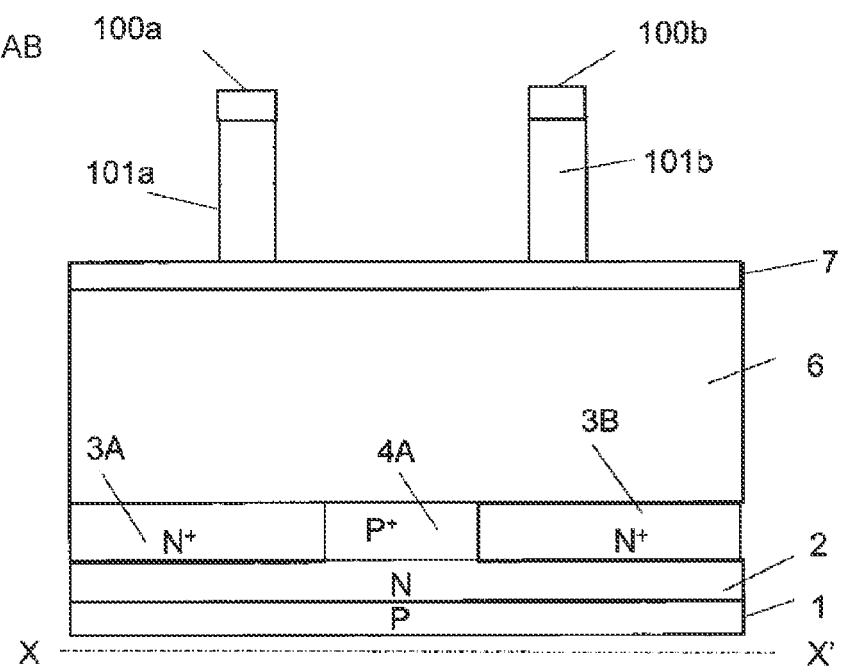
Figure 5A:
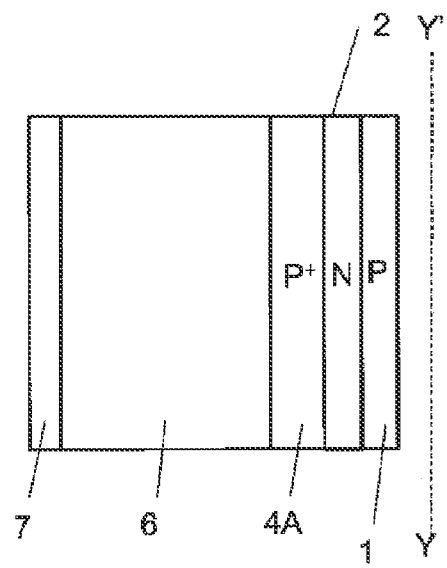

As shown in FIGS. 5AA to 5AC, a band-like SiN layer 101a and a band-like SiN layer 101b (seventh band-like material layer, twelfth band-like material layer, sixteenth band-like material layer) respectively having a band-like mask material layer 100a and a band-like mask material layer 100b (sixth band-like material layer, eleventh band-like material layer, fifteenth band-like material layer) on its top are extended in Y direction to be formed on a mask material layer 7. The band-like SiN layer 101a is formed on an $N^+$ layer 3A in planar view. Also, the band-like SiN layer 101b is formed on an $N^+$ layer 3B in planar view. These $N^+$ layers 3A, 3B are formed in band-shape at each side of a band-like P+ layer 4A in planar view.

Figure 5B:
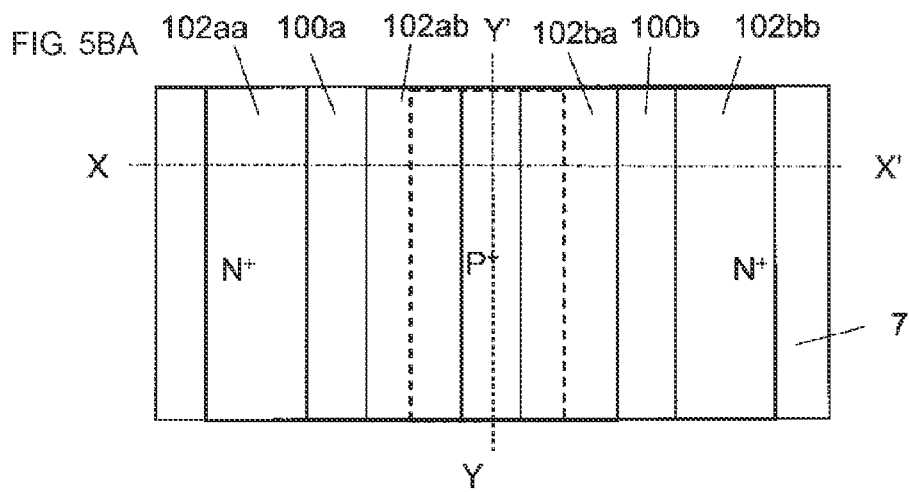
FIG. 5BA and FIGS. 5BB and 5BC are respectively a plan view and cross-sectional structural views for describing a pillar-shaped semiconductor device having SGTs according to the fifth embodiment.
Figure 5B:
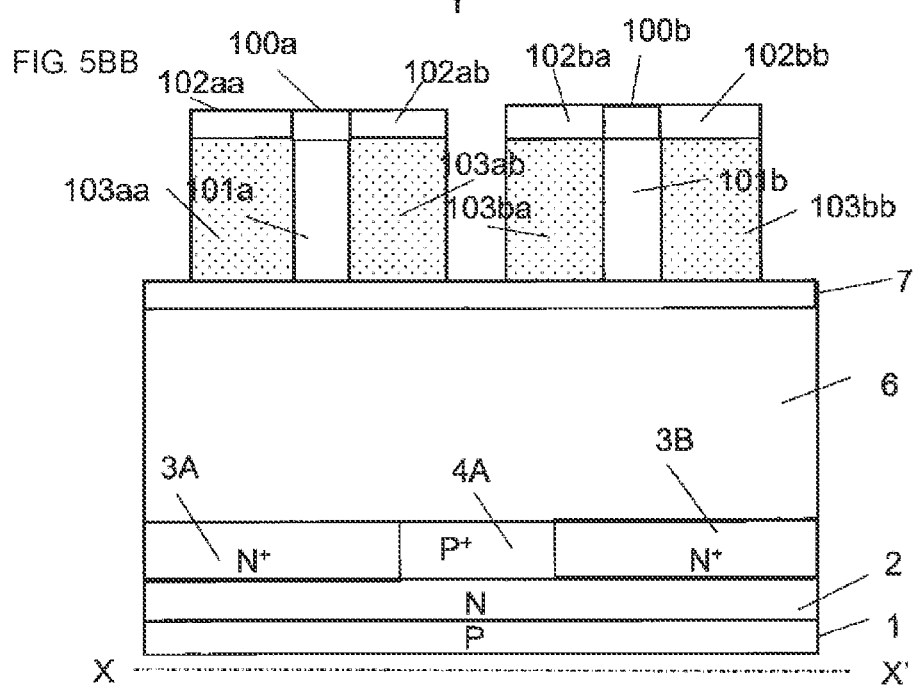
Figure 5B:
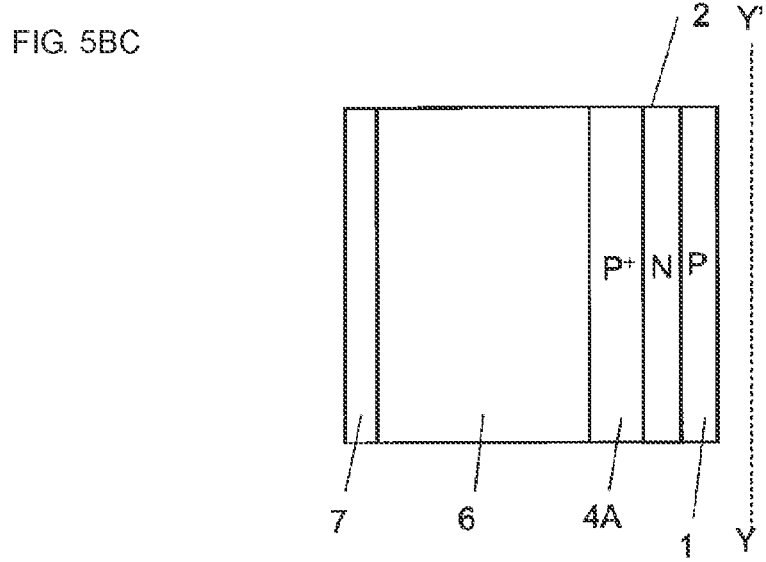

Then, processes of FIGS. 1DA to 1IC are performed. As shown in FIGS. 5BA to 5BC, band-like mask material layers 102*aa*, 102*ab*, and band-like SiGe layers 103*aa*, 103*ab* are thus formed at each side of the band-like mask material layer 100*a* and the band-like SiN layer 101*a*. Similarly, band-like mask material layers 102*ba*, 102*bb* (eighth band-like material layer, thirteenth band-like material layer, seventeenth band-like material layer), and band-like SiGe layers 103*ba*, 103*bb* (ninth band-like material layer, fourteenth band-like material layer, eighteenth band-like material layer) are formed at each side of the band-like mask material layer 100*b* and the band-like SiN layer 101*b*.

Next, entire area is covered with a SiN layer (not shown). Then, as shown in FIGS. 5CA to 5CC, the SiN layer is polished by CMP method such that its upper surface position comes to the same as the mask material layers 100*a*, 100*b* to form band-like SiN layers 104*a*, 104*b*, 104*c*.

Next, as shown in FIGS. 5DA to 5DC, a resist layer 105 having an opening end outside of the SiN layer 104*a*, in planar view is formed. Then, the SiN layer 104*a* is etched with the resist layer 105, the band-like mask material layers 102*ab*, 102*ba* as a mask, such that its upper surface position comes to a bottom position of the band-like mask material layers 102*ab*, 102*ba*, to form a recess 106.

Next, the resist layer 105 is removed. Then, the recess 106 is filled using CVD method and CMP method to form a band-like mask material layer 108 (twentieth band-like material layer) which upper surface position is the same as the upper surface position of the band-like mask material layers 102*ab*, 102*ba*. Then, as shown in FIGS. 5EA to 5EC, the SiN layer 104 is etched and removed, with the mask material layers 100*a*, 100*b*, 102*aa*, 102*ab*, 102*ba*, 102*bb* as a mask.

Next, as shown in FIGS. 5FA to 5FC, the band-like mask material layers 102*aa*, 102*ab*, 102*ba*, 102*bb* are removed. Then, the SiGe layers 103*aa*, 103*ab*, 103*ba*, 103*bb* are removed. Thus, band-like SiN layers 101*a*, 101*b*, 104*a* having the mask material layers 100*a*, 100*b*, 108 on their top are formed on the mask material layer 7. Then, by performing the processes from FIGS. 2BA to 2DC, a SRAM cell circuit consisting of six Si pillars 61*a* to 61*f* in one cell area, which is the same as the second embodiment, is formed.

According to the manufacturing method of this embodiment, following features are provided.

In the second embodiment, the band-like SiN layer 8*a* is formed first, and then, two band-like SiN layers 16A, 16B are formed at outsides of this band-like SiN layer 8*a*. In this case, precision of position in X direction of the band-like SiN layers 16A, 16B to the band-like SiN layer 8*a* is affected by precision of two times of ALD film deposition and RIE etching for forming the band-like SiGe layers 12Aa, 12Ab and the band-like SiN layers 16A, 16B. On the other hand, in this embodiment, the band-like SiN layers 101*a*, 101*b* on each side are formed first, then the band-like SiGe layers 103*aa*, 103*ab*, 103*ba*, 103*bb* are formed, and after that, the central band-like SiN layer 104*a* is formed. In this case, precision of position in X direction of the band-like SiN layers 101*a*, 101*b* to the band-like SiN layer 104*a* is only affected by precision of one ALD film deposition and RIE etching for forming the band-like SiGe layers 103*aa*, 103*ab*, 103*ba*, 103*bb*. Thus, high precision of SRAM cell can be provided.

In the description of the embodiment, the band-like mask material layers 102*aa*, 102*ab*, 102*ba*, 102*bb*, and the band-like SiGe layers 103*aa*, 103*ab*, 103*ba*, 103*bb* are removed, to leave the band-like mask material layers 100*a*, 100*b*, 108, and SiN layers 101*a*, 101*b*, 104*a*. On the other hand, the band-like mask material layers 102*aa*, 102*ab*, 102*ba*, 102*bb*, and the band-like SiGe layers 103*aa*, 103*ab*, 103*ba*, 103*bb* may be left, and the band-like mask material layers 100*a*, 100*b*, 108, and SiN layers 101*a*, 101*b*, 104*a* may be removed. In this case, the band-like mask material layers 102*aa*, 102*ab*, 102*ba*, 102*bb*, and the band-like SiGe layers 103*aa*, 103*ab*, 103*ba*, 103*bb* become a mask material layer when forming the Si pillars. This also makes it possible to provide high precision of SRAM cell.

This embodiment is described using an example of forming the band-like SiN layer 104*a* and the band-like mask material layer 108 between the band-like SiGe layers 103*ab*, 103*ba*, as shown in FIGS. 5BA to 5EC. On the other hand, if a band-like mask material layer (not shown) and a band-like SiN layer (not shown) are formed by processes the same as shown in FIGS. 1JA to 1LC after forming the band-like SiGe layers 103*aa*, 103*ab*, 103*ba*, 103*bb*, five band-like mask material layers (not shown) and band-like SiN layers (not shown) extended in Y direction in planar view, the same as in FIGS. 1NA to 1NC, can be formed. Thus, a SRAM cell consisting of eight SGTs which is the same as the first embodiment can be formed. In this method, each of forming processes of the band-like mask material layer and the band-like SiN layer can be reduced by one compared to the first embodiment. This makes it possible to simplify the processes.

Sixth Embodiment

Figure 6A:
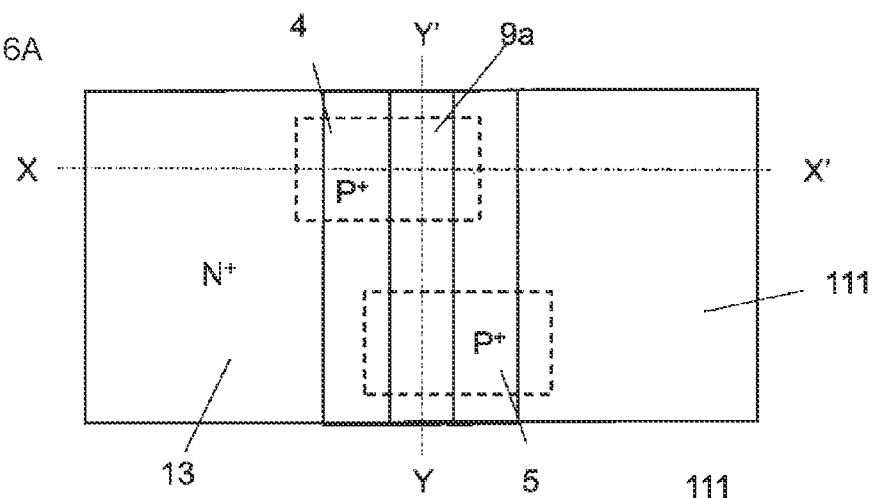
FIG. 6A and FIGS. 6B and 6C are respectively a plan view and cross-sectional structural views for describing a pillar-shaped semiconductor device having SGTs according to the sixth embodiment.
Figure 6B:
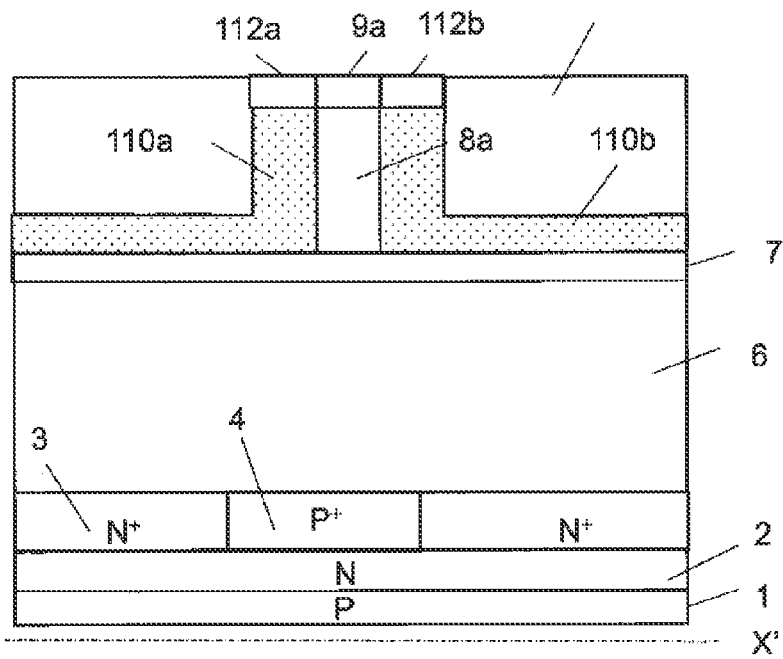
Figure 6C:
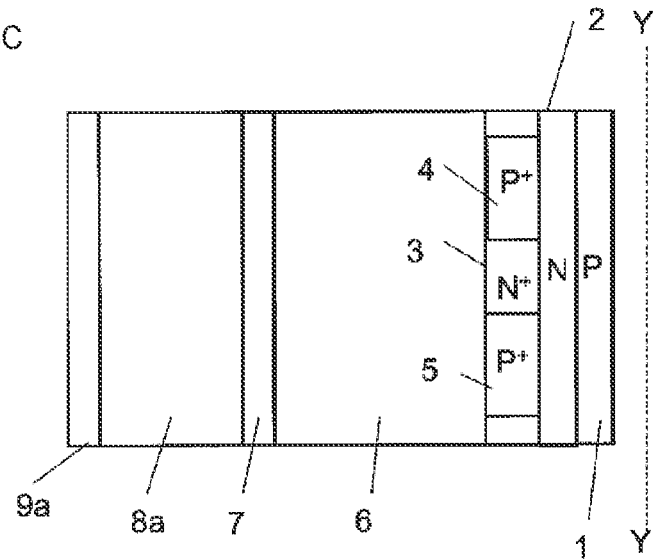

Hereinafter, a method for manufacturing a pillar-shaped semiconductor device having SGTs according to the sixth embodiment of the present invention is described with reference to FIGS. 6A to 6C. FIG. 6A is a plan view, FIG. 6B is a cross-sectional structural view taken along line X-X' of FIG. 6A, and FIG. 6C is a cross-sectional structural view taken along line Y-Y' of FIG. 6A.

Processes of FIGS. 1AA to 1EC are performed. In the processes, Si layers 110*a*, 110*b* are formed instead of the SiGe layers 12*a*, 12*b*. Then, an amorphous SiOC layer 111 is formed instead of the SiO$_2$ layer 13. Then, heat treatment in an atmosphere containing oxygen is performed to oxidize the top of the Si layers 110*a*, 110*b* to form band-like SiO$_2$ layers 112*a*, 112*b* which are mask material layers. The band-like mask material layers can be thus formed by oxidation treatment.

According to the manufacturing method of this embodiment, following features are provided.

In the first embodiment, after forming the recesses 14*a*, 14*b*, the process of polishing the entirely deposited SiN layer by CMP method is necessary. On the other hand, in this embodiment, the band-like SiO$_2$ layers 112*a*, 112*b* which are mask material layers can be formed only by the oxidation treatment. This makes it possible to simplify the processes.

Seventh Embodiment

Figure 7A:
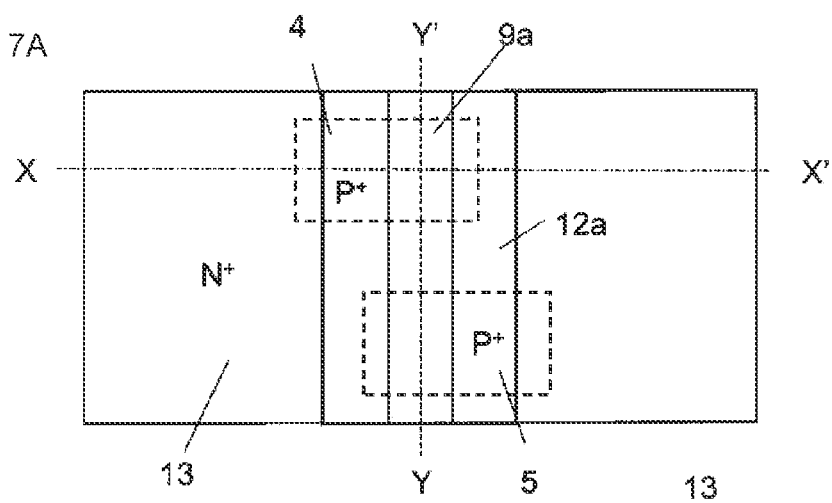
FIG. 7A and FIGS. 7B and 7C are respectively a plan view and cross-sectional structural views for describing a pillar-shaped semiconductor device having SGTs according to the seventh embodiment.
Figure 7B:
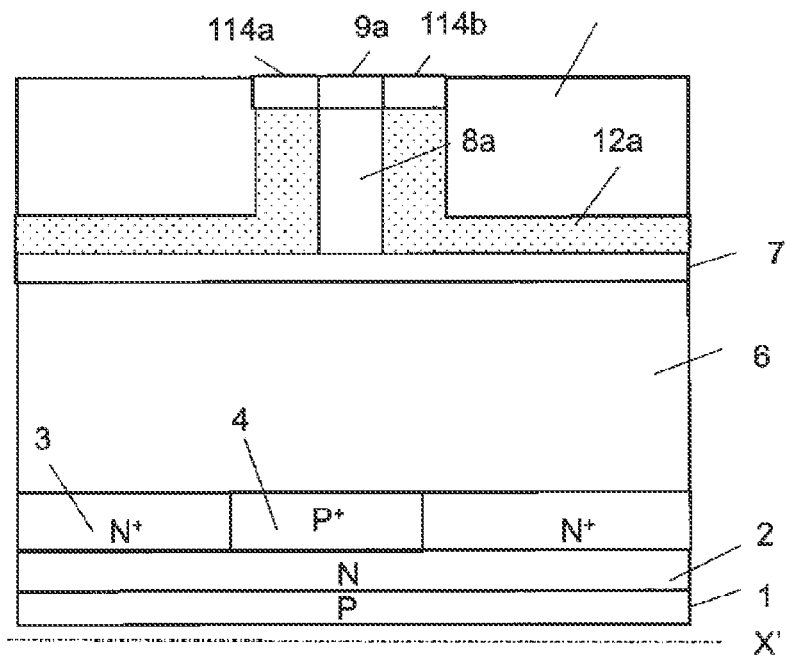
Figure 7C:
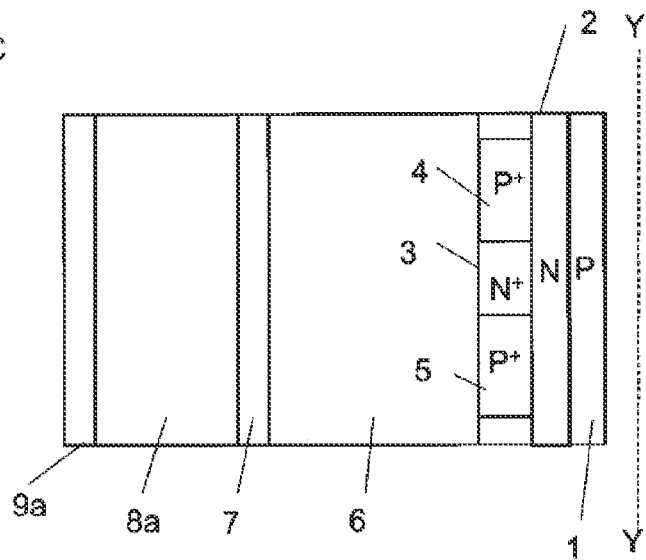

Hereinafter, a method for manufacturing a pillar-shaped semiconductor device having SGTs according to the seventh embodiment of the present invention is described with reference to FIGS. 7A to 7C. FIG. 7A is a plan view, FIG. 7B is a cross-sectional structural view taken along line X-X' of FIG. 7A, and FIG. 7C is a cross-sectional structural view taken along line Y-Y' of FIG. 7A.

Processes of FIGS. 1AA to 1EC are performed. Then, band-like SiGe nitride layers 114*a*, 114*b* are formed on top of the SiGe layer 12a by nitrogen ion implantation. These band-like SiGe nitride layers 114a, 114b are used as mask material layers.

According to the manufacturing method of this embodiment, following features are provided.

In the first embodiment, after forming the recesses 14a, 14b, the process of polishing the entirely deposited SiN layer by CMP method is necessary. On the other hand, in this embodiment, the band-like SiGe nitride layers 114a, 114b which are the mask material layers can be formed only by ion implantation of nitrogen ion. This makes it possible to simplify the processes.

Eighth Embodiment

Hereinafter, a method for manufacturing a three-dimensional semiconductor device according to the eighth embodiment of the present invention is described with reference to FIGS. 8AA to 8EC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

Figure 8A:
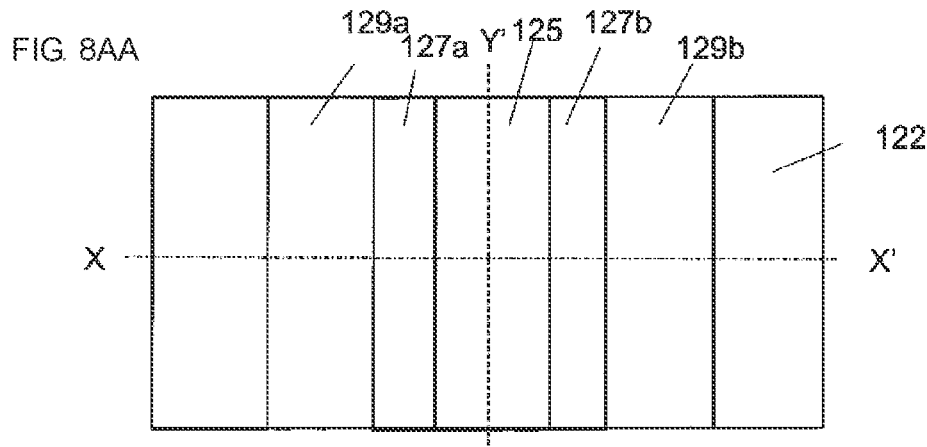
FIG. 8AA and FIGS. 8AB and 8AC are respectively a plan view and cross-sectional structural views for describing a pillar-shaped semiconductor device having SGTs according to the eighth embodiment.
Figure 8A:
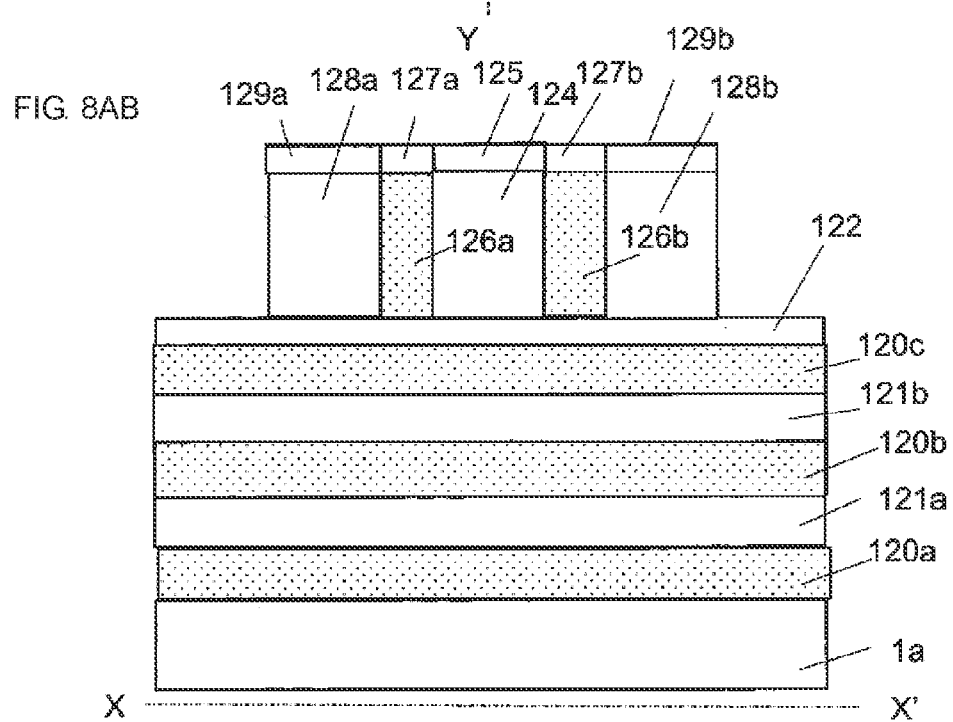
Figure 8A:
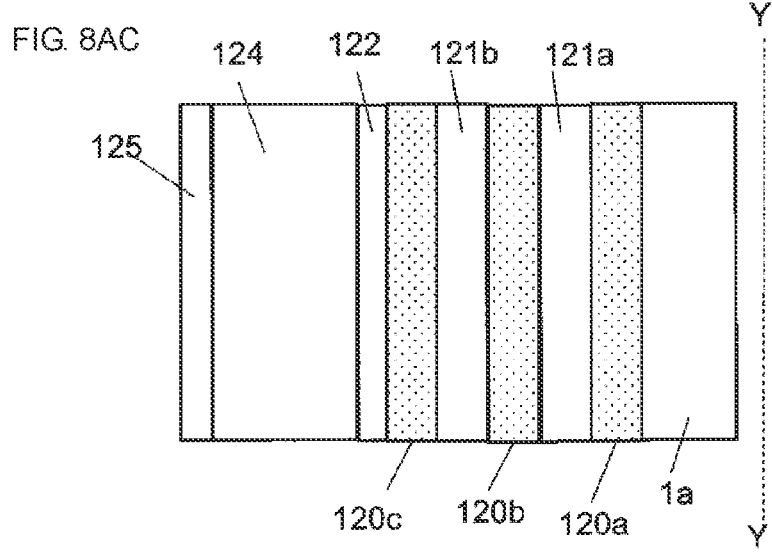

As shown in FIGS. 8AA to 8AC, a SiGe layer 120a (fourth material layer) is formed for example on a SiO$_2$ substrate 1a by ALD method. Then, a Si layer 121a (first semiconductor layer), a SiGe layer 120b (fourth material layer), a Si layer 121b (first semiconductor layer), and a SiGe layer 120c are formed from below in order by epitaxial crystal growth method. Support material layers (not shown) are formed at each end in Y direction of SiGe layers 120a (eighth material layer), 120b (eighth material layer), 120c, and Si layers 121a, 121b, 120c. Then, a mask material layer 122 is formed on the SiGe layer 120c. Then, processes the same as FIGS. 1AA to 1LC are performed to form a band-like SiN layer 124 having a band-like mask material layer 125 on its top, band-like SiGe layers 126a, 126b respectively having band-like mask material layers 127a, 127b on its top, formed at each side of the band-like mask material layer 125 and the band-like SiN layer 124, and band-like SiN layers 128a, 128b respectively having mask material layers 129a, 129b on its top, at each side of the band-like SiGe layers 126a, 126b and the band-like mask material layers 127a, 127b, on the mask material layer 122.

Figure 8B:
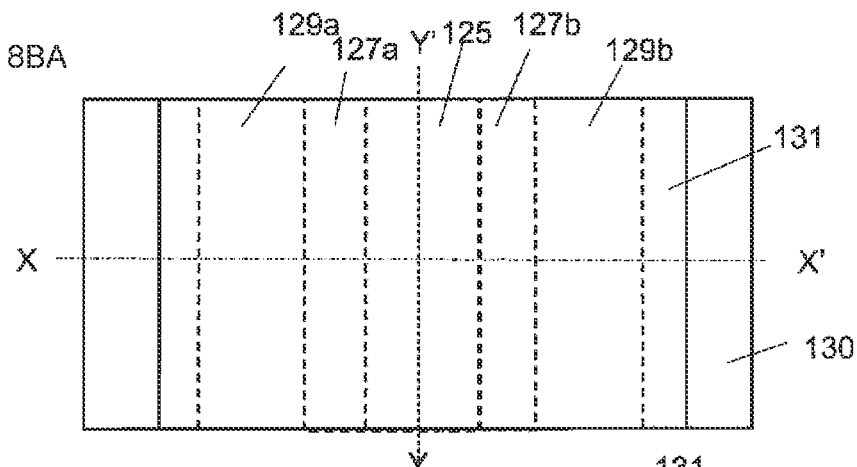
FIG. 8BA and FIGS. 8BB and 8BC are respectively a plan view and cross-sectional structural views for describing a pillar-shaped semiconductor device having SGTs according to the eighth embodiment.
Figure 8B:
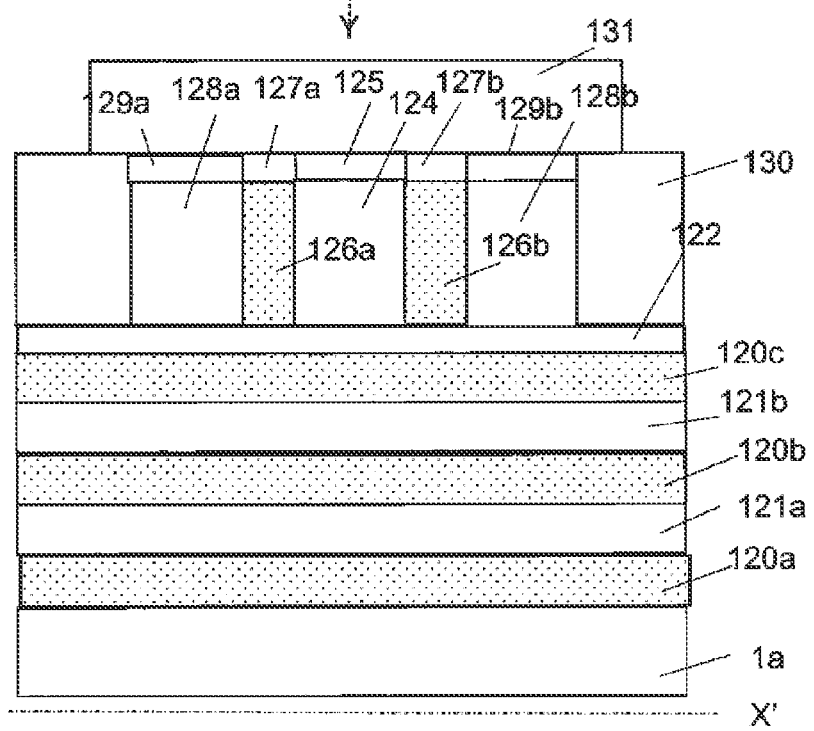
Figure 8B:
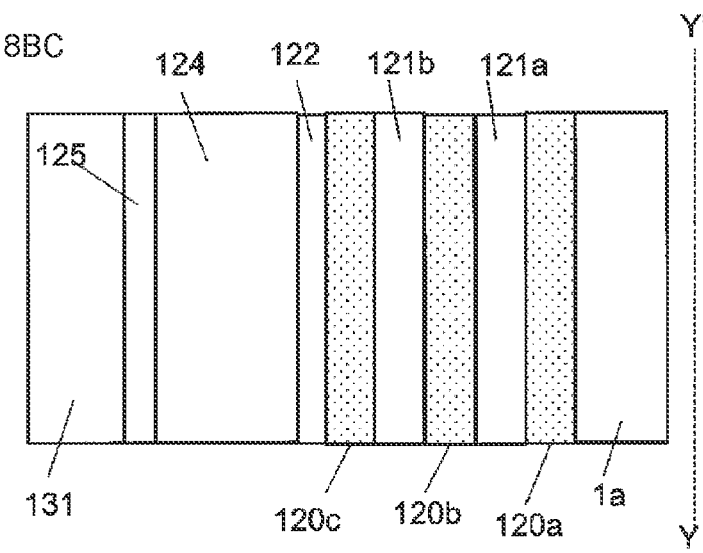

Next, as shown in FIGS. 8BA to 8BC, entire area is covered with a SiO$_2$ layer (not shown), and the SiO$_2$ layer is polished by CMP method such that its upper surface position comes to the upper surface position of the band-like mask material layer 125 to form a SiO$_2$ layer 130. Then, a mask material layer 131 which each end in Y direction in planar view corresponds to ends of the support material layer is formed.

Figure 8C:
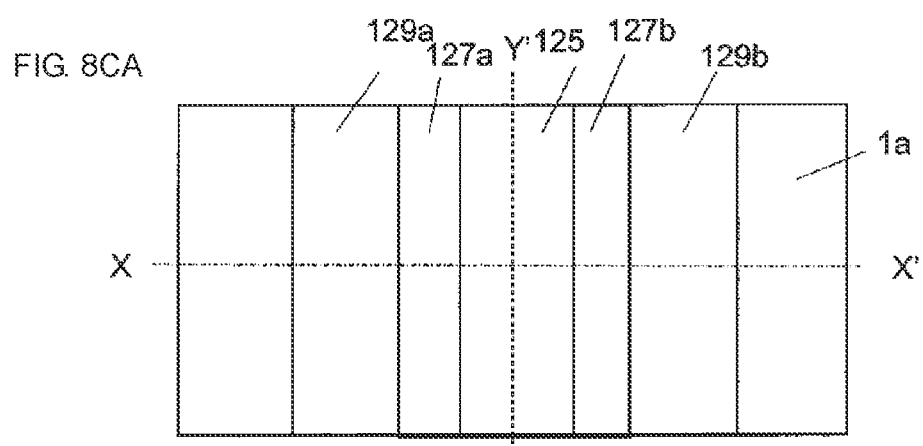
FIG. 8CA and FIGS. 8CB and 8CC are respectively a plan view and cross-sectional structural views for describing a pillar-shaped semiconductor device having SGTs according to the eighth embodiment.
Figure 8C:
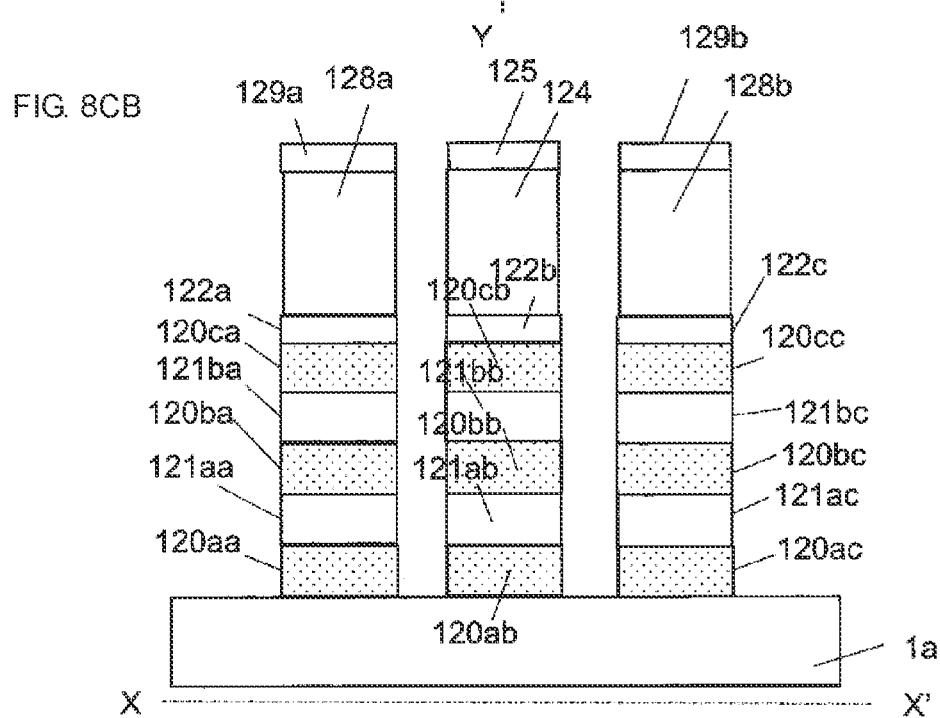
Figure 8C:
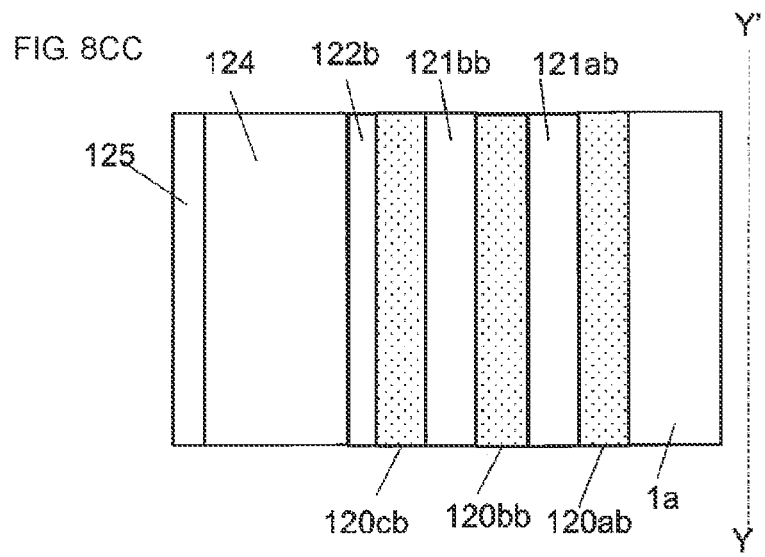

Next, the SiO$_2$ layer 130, the band-like mask material layers 125, 127a, 127b, 129a, 129b, the SiN layer 124, 128a, 128b, and the band-like SiGe layers 126a, 126b are etched, with the mask material layer 131 as a mask. Then, the mask material layer 131 is removed. Then, the remaining SiO$_2$ layer 130, mask material layers 127a, 127b, SiGe layers 126a, 126b are removed. Then, as shown in FIGS. 8CA to 8CC, the mask material layer 122, the SiGe layers 120a, 120b, 120c, and Si layers 121a, 121b are etched with the mask material layers 125, 129a, 129b, SiN layers 124, 128a, 128b as a mask to form SiGe layers 120aa, 120ba, 120ca, Si layers 121aa, 121ba, and a mask material layer 122a under the SiN layer 128a. At the same time, SiGe layers 120ab, 120bb, 120cb, Si layers 121ab, 121bb, and a mask material layer 122b are formed under the SiN layer 124. At the same time, SiGe layers 120ac, 120bc, 120cc, Si layers 121ac, 121bc, and a mask material layer 122c are formed under the SiN layer 128b.

Figure 8D:
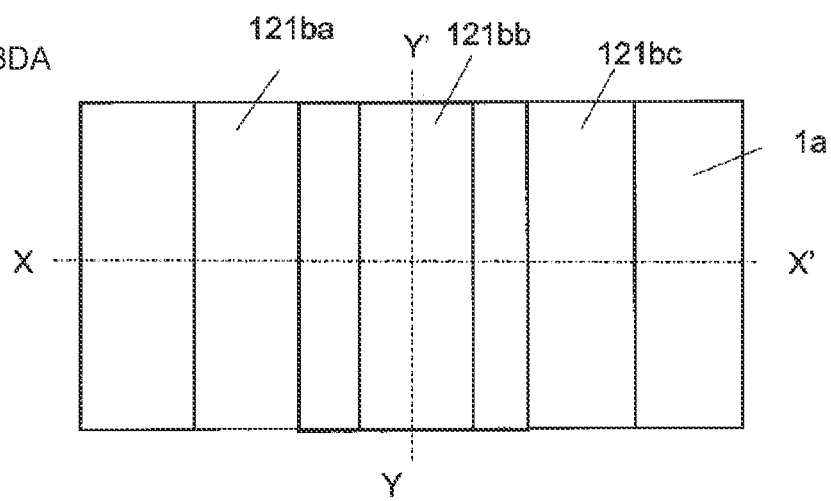
FIG. 8DA and FIGS. 8DB and 8DC are respectively a plan view and cross-sectional structural views for describing a pillar-shaped semiconductor device having SGTs according to the eighth embodiment.
Figure 8D:
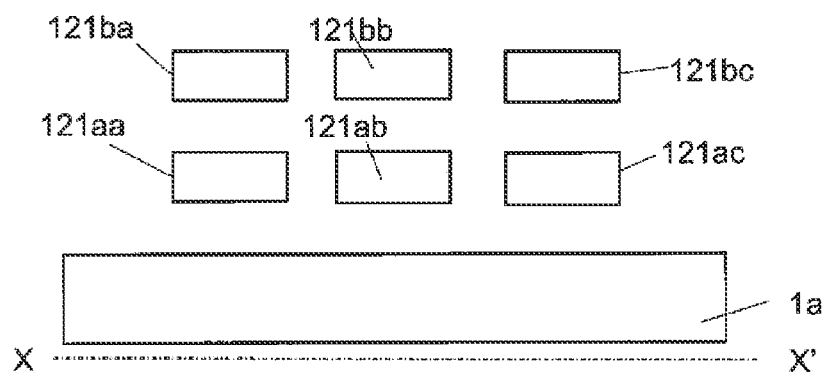
Figure 8D:
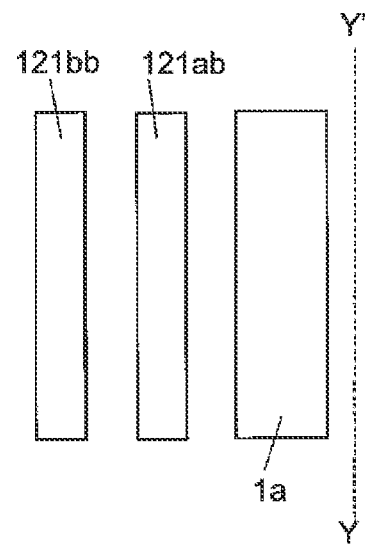

Next, as shown in FIGS. 8DA to 8DC, the mask material layers 125, 129a, 129b, the SiN layers 124, 128a, 128b, and the SiGe layers 120aa, 120ab, 120ac, 120ba, 120bb, 129bc, 120ca, 120cb, 120cc are etched. This makes it possible to form band-like Si layers 121aa, 121ab, 121ac, 121ba, 121bb, 121bc supported by the support material layer located at each end in Y direction.

Figure 8E:
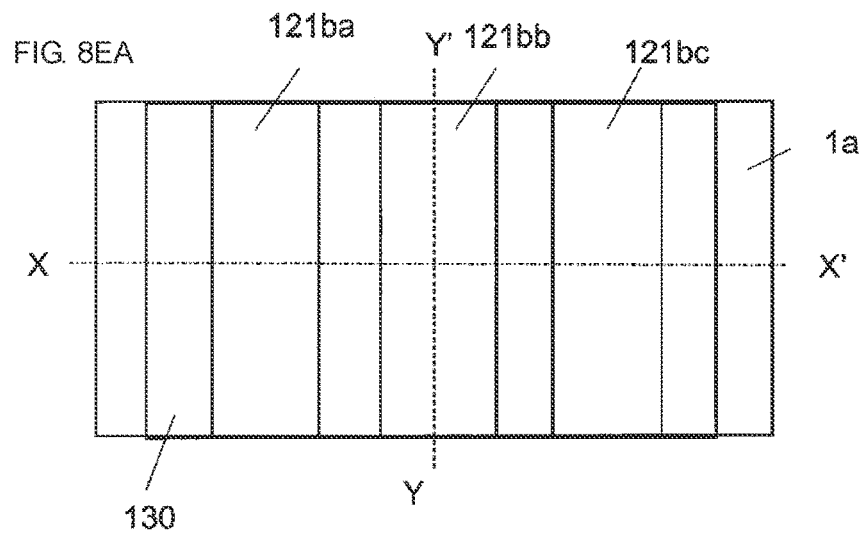
FIG. 8EA and FIGS. 8EB and 8EC are respectively a plan view and cross-sectional structural views for describing a pillar-shaped semiconductor device having SGTs according to the eighth embodiment.
Figure 8E:
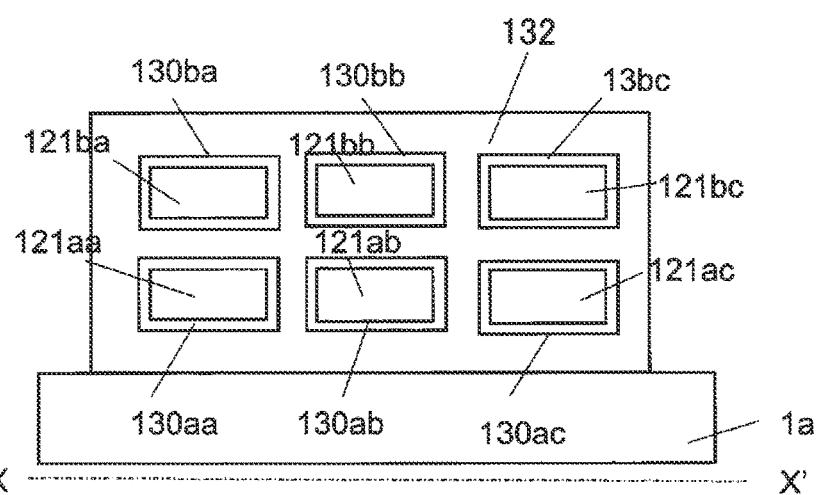
Figure 8E:
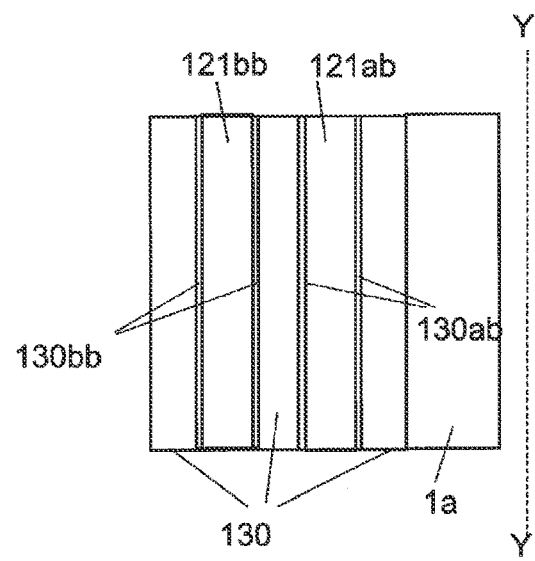

Next, as shown in FIGS. 8EA to 8EC, gate HfO$_2$ layers 130aa, 130ab, 130ac, 130ba, 130bb, 130bc are formed surrounding the band-like Si layers 121aa, 121ab, 121ac, 121ba, 121bb, 121bc. Then, a gate TiN layer 132 is formed surrounding the gate HfO$_2$ layers 130aa, 130ab, 130ac, 130ba, 130bb, 130bc. Then, the support material layer at each end of the band-like Si layers 121aa, 121ab, 121ac, 121ba, 121bb, 121bc is removed. Then, an N$^+$ layer (not shown) or a P$^+$ layer (not shown), which becomes source or drain, is formed at each end of the band-like Si layers 121aa, 121ab, 121ac, 121ba, 121bb, 121bc. Thus, a circuit using GAA (Gate All Around) transistor (refer to N. Loubt, et al.: "Stacked Nanosheet Gate-All-Around Transistor to Enable Scaling Beyond FinFET" 2017 Symposium on VLSI Technology of Technical Papers, pp. T230, 231 (2017)) in which the band-like Si layers 121aa, 121ab, 121ac, 121ba, 121bb, 121bc are channels is formed.

According to the manufacturing method of this embodiment, following features are provided.

According to this embodiment, space between the band-like Si layers 121ab, 121bb, and the band-like Si layers 121aa, 121ba, the band-like Si layers 121ac, 121bc in planar view can be made narrower. For example, if the band-like Si layers 121aa, 121ba are channels of N channel GAA transistor, and the band-like Si layers 121ab, 121bb, the band-like Si layers 121ac, 121bc are channels of P channel GAA transistor, a high-density inverter circuit can be formed.

Similarly, if the band-like Si layers 121aa, 121ab, 121ac in the lower stage are being channels of N channel GAA transistor, and the band-like Si layers 121ba, 121bb, 121bc in the upper stage are being channels of the P channel GAA transistor, a high-density inverter circuit can also be formed. Also, not only the circuit where the GAA transistors are formed vertically in two stages and horizontally in three rows as in this embodiment, a circuit at high-density can also be provided in a circuit where the GAA transistors are formed vertically in one stage and three or more stages, and horizontally in two rows and four rows.

Ninth Embodiment

Hereinafter, a method for manufacturing a three-dimensional semiconductor device according to the ninth embodiment of the present invention is described with reference to FIGS. 9AA to 9CC. In the figures, figures suffixed with A are plan views, figures suffixed with B are cross-sectional structural views taken along lines X-X' in the corresponding figures suffixed with A, and figures suffixed with C are cross-sectional structural views taken along lines Y-Y' in the corresponding figures suffixed with A.

After performing a process shown in FIGS. 1AA to 1AC, a SiGe layer (not shown) and a mask material layer (not shown) are entirely formed on a mask material layer 7. Then, as shown in FIGS. 9AA to 9AC, two band-like mask material layers 133a, 133b extended in Y direction in planar view are formed by lithography and RIE etching methods.

Then, the SiGe layer are etched by RIE etching with the band-like mask material layers 133a, 133b as a mask to form band-like SiGe layers 134a, 134b extended in Y direction.

Next, a SiN layer (not shown) is entirely formed by ALD method. Then, processes shown in FIGS. 1DA to 1IC are performed to form band-like mask material layers 135aa, 135ab, 135ba, 135bb formed at each side of the band-like mask material layers 133a, 133b, and band-like SiN layers 136aa, 136ab, 136ba, 136bb under the band-like mask material layers 135aa, 135ab, 135ba, 135bb and in contact with each side surface of the band-like SiGe layers 134a, 134b, as shown in FIGS. 9BA to 9BC. The band-like mask material layers 135ab and the band-like mask material layer 135ba are formed as being separated. Similarly, the band-like SiN layer 136ab and the band-like SiN layer 136ba are formed as being separated.

Figure 9A:
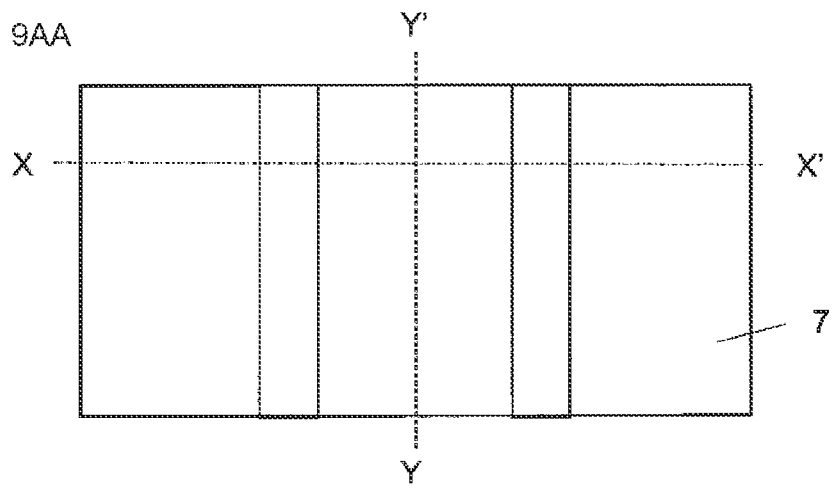
FIG. 9AA and FIGS. 9AB and 9AC are respectively a plan view and cross-sectional structural views for describing a pillar-shaped semiconductor device having SGTs according to the ninth embodiment.
Figure 9A:
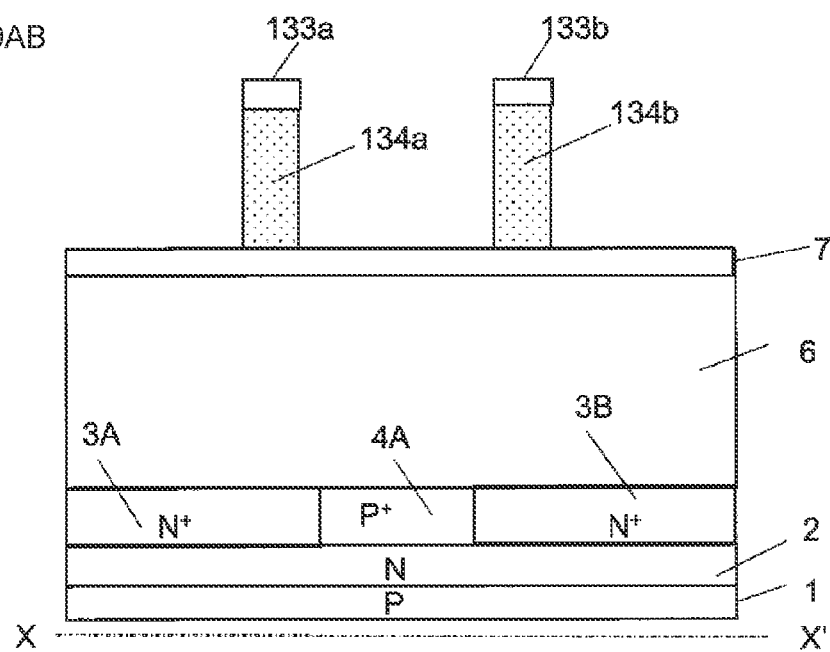
Figure 9A:
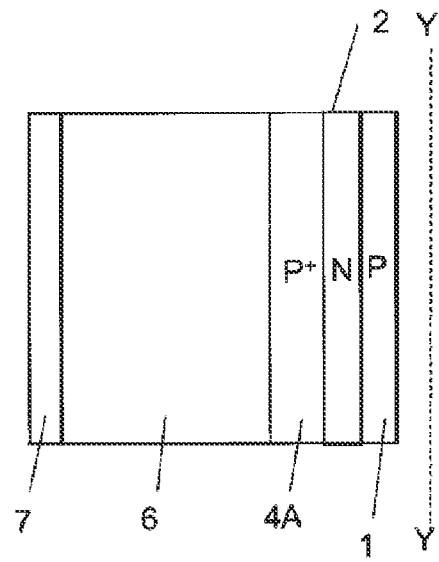
Figure 9B:
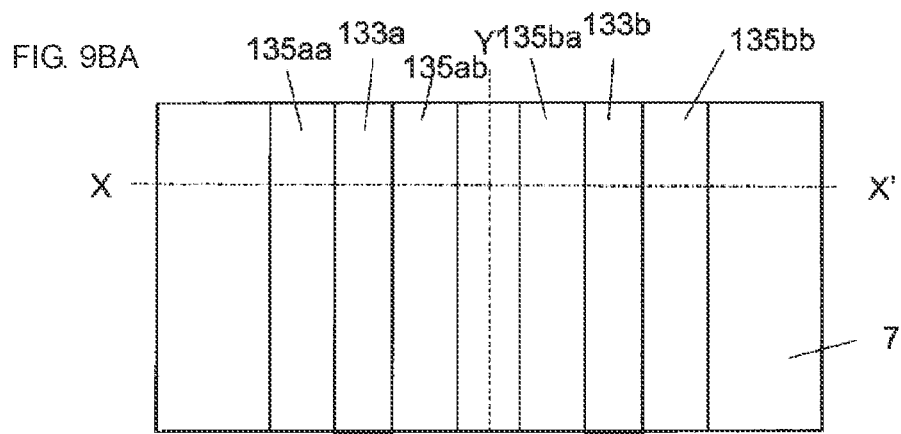
FIG. 9BA and FIGS. 9BB and 9BC are respectively a plan view and cross-sectional structural views for describing a pillar-shaped semiconductor device having SGTs according to the ninth embodiment.
Figure 9B:
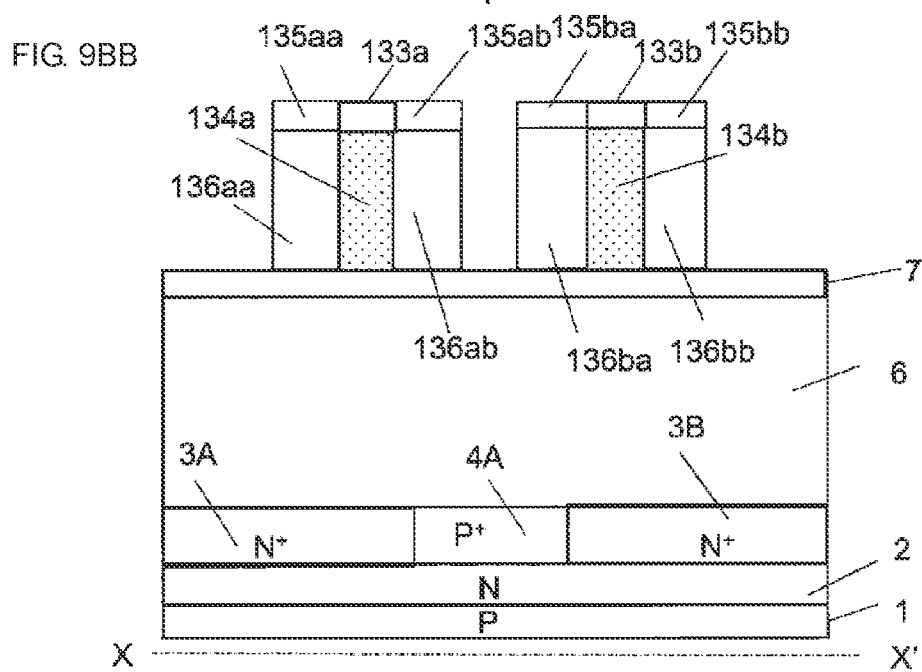
Figure 9B:
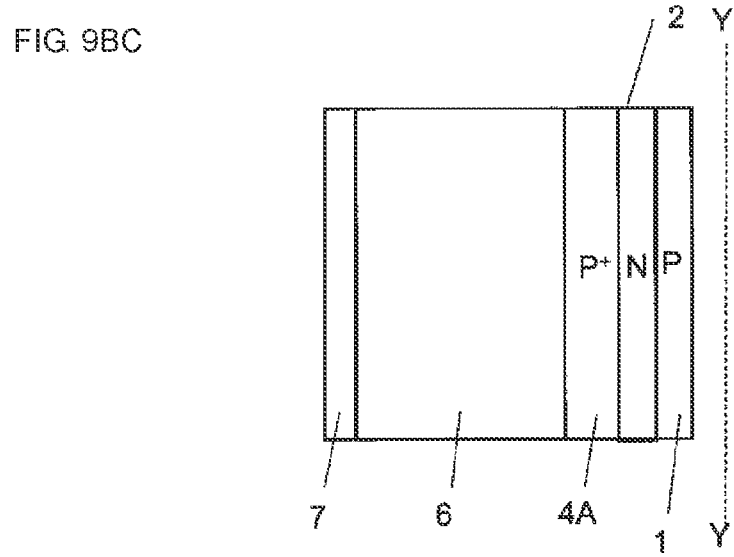
Figure 9C:
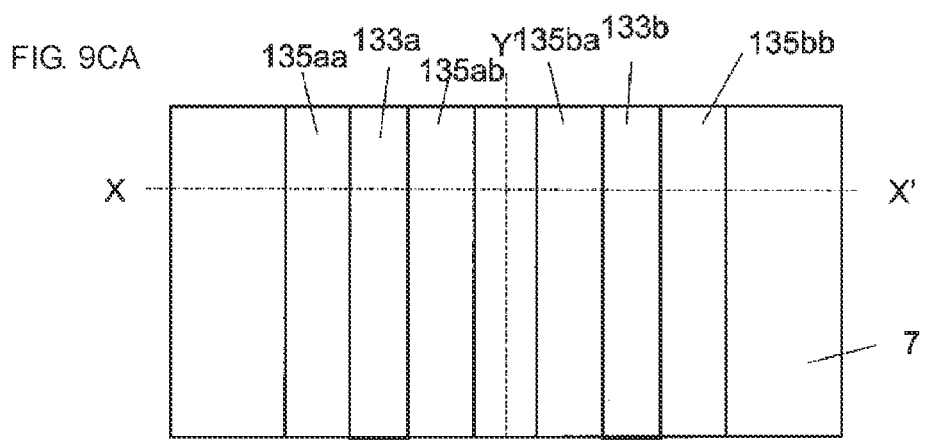
FIG. 9CA and FIGS. 9CB and 9CC are respectively a plan view and cross-sectional structural views for describing a pillar-shaped semiconductor device having SGTs according to the ninth embodiment.
Figure 9C:
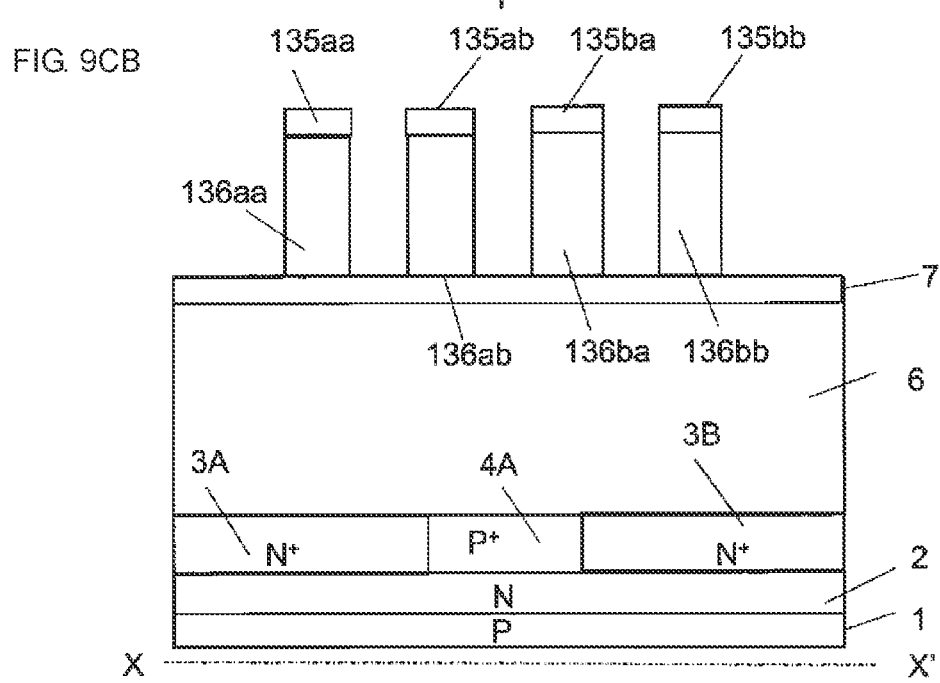
Figure 9C:
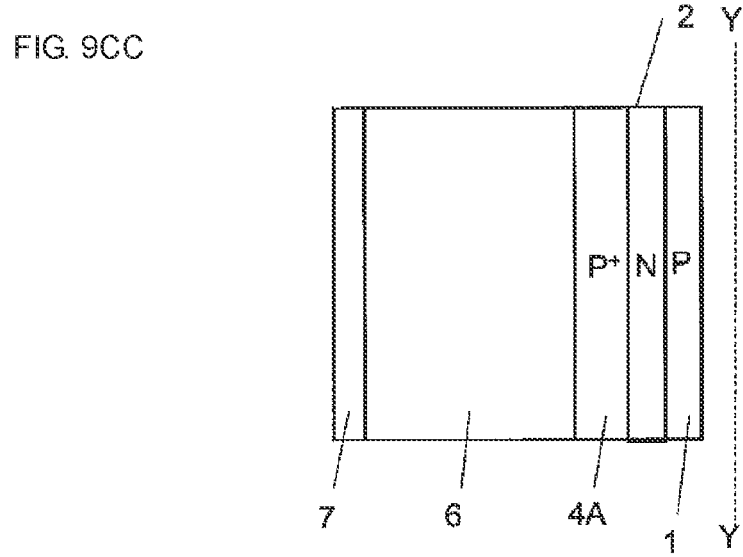
Figure 10:
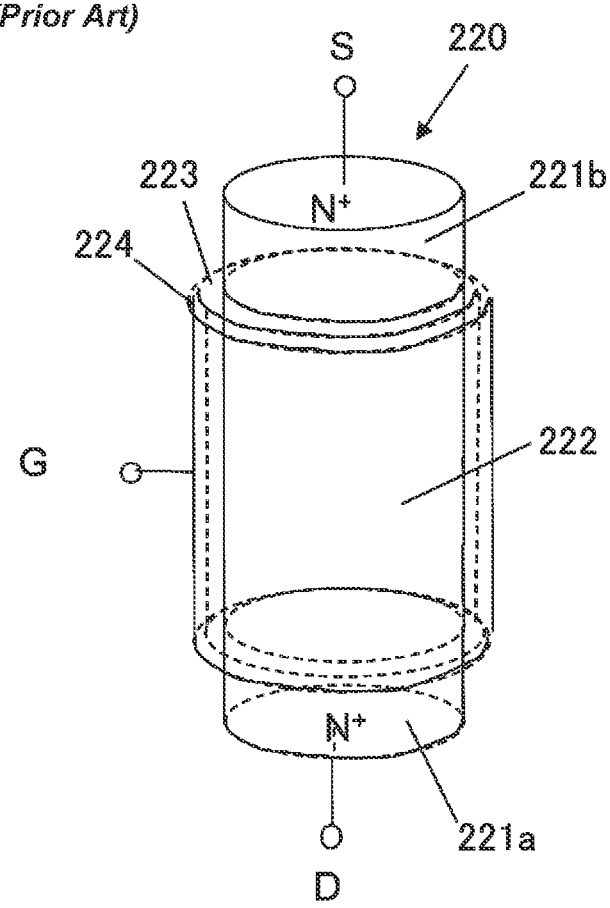

Next, as shown in FIGS. 9CA to 9CC, the band-like mask material layers 133a, 133b, and the band-like SiGe layers 134a, 134b are removed. Thus, the band-like mask material layers 135aa, 135ab, 135ba, 135bb and the band-like SiN layers 136aa, 136ab, 136ba, 136bb extended in Y direction in planar view are formed on a mask material layer 7. Then, by performing processes of FIGS. 3CA to 3FC, a SRAM cell the same as FIGS. 3FA to 3FC is formed.

According to the manufacturing method of this embodiment, following features are provided.

In the third embodiment, a process for forming band-like material layer is repeated three times on each side of the band-like SiGe layer 80 to form band-like SiN layers 82a, 82b, 86a, 86b and band-like SiGe layer 84a, 84b. On the other hand, in this embodiment, band-like SiN layers 136aa, 136ab, 136ba, 136bb are formed in a single process for forming band-like material layer, on each side of the simultaneously formed band-like SiGe layers 134a, 134b. This makes it possible to simplify the processes.

In planar view, distance between two SiN layers 136a, 136b is separated more than that in FIGS. 9AA and 9AB, and a band-like SiGe layer and a band-like mask material layer on this band-like SiGe layer are formed (materials are different from that of FIGS. 1IA to 1LC) at each side of the band-like SiN layers 136aa, 136ab, and the band-like SiN layers 136ba, 136bb by a method similar the one in FIGS. 1IA to 1LC. Then, a band-like SiN layer and a band-like mask material layer on this band-like SiN layer are formed between the band-like SiGe layers using a method similar to the one shown in FIGS. 5BA to 5EC. This makes it possible to form five band-like SiN layers extended in Y direction in planar view, and band-like mask material layers on this SiN layers similar to the first embodiment. A SRAM cell the same as the first embodiment is thus formed. In the first embodiment, a process for forming band-like materials is repeated four times on each side of a band-like SiN layer 8a, on the other hand, in this method, the process is repeated for two times to form a SRAM cell. This makes it possible to simplify the processes.

In addition, in the first embodiment to the seventh embodiment according to the present invention, one SGT is formed at one semiconductor pillar, but the present invention can also be applied to any circuit formation in which two or more SGTs are formed.

Also, in the first embodiment, a mask material layer 7 is formed of a SiO$_2$ layer, an aluminum oxide (Al$_2$O$_3$, hereinafter referred as AlO) layer, and a SiO$_2$ layer. Then, a Silicon nitride (SiN) layer 8 is deposited. Then, a mask material layer 9 consisting of a SiO$_2$ layer is deposited. Then, a mask material layer 10 consisting of a SiN layer is deposited. For these mask material layers 7, 9, 10, and SiN layer 8, other material layers consisting of single or multiple layers including organic or inorganic materials may be used, as long as the materials are suitable for the purpose of the present invention. This is also applicable to other embodiments according to the present invention.

Also, in the first embodiment, a SiGe layer 12 is formed entirely over the band-like mask material layers 7, 8a, 9a by ALD method, as shown in FIGS. 1DA to 1DC. For this SiGe layer 12, other material layers consisting of single or multiple layers including organic or inorganic materials may be used, as long as the materials are suitable for the purpose of the present invention. This is also applicable to band-like SiGe layers 18a, 18b. In addition, base materials for band-like SiGe layers 12aa, 12ab and for band-like SiGe layers 18a, 18b may not be the same. This is also applicable to other embodiments according to the present invention.

Also, for band-like mask material layers 15a, 15b, 17a, 17b, 19a, 19b, 21a, 21b and band-like mask material layers 16a, 16b, 20a, 20b in the first embodiment, other material layers consisting of single or multiple layers including organic or inorganic materials may be used, as long as the materials are suitable for the purpose of the present invention. This is also applicable to other embodiments according to the present invention.

Also, in the first embodiment, band-like mask material layers 9a, 15a, 15b, 17a, 17b, 19a, 19b, 21a, 21b are formed such that each upper surface and bottom position comes to be same, but the each upper surface and bottom position may be different in vertical direction, as long as they are suitable for the purpose of the present invention. This is also applicable to other embodiments according to the present invention.

Also, in the first embodiment, a thickness and a shape of band-like mask material layers 9a, 15a, 15b, 17a, 17b, 19a, 19b, 21a, 21b may be changed by CMP polishing, RIE etching, and cleaning. This change causes no problem when the change is within a range suitable for the purpose of the present invention. This is also applicable to other embodiments according to the present invention.

Also, in the first embodiment, for a SiO$_2$ layer 22, a SiN layer 24, band-like SiGe layer 25, a band-like mask material layer 26 of SiN layer, and band-like mask material layers 27a, 27b, 28a, 28b shown in FIGS. 1QA to 1SC, other material layers consisting of single or multiple layers including organic or inorganic materials may be used, as long as the materials are suitable for the purpose of the present invention. This is also applicable to other embodiments according to the present invention.

Also, in the first embodiment, Si pillars 7b, 6i are removed. In this manner, any of formed Si pillars 6a to 6j may be removed by lithography and etching depending on a circuit design. In a circuit other than the SRAM cell circuit, once formed Si pillars may also be removed depending on a circuit design. Also, as in the fourth embodiment, any area of band-like mask material layers 27a, 27b, 28a, 28b in planar view may be etched so as to not form any of Si pillars 6a to 6j. A method provided by the embodiments can be applied to any circuit formation other than SRAM cells. This is also applicable to other embodiments according to the present invention.

Also, in the first embodiment, TiN layers 40a, 40b, 40c, 40d are used as a gate metal layer, as shown in FIGS. 1ZA to 1ZC. For the TiN layers 40a, 40b, 40c, 40d, other material layers consisting of single or multiple layers may be used, as long as the materials are suitable for the purpose of the present invention. The TiN layers 40a, 40b, 40c, 40d may be formed of a metal layer of single or multiple layers having at least desired work function. Outside of this, a W layer, for example, may be formed. In this case, the W layer serves as a metal line layer for linking gate metal layers. Any metal layers of single or multiple layers other than the W layer may be used. This is also applicable to other embodiments according to the present invention.

Then, in the description of the embodiment, the example of forming the SRAM cell is used. For example, in a microprocessor circuit, a SRAM circuit and a logic circuit are formed on a same chip. In forming this logic circuit, a method of not forming unnecessary Si pillar can be used by the method described in FIGS. 1WA to 1WC and FIGS. 4AA to 4AC. Also, the SRAM circuit and the logic circuit may be formed by methods of different embodiments. This is also applicable to other circuit formation.

In addition, in the sixth embodiment, the amorphous SiOC layer 111 is formed instead of the $SiO_2$ layer 13 in the first embodiment. Then, heat treatment in an atmosphere containing oxygen is performed to oxidize the top of the Si layers 110a, 110b to form the band-like $SiO_2$ layers 112a, 112b which are mask material layers. The amorphous SiOC layer 111, Si layers 110a 110b may be other material layers as long as they are suitable for the purpose of the present invention.

In addition, in the seventh embodiment, the band-like SiGe nitride layers 114a, 114b are formed on top of the SiGe layer 12a by nitrogen ion implantation. The nitrogen ion implantation and the SiGe layer 12a may be other atom ion implantation, or a material layer alternative to the SiGe layer as long as a mask material layer is formed.

In addition, in the first embodiment, circular mask material layers 7a to 7j in planar view are formed. The shape of the mask material layers 7a to 7j may be elliptic. This is also applicable to other embodiments according to the present invention.

In the first embodiment, although $HfO_2$ layer 35 is used as a gate insulating layer and TiN layers 40a, 40b, 40c, 40d are used as gate material layers, other material layers consisting of single or multiple layers may be used. This is also applicable to other embodiments according to the present invention.

Also, in the first embodiment, N$^+$ layers 43a, 43c, 43d, 43e, 43f, 43h and P$^+$ layers 43b, 43g are formed by using selective epitaxial crystal growth method as shown in FIGS. 1XXA to 1XXC. Then, N$^+$ layers 44a, 44c, 44d, 44e, 44f, 44h and P$^+$ layers 44b, 44g are formed on top of Si pillars 6a to 6j by heat diffusion. Since the N$^+$ layers 43a, 43c, 43d, 43e, 43f, 43h and P$^+$ layers 43b, 43g formed by selective epitaxial crystal growth method are single crystal layer, the layers become source or drain of SGT, even when the N$^+$ layers 44a, 44c, 44d, 44e, 44f, 44h and P$^+$ layers 44b, 44g formed on top of the Si pillars 6a to 6j by heat diffusion do not exist. Similarly, the N$^+$ layer or the P$^+$ layer formed by epitaxial crystal growth method, surrounding periphery of the Si pillars 6a to 6j, may be source or drain, instead of the N$^+$ layers 3a, 3b, 3c, 3d and the P$^+$ layers 4a, 5a present at the bottom of the Si pillars 6a to 6j, which are source or drain. This is also applicable to other embodiments according to the present invention.

Also, in the first embodiment, N$^+$ layers 43a, 43c, 43d, 43e, 43f, 43h and P$^+$ layers 43b, 43g shown in FIGS. 1XXA to 1XXC are formed by selective epitaxial crystal growth method. These N$^+$ layers 43a, 43c, 43d, 43e, 43f, 43h and P$^+$ layers 43b, 43g may also be formed by performing usual epitaxial crystal growth method and then lithography and etching. This is also applicable to other embodiments according to the present invention.

Also, in the first embodiment, SGTs are formed on a P layer substrate 1, but SOI (Silicon On Insulator) substrate may be used instead of the P layer substrate 1. Alternatively, any substrate of other materials may be used as long as it can serve as a substrate. This is also applicable to other embodiments according to the present invention.

Also, in the first embodiment, a SGT is described in which N$^+$ layers 44a, 44c, 44d, 44f, 44h and P$^+$ layers 44b, 44g, and N$^+$ layers 3a, 3b, 3c, 3d and P$^+$ layers 4a, 5a having conductivities of same polarity are used above and below Si pillars 6a to 6j to configure source and drain, but the present invention may also be applicable to a tunnel-type SGT having source and drain of different polarities. This is also applicable to other embodiments according to the present invention.

Also, in each embodiment described above, examples, in which Si (silicon) is used as a semiconductor region such as a channel, source, and drain, are described. However, the technical ideas of the present invention may not be limited to this, and may also be applicable to any three-dimensional semiconductor devices using semiconductor materials containing Si, such as SiGe, or semiconductor materials other than Si.

Also, in the first embodiment, Si pillars 6a to 6j are formed of a single Si layer, but channels of SGTs may be formed by laminating semiconductor layers consisting of different semiconductor base materials in vertical direction. This is also applicable to other embodiments according to the present invention.

Also, in a vertical-type NAND type flash memory circuit, a semiconductor pillar is made to be a channel, and multiple stage of memory cells configured by a tunnel oxide layer, a charge accumulation layer, an interlayer insulating layer, and a control conductor layer surrounding the semiconductor pillar are formed in a vertical direction. At the semiconductor pillars on each end of these memory cells, a source line impurity layer which corresponds to a source and a bit line impurity layer which corresponds to a drain exist. In addition, for one memory cell, when there are other memory cells on each side of the one memory cell, if one of the other memory cells is a source, then the other one serves as a drain. Thus, the vertical-type NAND type flash memory circuit is a type of SGT circuits. Therefore, the present invention may be applicable to the NAND type flash memory circuit.

In the present invention, various embodiments and modification will be possible without departing from the broader sprit and scope of the present invention. Also, the foregoing embodiments are intended to illustrate one example of the present invention and not intended to limit the scope of the present invention. The foregoing examples and variations may be arbitrarily combined. Furthermore, if necessary, even if a part of constituent features of the foregoing embodiments is removed, it will be within the technical idea of the present invention.

What is claimed is:
1. A method for manufacturing a three-dimensional semiconductor device, the method comprising steps of:
  forming a first substrate, a second substrate comprising a semiconductor layer on the first substrate, and a first material layer on the second substrate;
  forming first and second band-like material layers on the first material layer, wherein first band-like material layer is formed on a top of the second band-like material;

forming a second material layer to cover the first and second band-like material layers in their entirety and forming a third material layer on the second material layer;

smoothing the second material layer and the third material layer so that top surfaces of the second and third material layers come in alignment with a top surface of the first band-like material layer;

removing top portions of the second material layer as deeply as a height of the first band-like material layer;

forming a third band-like material layer on a top of the second material layer between a side surface of the third material layer and a side surface of the first band-like material layer;

removing the smoothed third material layer;

using the first band-like material layer and the third band-like material layer and etching the smoothed second material layer as a mask to form a fourth band-like material layer in contact with side surfaces of the second band-like material layer;

forming a fourth material layer to cover the fourth band-like material layer in its entirety and forming a fifth material layer on the fourth material layer;

smoothing the fourth material layer and the fifth material layer so that a top surfaces of the fourth material layer and the fifth material layer come in alignment with the top surface of the first band-like material layer;

removing top portions of the fourth material layer as deeply as the height of the first band-like material layer;

forming a fifth band-like material layer on a top of the fourth material layer between a side surface of the fifth material layer and a side surface of the third band-like material layer;

removing the smoothed fifth material layer;

using the first band-like material layer, the third band-like material layer, and the fifth band-like material layer as a mask to etch the smoothed fourth material layer to form a sixth band-like material layer in contact with a side surface of the fourth band-like material layer;

removing the third band-like material layer and the fourth band-like material layer;

forming a seventh band-like material layer formed in a single layer or in multiple layers above or below the first band-like material layer, wherein the seventh band-like material layer is formed orthogonal to the first band-like material layer;

forming a rectangular or circular first mask material layer based at least on the first material layer, or the second band-like material layer, or the sixth band-like material layer, wherein the first mask material layer is formed in a first overlapping area of the seventh band-like material layer, the second band-like material layer, and the sixth band-like material layer; and using the first mask material layer as a mask to etch the second substrate to form a three-dimensionally-shaped semiconductor layer on the first substrate and forming the three-dimensionally-shaped semiconductor layer as a channel.

2. The method for manufacturing the three-dimensional semiconductor device according to claim 1, wherein the step of removing top portions of the second material layer as deeply as a height of the first band-like material layer comprises a step of using the first band-like material layer and the third material layer as a mask to etch a top of the smoothed second material layer to form a first recess; and the step of forming a third band-like material layer comprises a step of filling the first recess to form the third band-like material layer so that a top surface of the third band-like layer comes in alignment with the top surface of the first band-like material layer.

3. The method for manufacturing the three-dimensional semiconductor device according to claim 1, wherein the step of forming the fifth band-like material layer comprises a step of removing the fifth material layer comprising a step of using the first band-like material layer, the third band-like material layer, and the smoothed fifth material layer as a mask to etch a top of the smoothed fourth material layer to form a second recess; and the step of forming the fifth band-like material layer comprises a step of filling the second recess so that a top surface of the fifth band-like material layer being in alignment with the surface position of the first band-like material layer.

4. The method for manufacturing the three-dimensional semiconductor device according to claim 1, further comprising forming an eight band-like material layer above or below the first band-like material, and forming a ninth band-like material layer on a top of the eighth band-like material layer and the eighth and ninth band-like material layers having identical in shape the seventh band-like material layer in planar view, wherein forming the seventh band-like material layer steps of:

forming a sixth material layer and a seventh material layer on the sixth material layer so that the sixth and seventh material layers cover the eighth and ninth band-like material layers;

smoothing the sixth material layer and the seventh material layer so that a top surface of the sixth material layer and a top surface of the seventh material layer come in alignment with a top surface of the eighth band-like material layer;

using the eighth band-like material layer and the seventh material layer as a mask to etch a top of the sixth material layer to form a third recess;

filling the third recess to form a tenth band-like material layer so that a top surface of the tenth band-like material layer comes in alignment with the top surface of the eighth band-like material layer;

removing the smoothed seventh material layer;

using the eighth band-like material layer and the tenth band-like material layer as a mask to etch the sixth material layer to form an eleventh band-like material layer being in contact with a side surface of the ninth band-like material layer; and removing either the eighth band-like material layer and the ninth band-like material layer, or removing the tenth band-like material layer and the eleventh band-like material layer to form a lower layer or both upper and lower layers of a remaining band-like material layer as the seventh band-like material layer.

5. The method for manufacturing the three-dimensional semiconductor device according to claim 1, wherein either one of the second band-like material layer or the fourth band-like material layer is formed wider than the other in planar view.

6. The method for manufacturing the three-dimensional semiconductor device according to claim 1, wherein either one of the second band-like material layer or the sixth band-like material layer is formed wider than the other in planar view.

7. The method for manufacturing the three-dimensional semiconductor device according to claim 1, wherein the three-dimensionally-shaped semiconductor layer comprises a plurality of semiconductor pillars standing in a vertical direction on the first substrate.

8. The method for manufacturing the three-dimensional semiconductor device according to claim 7, wherein the plurality of semiconductor pillars consists of at least a first semiconductor pillar, a second semiconductor pillar, and a third semiconductor pillar being adjacent and aligned in a first direction or a second direction orthogonal to the first direction, the method comprising steps of:
forming a first gate insulating layer surrounding side surfaces of the first semiconductor pillar, the second semiconductor pillar, and the third semiconductor pillar; and
forming a first gate conductor layer surrounding the first gate insulating layer,
wherein the first gate conductor layer is formed filling between at least two of the first semiconductor pillar, the second semiconductor pillar, and the third semiconductor pillar.

9. The method for manufacturing the three-dimensional semiconductor device according to claim 7, the method comprising a step of removing any of the plurality of semiconductor pillars formed on the first substrate.

10. The method for manufacturing the three-dimensional semiconductor device according to claim 7, the method comprising a step of forming a part of area of the seventh band-like material layer in planar view after forming the plurality of semiconductor pillars,
wherein any of the plurality of the semiconductor pillars is not formed below the part of area of the seventh band-like material layer in planar view.

11. The method for manufacturing the three-dimensional semiconductor device according to claim 1, the method comprising steps of:
in parallel with a step of forming the second band-like material layer having the first band-like layer on its top, forming a thirteenth band-like material layer having a twelfth band-like material layer of a same planar shape on its top, extended in the first direction, on the first material layer;
in parallel with a step of forming the fourth band-like material layer having the third band-like layer on its top, forming a fifteenth band-like material layer having a fourteenth material layer of a same planar shape on its top, extended in the first direction, on the first material layer;
forming a sixteenth band-like material layer between the opposing fourth band-like material layer and the fifteenth band-like material layer, in contact with each side surface of them, and having a shape the same as the sixth band-like material layer; and
removing the third band-like material layer, the fourth band-like material layer, the fourteenth band-like material layer, and the fifteenth band-like material layer.

12. The method for manufacturing the three-dimensional semiconductor device according to claim 1, wherein the third band-like material layer is formed by oxidizing the top of the smoothed second material layer.

13. The method for manufacturing the three-dimensional semiconductor device according to claim 1, wherein the third band-like material layer is formed by ion plantation of atomic ion to the top of the smoothed second material layer.

14. The method for manufacturing the three-dimensional semiconductor device according to claim 1, the method comprising steps of:
forming the second substrate in a configuration in which, each end thereof in one direction is in contact with a support material layer in planar view, and plural pairs of a first semiconductor layer and an eighth material layer are piled upwards in a vertical direction;
removing the eighth material layer after forming the three-dimensionally-shaped semiconductor layer;
forming a second gate insulating layer surrounding the first semiconductor layer of the three-dimensionally-shaped semiconductor layer;
forming a second gate conductor layer surrounding the second gate insulating layer;
removing the support material layer; and
forming each impurity layer containing donor or acceptor impurities in contact with each end of the first semiconductor layer in the one direction in planar view.

* * * * *